(12) United States Patent
Iwai

(10) Patent No.: US 10,290,650 B1
(45) Date of Patent: May 14, 2019

(54) SELF-ALIGNED TUBULAR ELECTRODE PORTIONS INSIDE MEMORY OPENINGS FOR DRAIN SELECT GATE ELECTRODES IN A THREE-DIMENSIONAL MEMORY DEVICE

(71) Applicant: SANDISK TECHNOLOGIES LLC, Plano, TX (US)

(72) Inventor: Takaaki Iwai, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/888,714

(22) Filed: Feb. 5, 2018

(51) Int. Cl.
*H01L 29/76* (2006.01)
*H01L 27/11582* (2017.01)
(Continued)

(52) U.S. Cl.
CPC ...... *H01L 27/11582* (2013.01); *H01L 21/283* (2013.01); *H01L 21/28273* (2013.01); *H01L 21/28282* (2013.01); *H01L 27/11556* (2013.01); *H01L 29/0649* (2013.01); *H01L 29/41741* (2013.01); *H01L 29/4234* (2013.01); *H01L 29/42324* (2013.01); *H01L 29/66545* (2013.01); *H01L 29/66825* (2013.01); *H01L 29/66833* (2013.01); *H01L 29/7883* (2013.01);
(Continued)

(58) Field of Classification Search
CPC ......... H01L 27/11556; H01L 27/11557; H01L 27/11524; H01L 27/11582; H01L 27/11578; H01L 27/11551; H01L 27/11529; H01L 27/1157; H01L 29/7926; H01L 29/7889; H01L 25/0657
See application file for complete search history.

(56) References Cited

U.S. PATENT DOCUMENTS 5,915,167 A 6/1999 Leedy
8,349,681 B2 1/2013 Alsmeier et al.
(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.
(Continued)

*Primary Examiner* — Hsien Ming Lee
(74) *Attorney, Agent, or Firm* — The Marbury Law Group, PLLC

(57) ABSTRACT

Memory opening fill structures extend through an alternating stack of insulating layers and electrically conductive layers and a combination of an insulating fill material layer and plate electrode portions located over the alternating stack. Each memory opening fill structure includes a memory film, a vertical semiconductor channel laterally surrounded by the memory film, and a tubular electrode portion overlying the alternating stack and contacting a respective one of the plate electrode portions. The insulating fill material layer includes a drain select level isolation structure located between neighboring rows of memory opening fill structures. The plate electrode portions and the tubular electrode portions collectively constitute drain select gate electrodes. The tubular electrode portions are incorporated into a respective memory opening fill structure, and the drain select level isolation structure can be self-aligned to the memory opening fill structures.

20 Claims, 48 Drawing Sheets

(51) Int. Cl.
| | |
|---|---|
| *H01L 29/423* | (2006.01) |
| *H01L 29/06* | (2006.01) |
| *H01L 29/417* | (2006.01) |
| *H01L 21/28* | (2006.01) |
| *H01L 29/66* | (2006.01) |
| *H01L 29/788* | (2006.01) |
| *H01L 29/792* | (2006.01) |
| *H01L 21/283* | (2006.01) |
| *H01L 27/11556* | (2017.01) |
| *H01L 27/1157* | (2017.01) |
| *H01L 27/11526* | (2017.01) |
| *H01L 27/11573* | (2017.01) |
| *H01L 27/11519* | (2017.01) |
| *H01L 27/11565* | (2017.01) |
| *H01L 27/11524* | (2017.01) |

(52) U.S. Cl.
CPC ...... *H01L 29/7889* (2013.01); *H01L 29/7926* (2013.01); *H01L 27/1157* (2013.01); *H01L 27/11519* (2013.01); *H01L 27/11524* (2013.01); *H01L 27/11526* (2013.01); *H01L 27/11565* (2013.01); *H01L 27/11573* (2013.01)

(56) References Cited

U.S. PATENT DOCUMENTS

| | | | |
|---|---|---|---|
| 9,023,719 | B2 | 5/2015 | Pachamuthu et al. |
| 9,331,094 | B2 | 1/2016 | Pachamuthu et al. |
| 9,305,932 | B2 | 4/2016 | Kanakamedala et al. |
| 9,368,509 | B2 * | 6/2016 | Pang ................ H01L 27/11556 |
| 9,449,983 | B2 | 9/2016 | Yada et al. |
| 9,515,085 | B2 | 12/2016 | Rabkin et al. |
| 9,530,787 | B2 | 12/2016 | Tsutsumi et al. |
| 9,576,966 | B1 | 2/2017 | Peri et al. |
| 9,679,907 | B1 | 6/2017 | Kaneko et al. |
| 2015/0179662 | A1 | 6/2015 | Makala et al. |
| 2015/0380419 | A1 | 12/2015 | Gunji-Yoneoka et al. |
| 2016/0111438 | A1 | 4/2016 | Tsutsumi et al. |
| 2016/0204122 | A1 | 7/2016 | Shoji et al. |
| 2016/0351497 | A1 | 12/2016 | Peri et al. |
| 2017/0084618 | A1 | 3/2017 | Peri et al. |
| 2017/0084623 | A1 | 3/2017 | Sharangpani et al. |
| 2017/0092733 | A1 | 3/2017 | Makala et al. |
| 2017/0125433 | A1 | 5/2017 | Ogawa et al. |
| 2017/0148808 | A1 | 5/2017 | Nishikawa et al. |
| 2017/0148809 | A1 | 5/2017 | Nishikawa et al. |
| 2017/0148810 | A1 | 5/2017 | Kai et al. |
| 2017/0236896 | A1 | 8/2017 | Lu et al. |
| 2017/0278571 | A1 | 9/2017 | Chowdhury et al. |

OTHER PUBLICATIONS

Maeda et al., "Multi-Stacked 1G Cell/Layer Pipe-Shaped BiCS Flash Memory," 2009 Symposium on VLSI Technology Digest of Technical Papers, pp. 22-23.
U.S. Appl. No. 15/286,063, filed Oct. 5, 2016, SanDisk Technologies LLC.
U.S. Appl. No. 15/332,429, filed Oct. 24, 2016, SanDisk Technologies LLC.
U.S. Appl. No. 15/337,235, filed Oct. 28, 2016, SanDisk Technologies LLC.
U.S. Appl. No. 15/354,067, filed Nov. 17, 2016, SanDisk Technologies LLC.
U.S. Appl. No. 15/354,795, filed Nov. 17, 2016, SanDisk Technologies LLC.
U.S. Appl. No. 15/468,732, filed Mar. 24, 2017, SanDisk Technologies LLC.
U.S. Appl. No. 15/496,359, filed Apr. 25, 2017, SanDisk Technologies LLC.
U.S. Appl. No. 15/628,495, filed Jun. 20, 2017, SanDisk Technologies LLC.
U.S. Appl. No. 15/685,254, filed Aug. 24, 2017, SanDisk Technologies LLC.
U.S. Appl. No. 15/704,286, filed Sep. 14, 2017, SanDisk Technologies LLC.
U.S. Appl. No. 15/784,549, filed Oct. 16, 2017, SanDisk Technologies LLC.
U.S. Appl. No. 15/458,200, filed Mar. 14, 2017, SanDisk Technologies LLC.
U.S. Appl. No. 15/458,269, filed Mar. 14, 2017, SanDisk Technologies LLC.
U.S. Appl. No. 15/458,272, filed Mar. 14, 2017, SanDisk Technologies LLC.
U.S. Appl. No. 15/626,444, filed Jun. 19, 2017, SanDisk Technologies LLC.
U.S. Appl. No. 15/633,131, filed Jun. 26, 2017, SanDisk Technologies LLC.
U.S. Appl. No. 15/669,243, filed Aug. 4, 2017, SanDisk Technologies LLC.
U.S. Appl. No. 15/818,061, filed Nov. 20, 2017, SanDisk Technologies LLC.
U.S. Appl. No. 15/818,146, filed Nov. 20, 2017, SanDisk Technologies LLC.
U.S. Appl. No. 15/850,073, filed Dec. 21, 2017, SanDisk Technologies LLC.
U.S. Appl. No. 15/865,892, filed Jan. 9, 2018, SanDisk Technologies LLC.

* cited by examiner

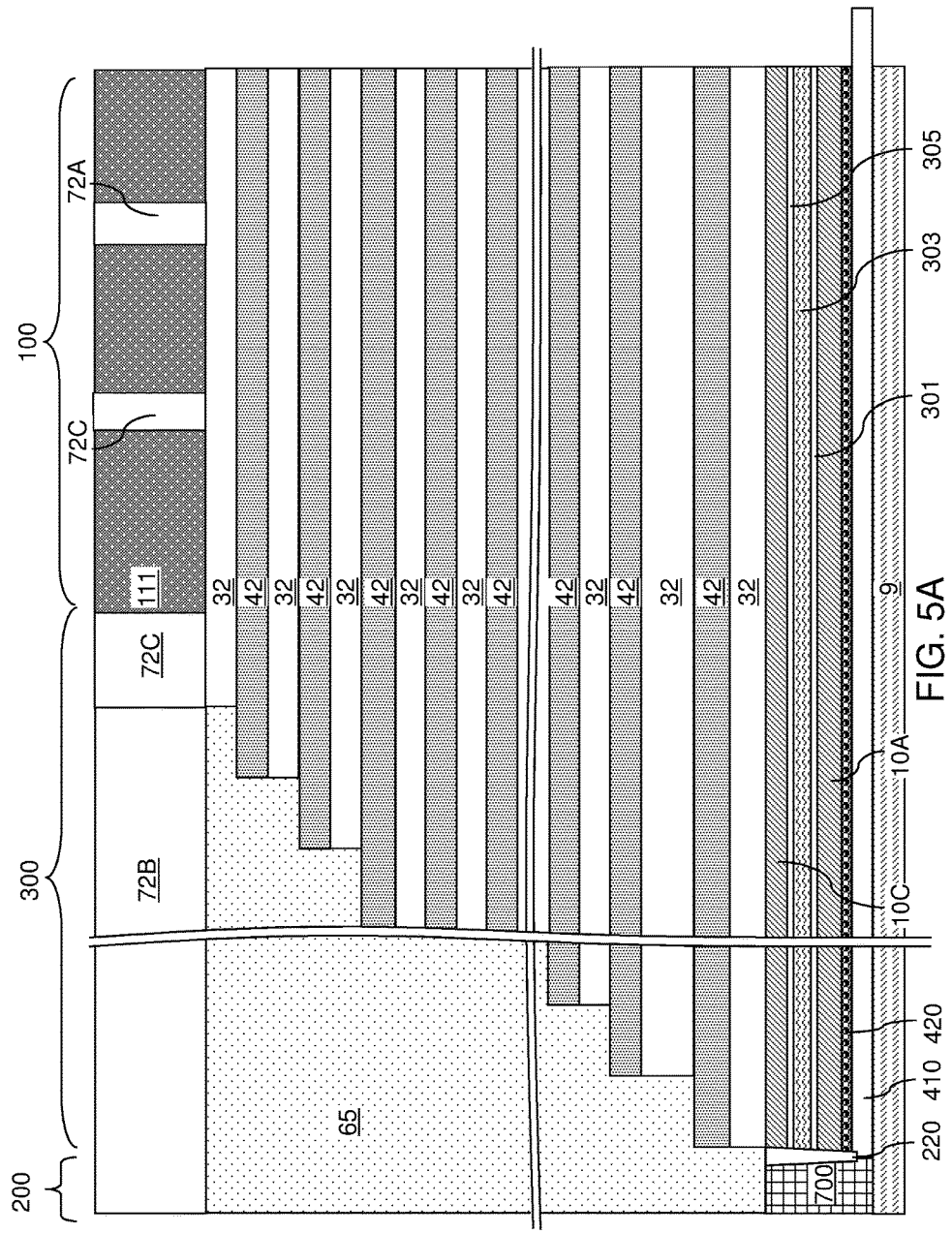

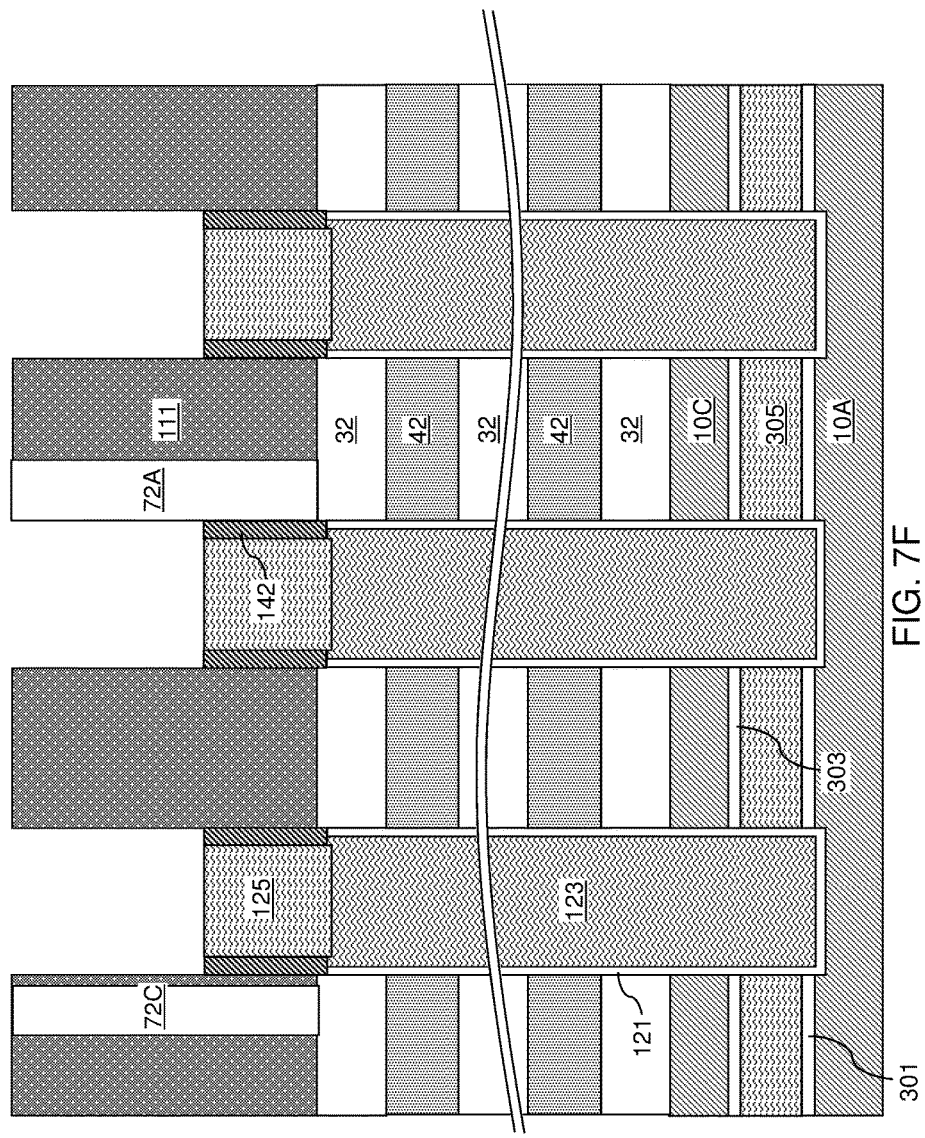

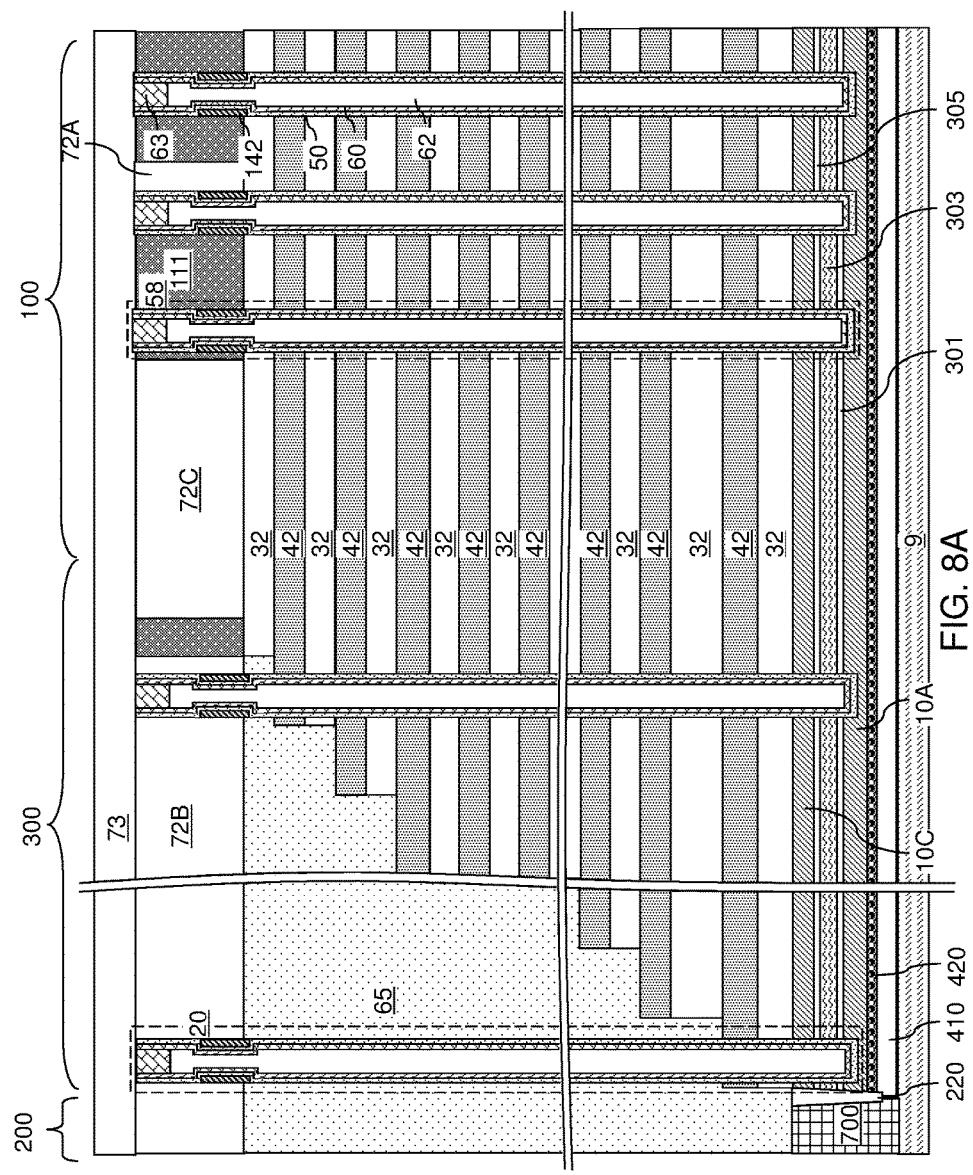

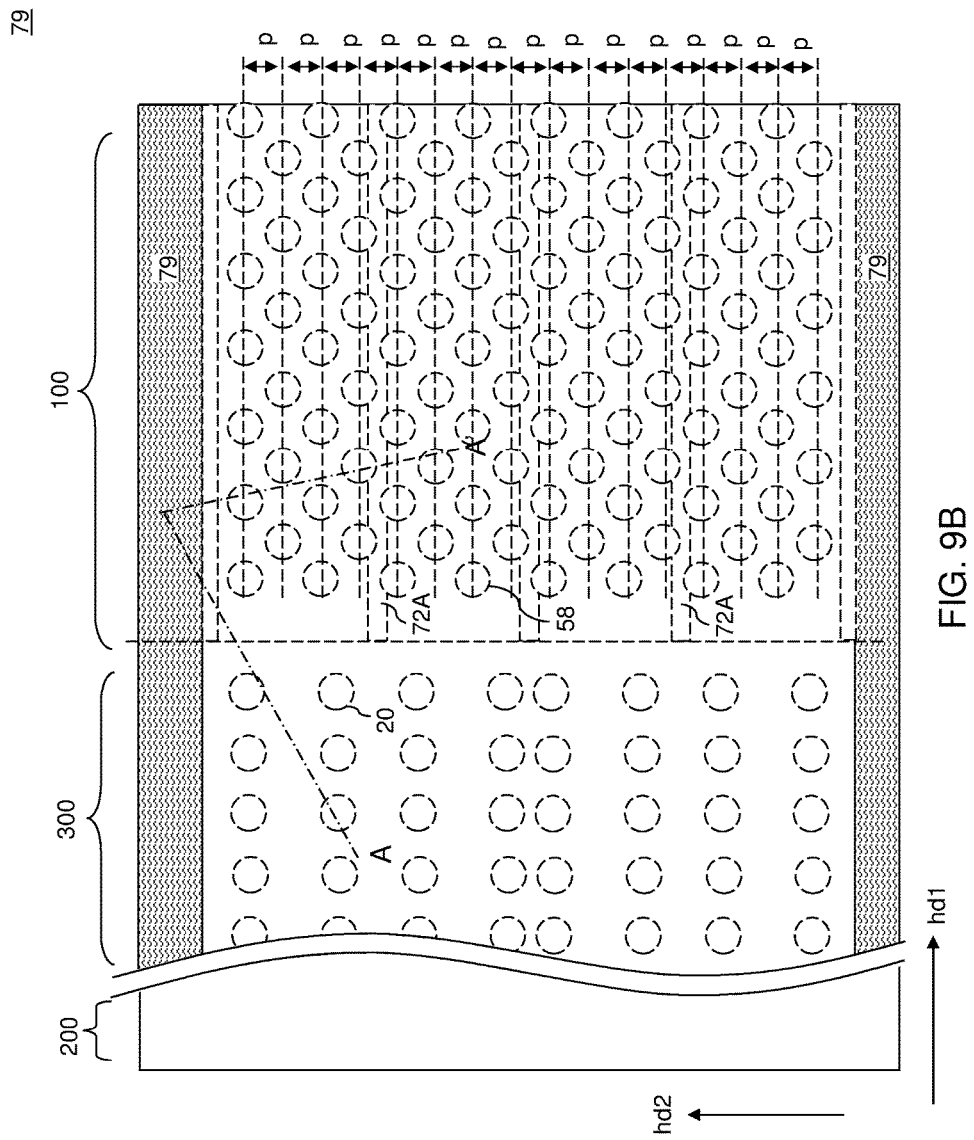

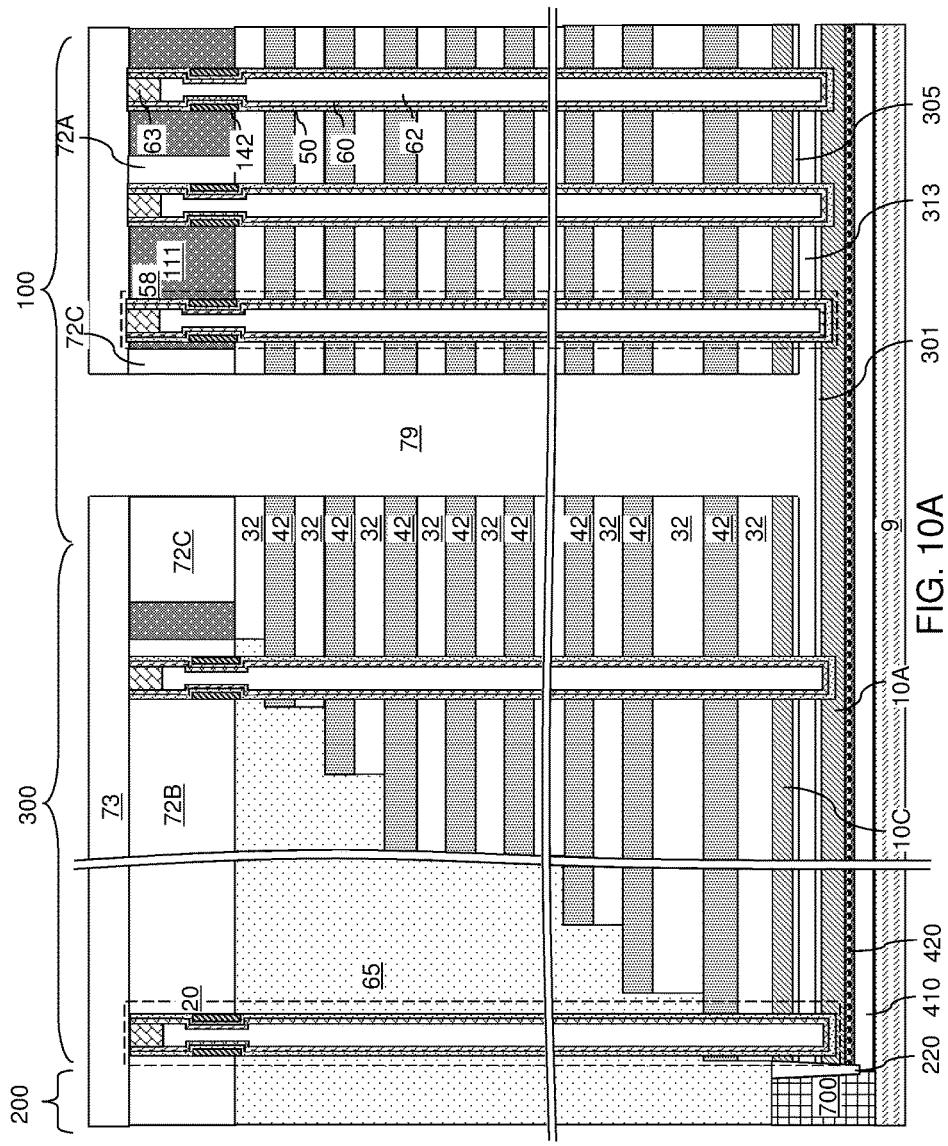

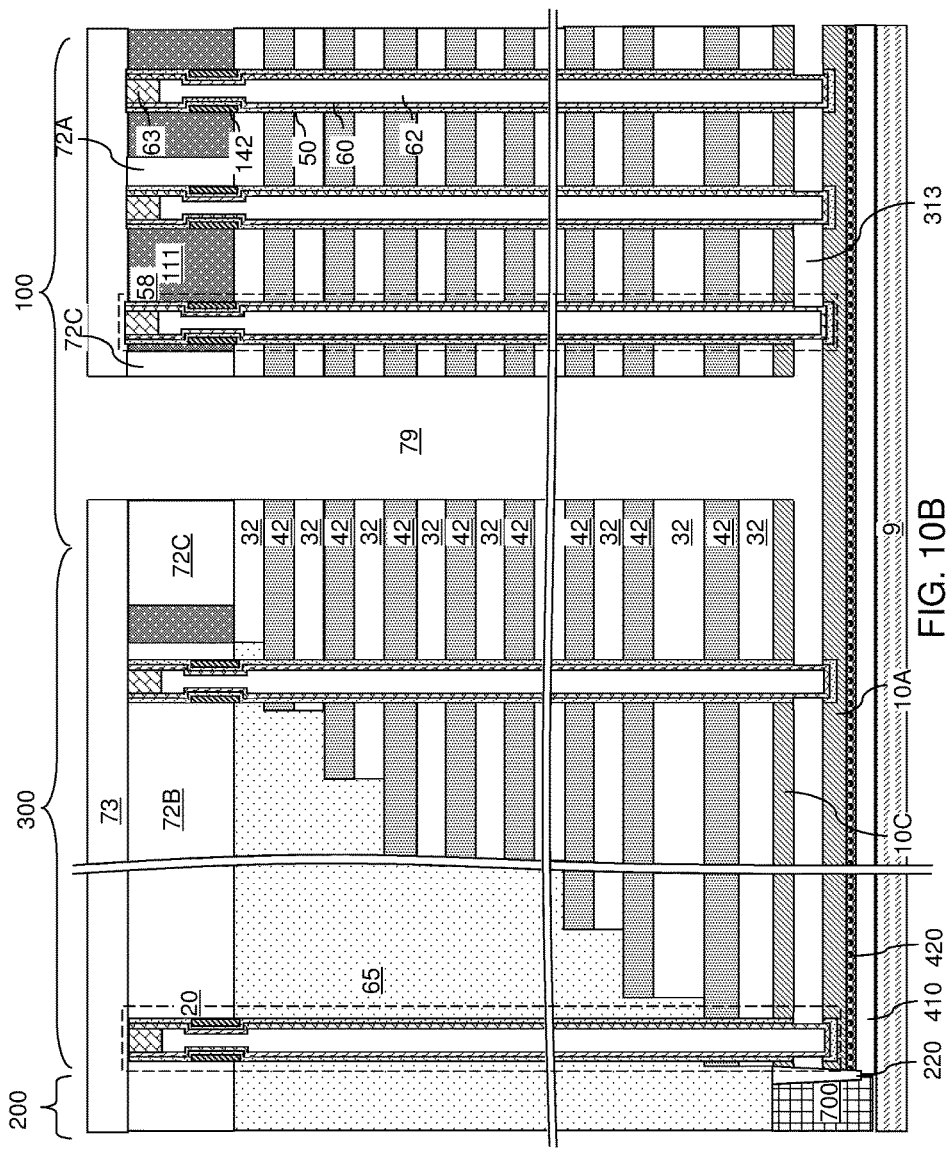

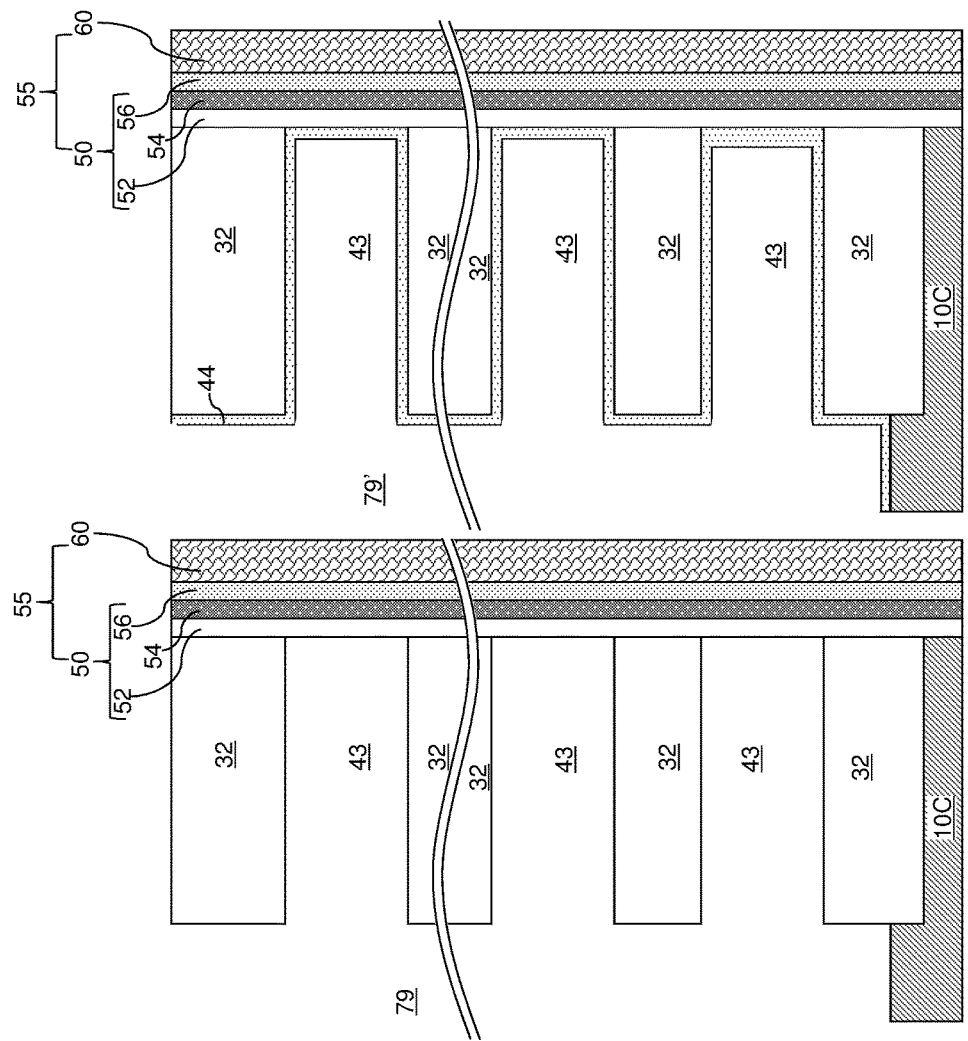

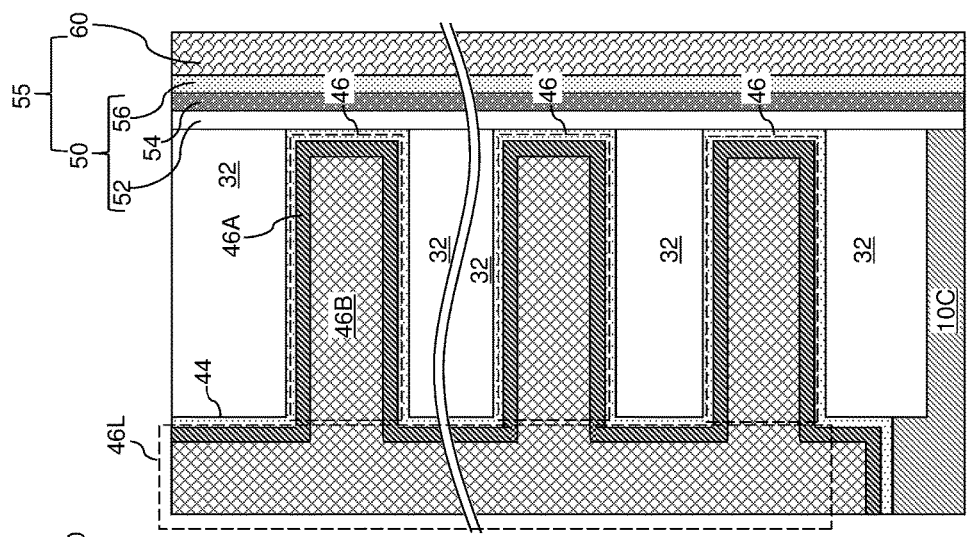
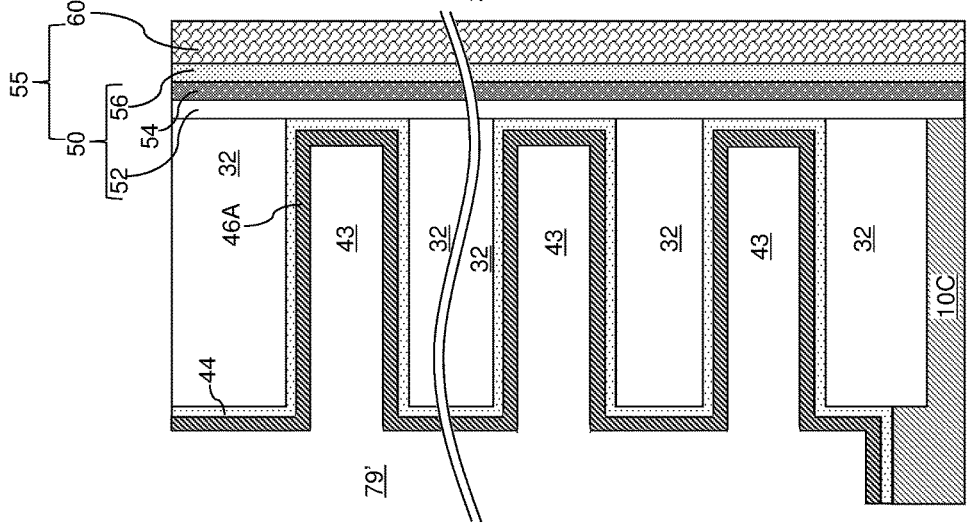

SELF-ALIGNED TUBULAR ELECTRODE PORTIONS INSIDE MEMORY OPENINGS FOR DRAIN SELECT GATE ELECTRODES IN A THREE-DIMENSIONAL MEMORY DEVICE

FIELD

The present disclosure relates generally to the field of semiconductor devices, and particular to a three-dimensional memory device employing self-aligned tubular electrode portions for drain select gate electrodes inside memory openings and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an insulating fill material layer and plate electrode portions located over the alternating stack; memory openings vertically extending through the insulating fill material layer, the plate electrode portions, and the alternating stack, wherein the insulating fill material layer includes a drain select level isolation structure located between neighboring rows of memory openings and generally extending along a first horizontal direction; and memory opening fill structures located in the memory openings, wherein each memory opening fill structure comprises a memory film, a vertical semiconductor channel laterally surrounded by the memory film, and a tubular electrode portion overlying the alternating stack and contacting a respective one of the plate electrode portions, wherein the plate electrode portions and the tubular electrode portions collectively constitute drain select gate electrodes.

According to another aspect of the present disclosure, a method of forming a three-dimensional memory device is provided, which comprises the steps of: forming an alternating stack of insulating layers and spacer material layers over a substrate, wherein the spacer material layers are formed as, or are subsequently replaced with, electrically conductive layers; forming sacrificial matrices embedded in an insulating fill material layer over the alternating stack; forming memory openings through the sacrificial matrices, the insulating fill material layer, and the alternating stack; forming tubular electrode portions in the memory openings; forming memory stack structures within each memory opening and on a respective one of the tubular electrode portions, wherein each memory stack structure comprises a memory film and a vertical semiconductor channel; and replacing the sacrificial matrices with plate electrode portions, wherein each contiguous combination of a plate electrode portion and a set of tubular electrode portions constitutes a drain select gate electrode.

BRIEF DESCRIPTION OF THE DRAWINGS

FIG. 5A is a schematic vertical cross-sectional view of the exemplary structure after formation of sacrificial matrices embedded in an insulating fill material layer according to an embodiment of the present disclosure.

FIGS. 7A-7K are sequential schematic vertical cross-sectional views of memory openings within the exemplary structure during formation of memory opening fill structures therein according to an embodiment of the present disclosure.

FIG. 8A is a schematic vertical cross-sectional view of the exemplary structure after formation of memory stack structures and support pillar structures according to an embodiment of the present disclosure.

FIG. 9B is a partial see-through top-down view of the exemplary structure of FIG. 9A. The vertical plane A-A' is the plane of the schematic vertical cross-sectional view of FIG. 9A.

FIGS. 10A-10D are schematic sequential vertical cross-sectional views of the exemplary structure during replacement of the in-process source layer stack with a buried source layer stack according to an embodiment of the present disclosure.

FIGS. 11A-11D are sequential vertical cross-sectional views of a region of the exemplary structure during formation of electrically conductive layers according to an embodiment of the present disclosure.

DETAILED DESCRIPTION

Figure 1:
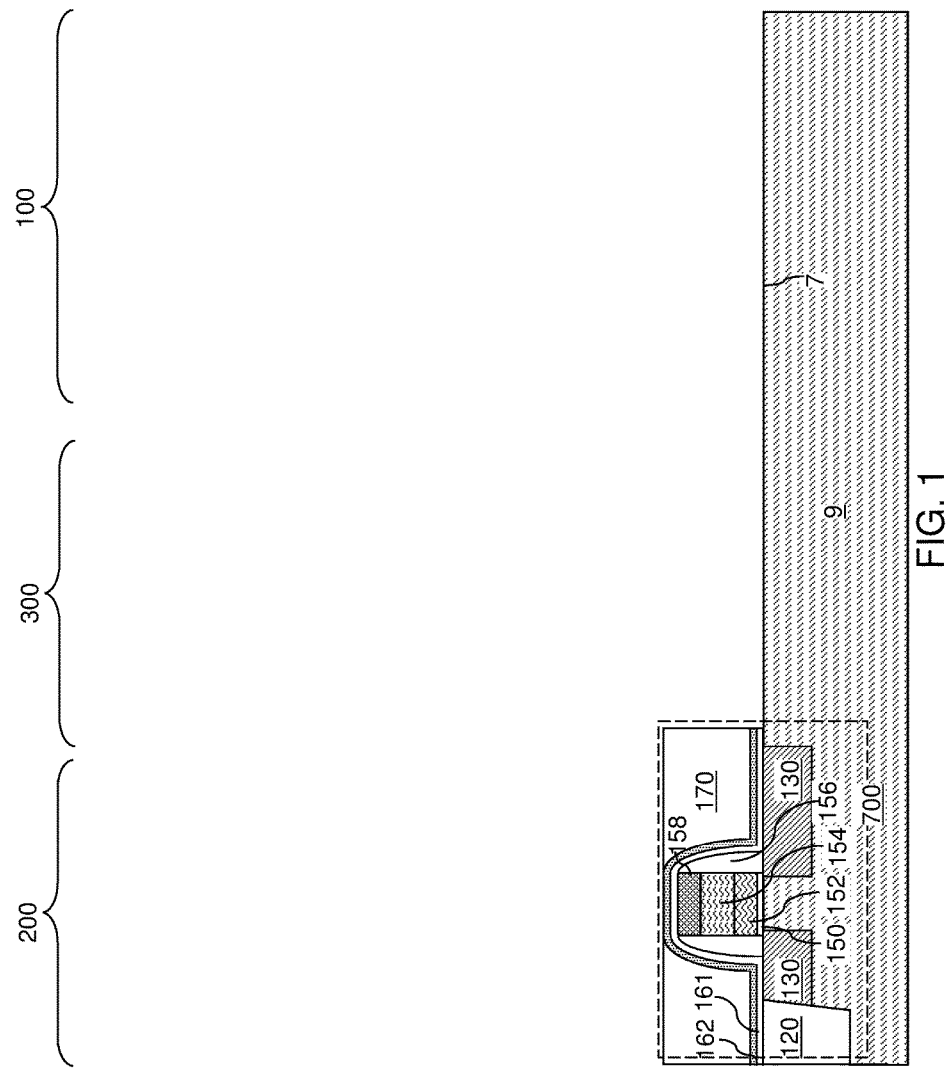
FIG. 1 is a schematic vertical cross-sectional view of an exemplary structure after formation of at least one peripheral device and a semiconductor material layer according to an embodiment of the present disclosure.

As discussed above, the present disclosure is directed to a three-dimensional memory device employing self-aligned tubular electrode portions for drain select gate electrodes inside memory openings and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, a "contact" between elements refer to a direct contact between elements that provides an edge or a surface shared by the elements. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate semiconductor layer 9, which maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162) overlying gate electrodes. Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Portions of the planarization dielectric layer 170 and the dielectric liners (161, 162) in the memory array region 100 and the contact region 300 can be removed, for example, by masking the peripheral device region 200 with a patterned photoresist layer (not shown), and by isotropically or anisotropically etching the portions of the planarization dielectric layer 170 and the dielectric liners (161, 162) in the memory array region 100 and the contact region 300. The photoresist layer can be removed, for example, by ashing.

Figure 2:
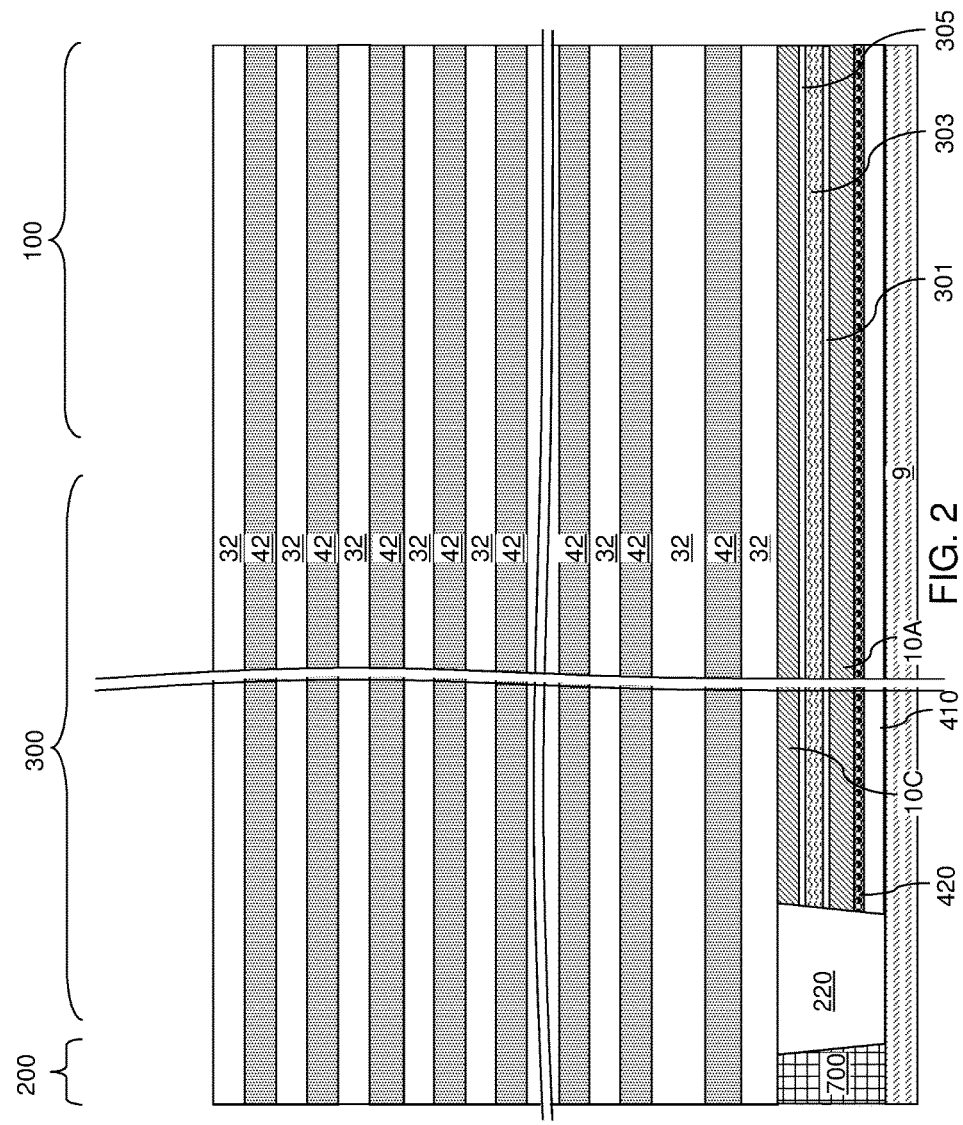
FIG. 2 is a schematic vertical cross-sectional view of the exemplary structure after formation of an in-process source layer stack and an alternating stack of insulating layers and sacrificial material layers according to an embodiment of the present disclosure.

Referring to FIG. 2, a substrate isolation layer 410 and an in-process source layer stack (420, 10A, 301, 303, 305, 10C) can be formed over the top surface of the substrate semiconductor layer 9 in the memory array region 100 and the contact region 300. The substrate isolation layer 410 includes a dielectric material such as silicon oxide, and provides electrical isolation between the in-process source layer stack (420, 10A, 301, 303, 305, 10C) and the substrate semiconductor layer 9. The thickness of the substrate isolation layer 410 can be in a range from 100 nm to 500 nm, although lesser and greater thicknesses can also be employed.

The in-process source layer stack (420, 10A, 301, 303, 305, 10C) includes a layer stack, from bottom to top, of an optional source conductor layer 420, a lower source semiconductor layer 10A, an optional lower sacrificial source liner 301, a sacrificial source material layer 303, an optional upper sacrificial source liner 305, and an upper source semiconductor layer 10C.

The optional source conductor layer 420 includes at least one metallic material such as a conductive metal nitride (e.g., TiN, TaN, WN), a conductive metal silicide (e.g., Ti, Ta, W, Co and/or Ni silicide) and/or at least one elemental metal (e.g., W, Ti, Ta). The thickness of the optional source metal layer 420 can be in a range from 20 nm to 200 nm, although lesser and greater thicknesses can also be employed.

The lower source semiconductor layer 10A includes a semiconductor material having a doping of a first conductivity type and provided as, or can be annealed into, a conductive semiconductor material. For example, the lower source semiconductor layer 10A can include heavily boron-doped amorphous silicon or heavily boron-doped polysilicon. The thickness of the lower source semiconductor layer 10A can be in a range from 30 nm to 300 nm, although lesser and greater thicknesses can also be employed.

The optional lower sacrificial source liner 301 includes a dielectric material such as silicon oxide, and can have a thickness in a range from 5 nm to 30 nm, although lesser and greater thicknesses can also be employed.

The sacrificial source material layer 303 includes a material that can be removed selective to the materials of the lower source semiconductor layer 10A, the upper source semiconductor layer 10C and the sacrificial source liners (301, 305). For example, the sacrificial source material layer 303 can include an undoped semiconductor material (such as undoped amorphous silicon or undoped polysilicon), a silicon-germanium alloy, germanium, carbon, or a material that can be ashed. In one embodiment, the sacrificial source material layer 303 can include undoped amorphous silicon. The thickness of the sacrificial source material layer 303 can be in a range from 10 nm to 50 nm, although lesser and greater thicknesses can also be employed.

The optional upper sacrificial source liner 305 includes a dielectric material such as silicon oxide, and can have a thickness in a range from 5 nm to 30 nm, although lesser and greater thicknesses can also be employed. Additional liner and/or sacrificial source layers may be included in the in-process source layer stack.

The upper source semiconductor layer 10C includes a semiconductor material having a doping of the first conductivity type and provided as, or can be annealed into, a conductive semiconductor material. For example, the upper source semiconductor layer 10C can include heavily boron-doped amorphous silicon or heavily boron-doped polysilicon. The thickness of the upper source semiconductor layer 10C can be in a range from 30 nm to 300 nm, although lesser and greater thicknesses can also be employed.

The in-process source layer stack (420, 10A, 301, 303, 305, 10C) can be patterned to remove portions overlying the at least one semiconductor device 700 in the peripheral device region 200. A dielectric isolation structure 220 including a dielectric material (such as silicon oxide) can be formed at a boundary between the peripheral device region 200 and the contact region 300. The dielectric isolation structure 220 can be formed, for example, by forming an isolation trench extending through peripheral portions of the in-process source layer stack (420, 10A, 301, 303, 305, 10C), depositing the dielectric material in the isolation trench, and planarizing the dielectric material.

A stack of an alternating plurality of first material layers (which can be insulating layers 32) and second material layers (which can be sacrificial material layer 42) is formed over the top surface of the in-process source layer stack (420, 10A, 301, 303, 305, 10C). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Figure 3:
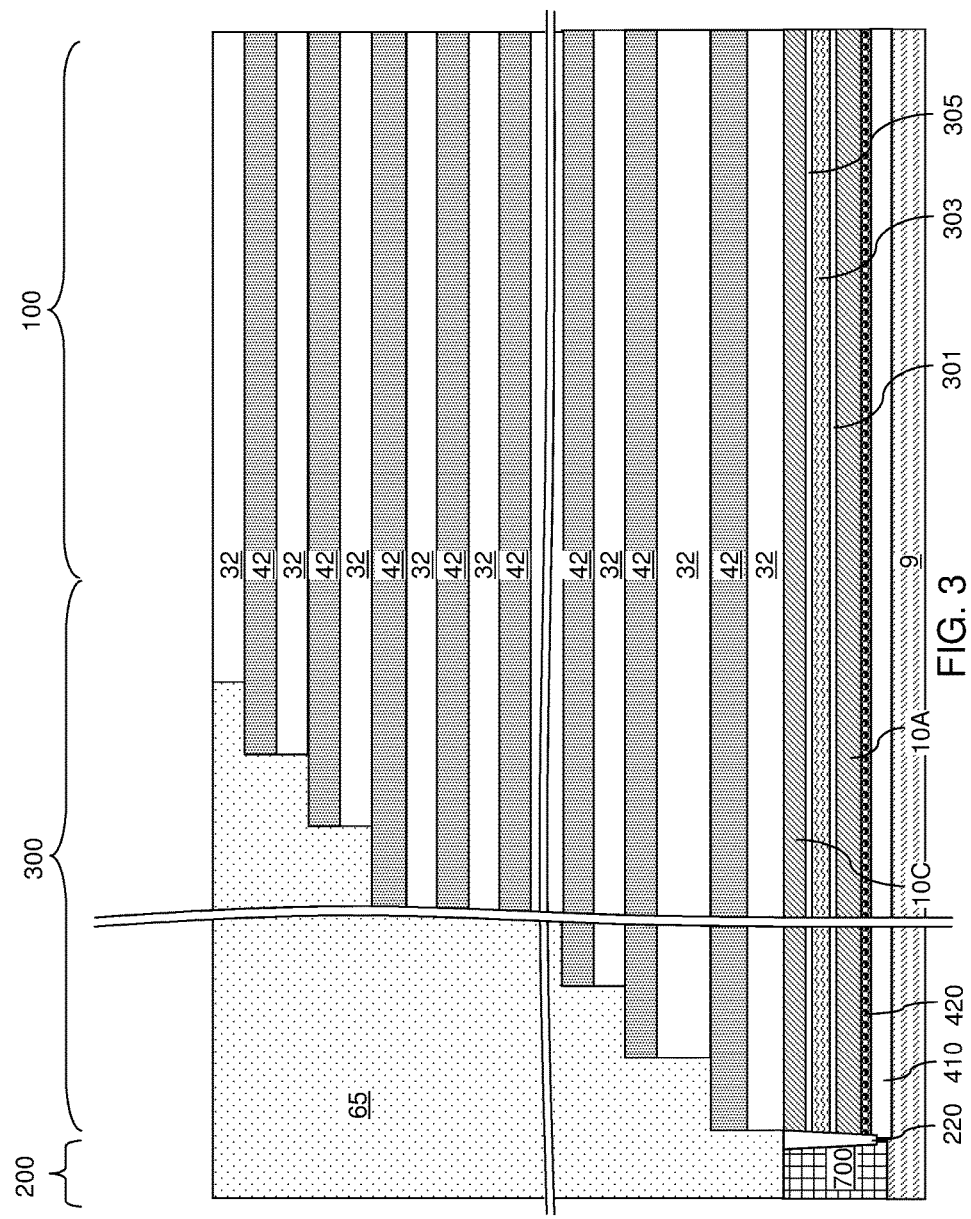
FIG. 3 is a schematic vertical cross-sectional view of the exemplary structure after formation of stepped terraces and a retro-stepped dielectric material portion according to an embodiment of the present disclosure.

Referring to FIG. 3, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate semiconductor layer 9. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the alternating stack (32, 42) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the alternating stack (32, 42), for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4:
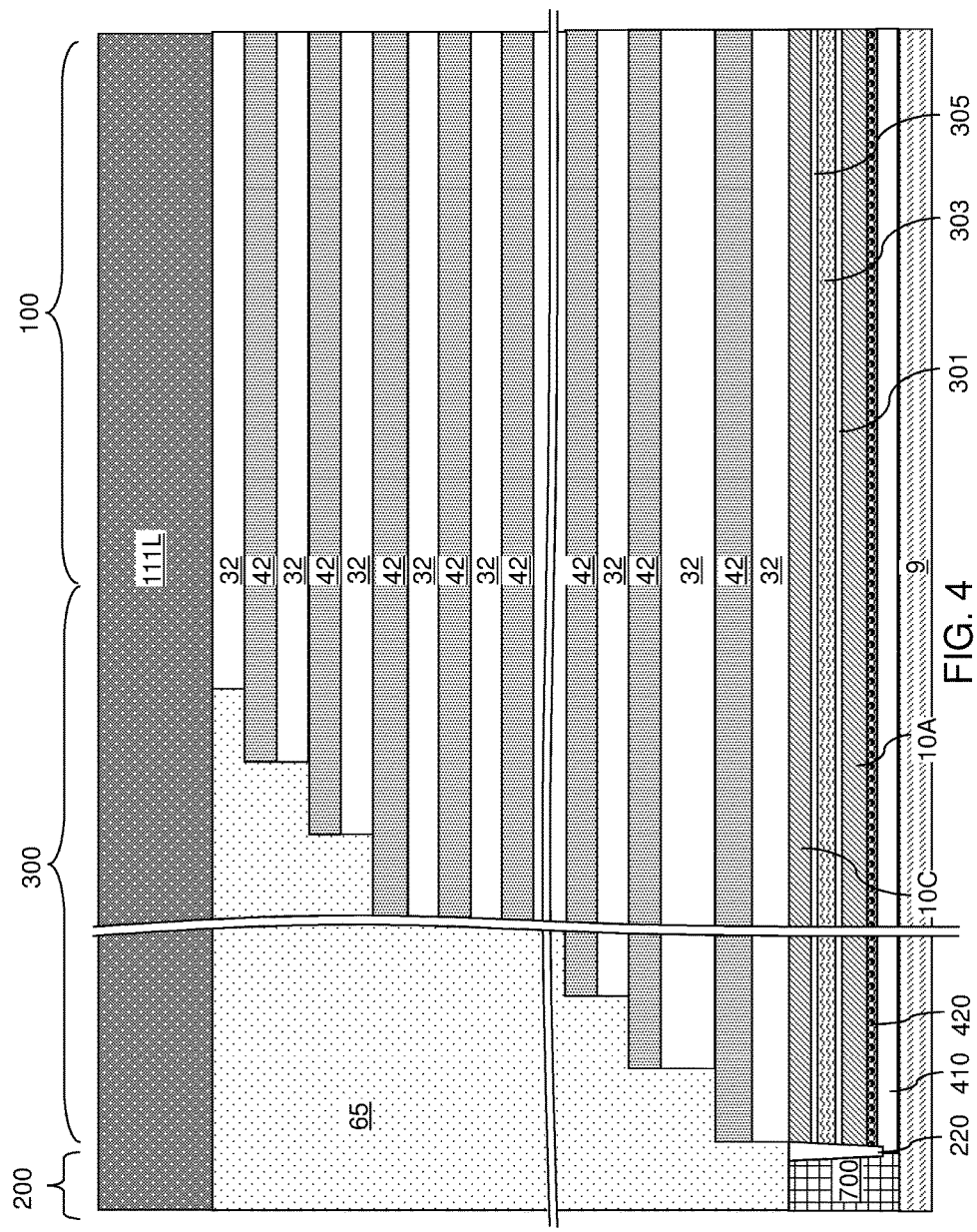
FIG. 4 is a schematic vertical cross-sectional view of the exemplary structure after formation of a blanket sacrificial material layer according to an embodiment of the present disclosure.

Referring to FIG. 4, a blanket sacrificial material layer 111L can be formed over the alternating stack (32, 42) and the retro-stepped dielectric material portion 65. The blanket sacrificial material layer 111L includes a sacrificial material that is different from the material of the insulating layers 32. The material of the blanket sacrificial material layer 111L may be the same as, or may be different from, the material of the sacrificial material layers 42. The blanket sacrificial material layer 111L can be formed as an unpatterned layer. i.e., a "blanket" layer. The thickness of the blanket sacrificial material layer 111L can be in a range from 80 nm to 600 nm, such as from 120 nm to 300 nm, although lesser and greater thicknesses can also be employed. In one embodiment, the blanket sacrificial material layer 111L can include silicon nitride.

Figure 5B:
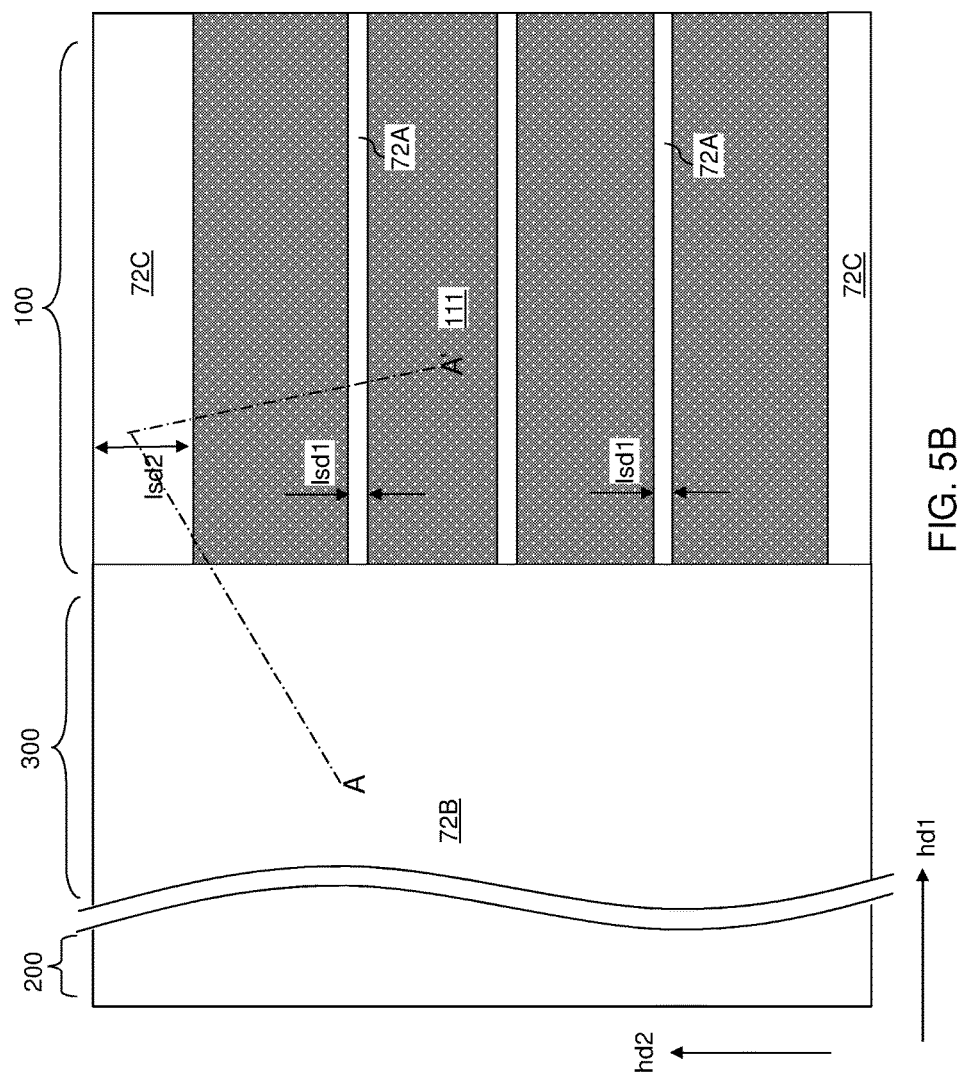
FIG. 5B is a top-down view of the exemplary structure of FIG. 5A. The vertical plane A-A' is the plane of the cross-section for FIG. 5A.
Figure 5C:
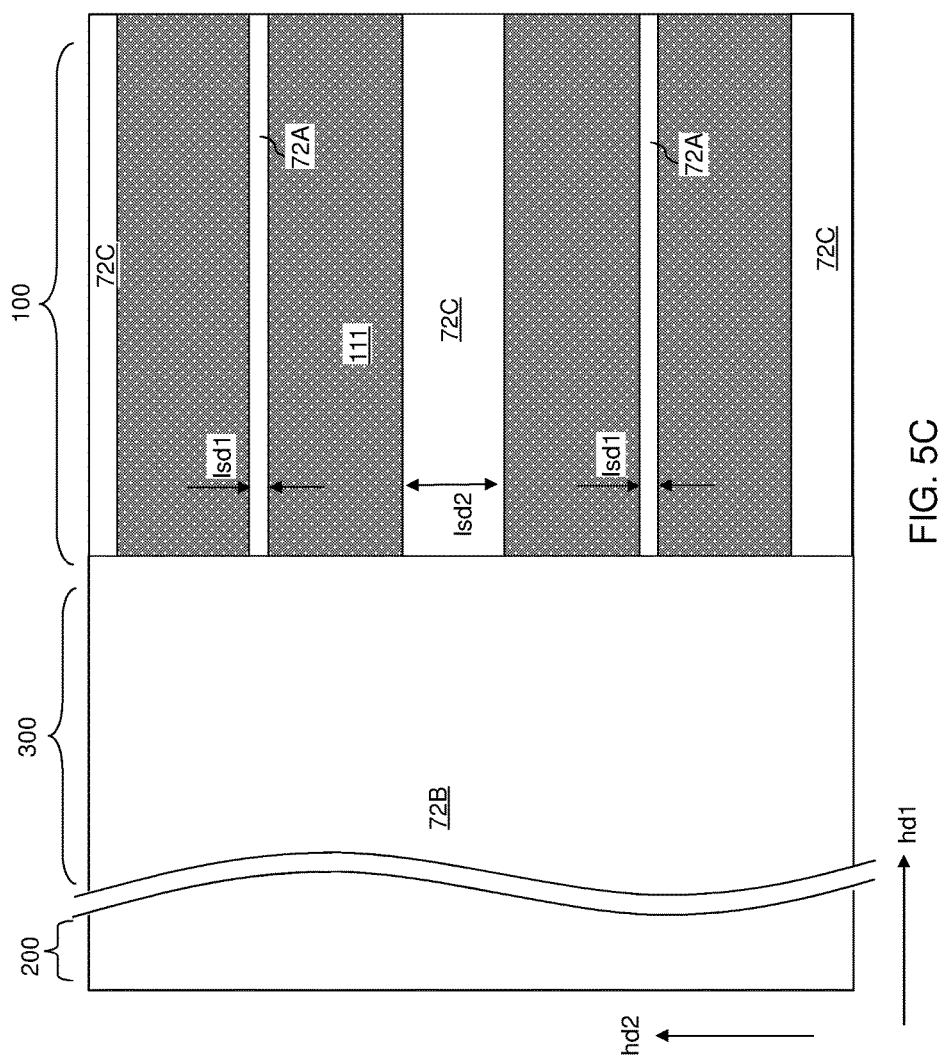
FIG. 5C is a top-down view of an alternative embodiment of the exemplary structure at the processing steps of FIGS. 5A and 5B.

Referring to FIGS. 5A-5C, the blanket sacrificial material layer 111L can be patterned into sacrificial matrices 111. For example, a photoresist layer (not shown) can be applied and patterned over the top surface of the blanket sacrificial material layer 111L to cover discrete areas in the memory array region 100. FIGS. 5B and 5C show top-down views of two alternative exemplary configurations corresponding to different patterns employed to pattern the photoresist layer. In one embodiment, each of the discrete covered areas can have lengthwise edges that extend along a first horizontal direction hd1 (e.g., word line direction). In one embodiment, the covered areas can have rectangular shapes such that each rectangular shape has a pair of lengthwise edges that are parallel to the first horizontal direction hd1 and a pair of widthwise edges that are parallel to a second horizontal direction hd2 (e.g., bit line direction) that is perpendicular to the first horizontal direction hd1. In one embodiment shown in FIG. 5B, multiple set of neighboring rectangular areas can be laterally spaced among one another by a first lateral separation distance lsd1 along the second horizontal direction hd2.

An anisotropic etch can be performed to etch uncovered portions of the blanket sacrificial material layer 111L. Each remaining portion of the blanket sacrificial material layer 111L constitutes a sacrificial matrix 111 that duplicates the shape of an overlying patterned photoresist material portion. In one embodiment, the sacrificial matrices 111 can have rectangular shapes in a plan view, i.e., a view from above along a downward vertical direction. The photoresist layer can be subsequently removed, for example, by ashing. In one embodiment, the sacrificial matrices 111 can include silicon nitride. In another embodiment, the sacrificial matrices 111 can include a doped semiconductor material (such as doped amorphous silicon or doped polysilicon), and thus, can be doped semiconductor matrices. In one embodiment, the blanket sacrificial material layer 111L can be completely removed in the areas of the contact region 300 and the peripheral device region 200.

An insulating fill material can be deposited in the volumes from which the material of the blanket sacrificial material layer 111L is removed. The insulating fill material can include a silicon oxide material such as densified TEOS oxide or a spin-on glass (SOG). Excess portions of the insulating fill material can be removed from above the horizontal plane including top surfaces of the sacrificial matrices 111 by a planarization process such as chemical mechanical planarization (CMP). Remaining portions of the insulating fill material can be continuously connected among one another to form an insulating fill material layer (72A, 72B, 72C).

The insulating fill material layer (72A, 72B, 72C) can include drain select level isolation structures 72A located between a neighboring pair of sacrificial matrices 111 separated by a respective lateral separation distance, a field insulating material portion 72B continuously extending in the contact region 300 and the peripheral device region 200, and a string isolation structure 72C in which a backside trench which separates adjacent NAND memory strings will be subsequently formed. Each drain select level isolation structure 72A and string isolation structure 72C can include a first lengthwise sidewall and a second lengthwise sidewall that laterally extend along the first horizontal direction hd1. In one embodiment, a group of at least two sacrificial matrices 111 can be spaced apart among one another by a respective drain select level isolation structure 72A having a first lateral separation distance lsd1, and groups of at least two sacrificial matrices 111 can be spaced apart among one another by a respective string isolation structure 72C having a second lateral separation distance lsd2 that is greater than the first lateral separation distance lsd1. In other words, the sacrificial matrices 111 can be laterally spaced apart by the first lateral separation distance lsd1 within each group, and a group-to-group separation distance between adjacent NAND memory strings can be the second lateral separation distance. In one embodiment, the first lateral separation distance lsd1 is selected to be less than a center-to-center lateral distance of a neighboring pair of memory stack structures within a periodic array of memory stack structures to be subsequently formed, and the second lateral separation distance lsd2 can be greater than the width of backside trenches to be subsequently formed.

The number of sacrificial matrices 111 within a neighboring pair of string isolation structures 72C having the width of the second lateral separation distance lsd2, i.e., the number of sacrificial matrices 111 within each NAND memory string (e.g., within a group of sacrificial matrices), may be 2, 3, 4, 5, 6, 7, 8, 9, 10, 11, 12, or more, such as 2 to 4. FIG. 5B illustrates an embodiment in which the number of sacrificial matrices 111 within a neighboring pair of string isolation structures 72C having the width of the second lateral separation distance lsd2 is 4. The four sacrificial matrices 111 are separated from each other in the memory string by three respective drain select level isolation structures 72A. FIG. 5C illustrates an embodiment in which the number of sacrificial matrices 111 within a neighboring pair of string isolation structures 72C having the width of the second lateral separation distance lsd2 is 2. The two sacrificial matrices 111 are separated from each other in the memory string by one respective drain select level isolation structure 72A.

Figure 6A:
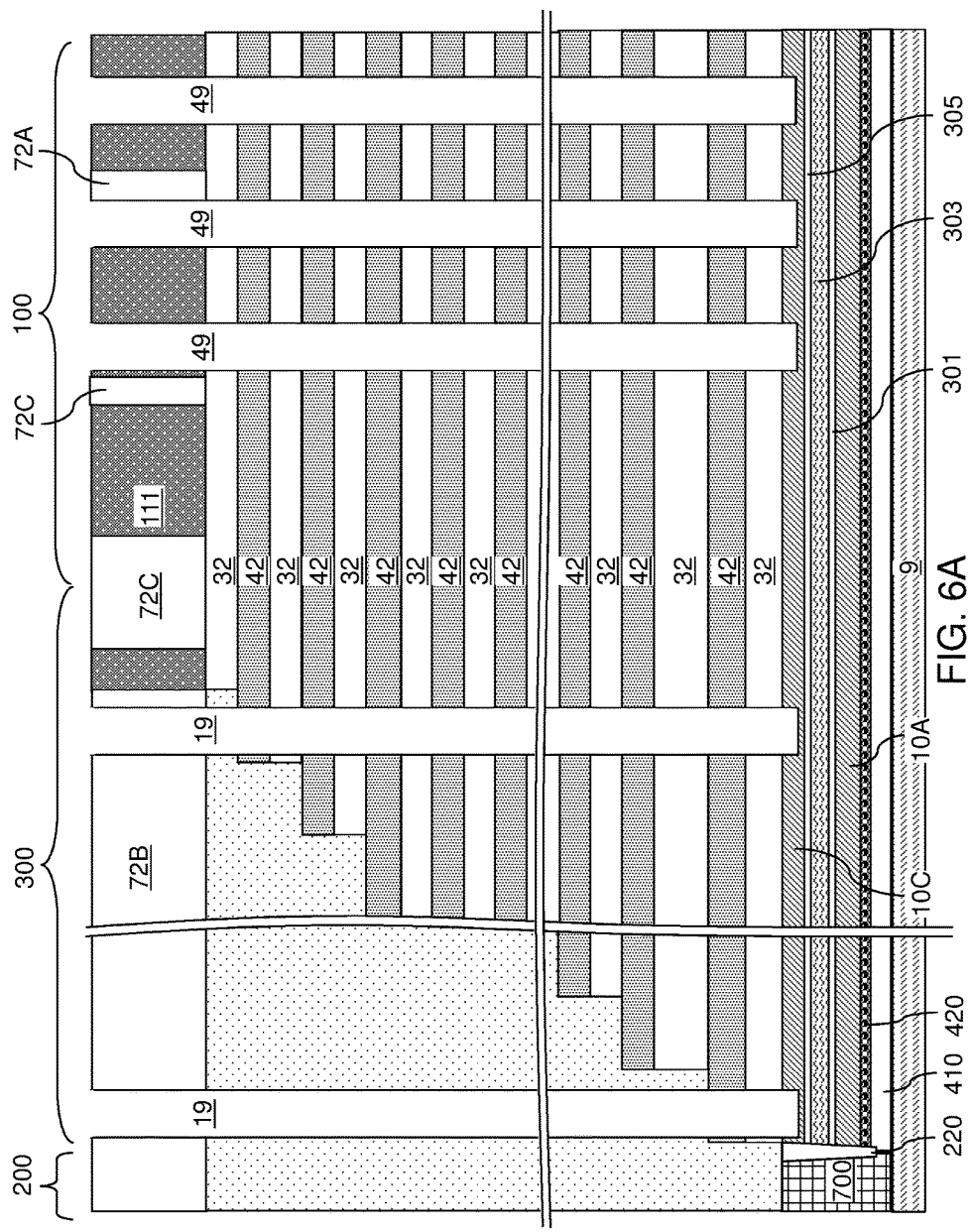
FIG. 6A is a schematic vertical cross-sectional view of the exemplary structure after formation of memory openings and support openings according to an embodiment of the present disclosure.
Figure 6B:
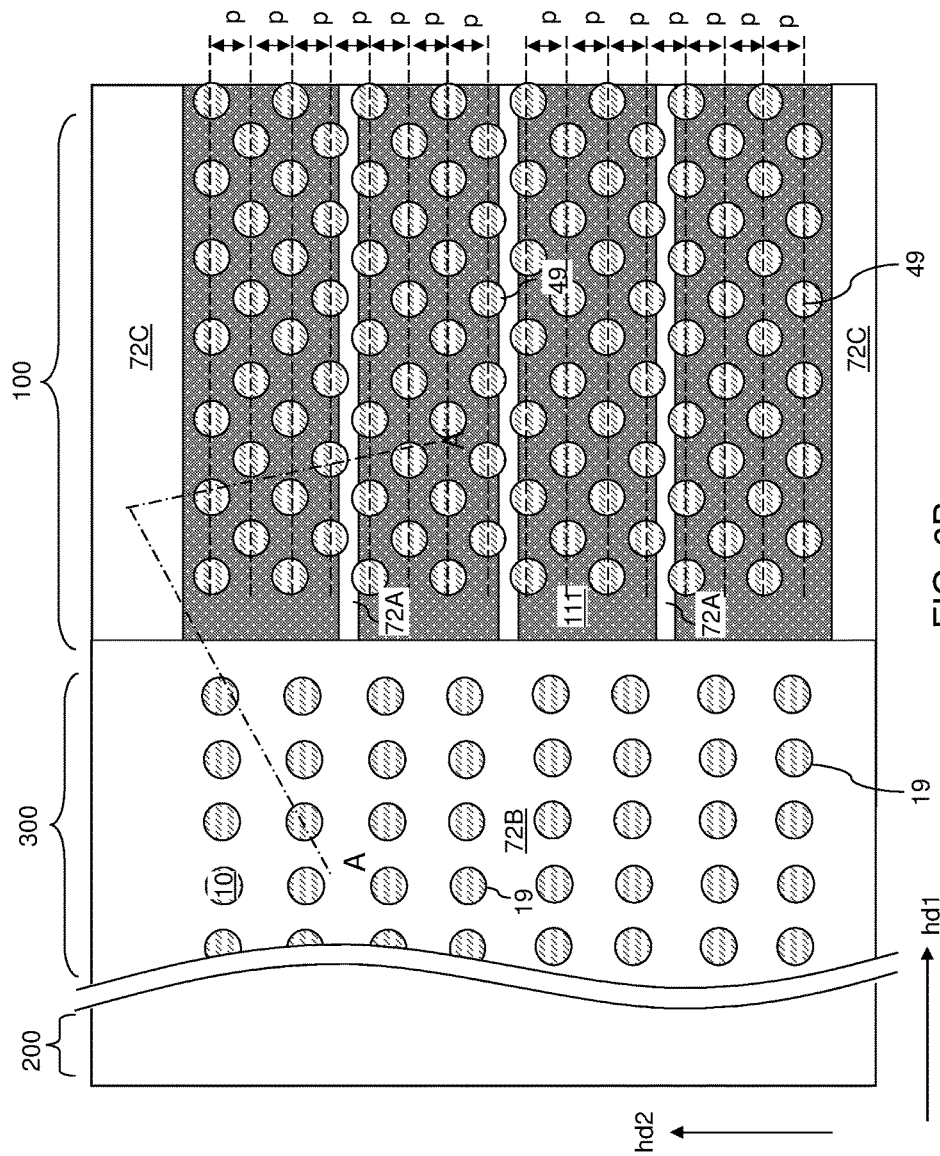
FIG. 6B is a top-down view of the exemplary structure of FIG. 6A. The vertical plane A-A' is the plane of the cross-section for FIG. 6A.
Figure 6C:
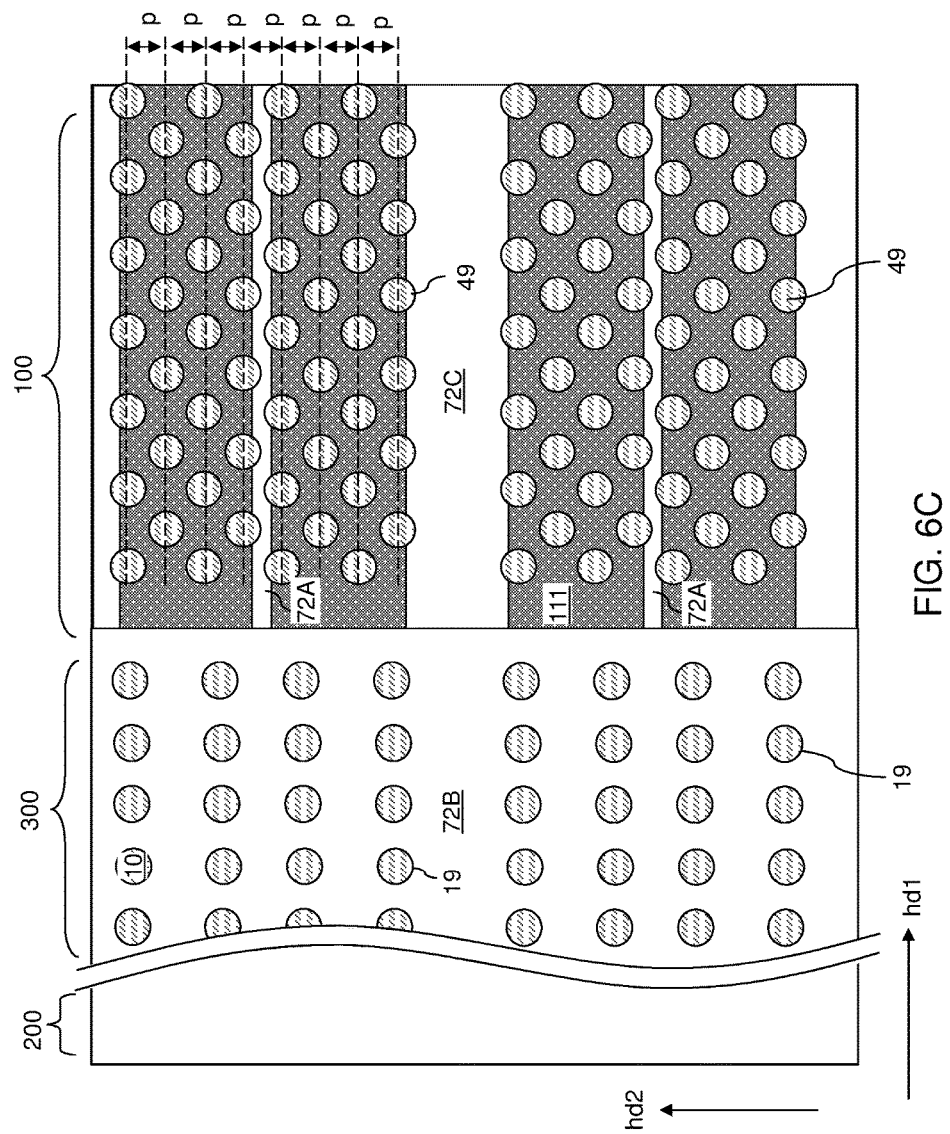
FIG. 6C is a top-down view of the alternative embodiment of the exemplary structure at the processing steps of FIGS. 6A and 6B.

Referring to FIGS. 6A-6C, a lithographic material stack (not shown) including at least a photoresist layer can be formed over the combination of the insulating fill material layer (72A, 72B, 72C) and the sacrificial matrices 111, and can be lithographically patterned to form openings therein. The openings include a first set of openings formed over the memory array region 100 and a second set of openings formed over the contact region 300. The pattern in the lithographic material stack can be transferred through the combination of the insulating fill material layer (72A, 72B, 72C) and the sacrificial matrices 111, the alternating stack (32, 42), and the retro-stepped dielectric material portion 65 by at least one anisotropic etch that employs the patterned lithographic material stack as an etch mask.

Portions of the combination of the insulating fill material layer (72A, 72B, 72C) and the sacrificial matrices 111 and the alternating stack (32, 42) underlying the openings in the patterned lithographic material stack within the memory array region 100 are etched to form memory openings 49. Portions of the field insulating material portion 72B, the alternating stack (32, 42), and the retro-stepped dielectric material portion 65 underlying the openings in the patterned lithographic material stack within the contact region 300 are etched to form support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through at least one of the drain select level isolation structure 72A portion of the insulating fill material layer (72A, 72B, 72C) and the respective sacrificial matrix 111 and through each layer in the alternating stack (32, 42) in the memory array region 100. The support openings 19 are formed through the field insulating material portion 72B, the retro-stepped dielectric material portion 65, and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surfaces of the combination of the insulating fill material layer (72A, 72B, 72C) and the sacrificial matrices 111 to the lower source semiconductor layer 10A in the in-process source layer stack (420, 10A, 301, 303, 305, 10C). In one embodiment, an overetch into the lower source semiconductor layer 10A may be optionally performed after the top surface of the lower source semiconductor layer 10A is physically exposed at a bottom of each memory opening 49 and each support opening 19. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the lower source semiconductor layer 10A.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300.

Within each group of memory openings 49, the memory openings 49 can be arranged as rows that extend along the first horizontal direction hd1. A strip of the insulating fill material layer (72A, 72B, 72C) which comprises the drain select level isolation structure 72A, laterally extends between a neighboring pair of rows of the memory openings 49. The drain select level isolation structure 72A can include a pair of lengthwise sidewalls, such as a first lengthwise sidewall and a second lengthwise sidewall, that are straight sidewalls that laterally extend along the first horizontal direction hd1. Each lengthwise sidewall of a drain select level isolation structure 72A can be etched through by a respective row of memory openings 49. A first (edge) row of memory openings 49 within the neighboring pair of rows of memory openings 49 can be formed through the first lengthwise sidewall and does not intersect the second lengthwise sidewall, and a second (edge) row of memory openings 49 with the neighboring pair of rows of memory openings 49 is formed through the second lengthwise sidewall and does not intersect the first lengthwise sidewall. Two additional (middle) rows of memory openings can extend through the sacrificial matrices 111 between the first and second (edge) rows without extending through a sidewall of the drain select level isolation structures 72A.

Thus, two edge rows of memory openings 49 can extend through two straight lengthwise sidewalls of each drain select level isolation structure 72A, and two middle rows of memory openings 49 do not. After formation of the memory openings 49, each drain select level isolation structure 72A can have a laterally alternating sequence of concave vertical sidewall portions and planar vertical sidewall portions that laterally alternate along the first horizontal direction hd1. A drain select level isolation structure 72A having a pair of laterally undulating sidewalls laterally extends between neighboring pairs of sacrificial matrices 111 other than the edge matrices 111 located adjacent to the respective string isolation structures 72C. Specifically, the drain select level isolation structure 72A can include a pair of sidewalls containing a respective laterally alternating sequence of planar vertical sidewall portions and concave vertical sidewall portions after formation of the memory openings 49. In one embodiment, the string isolation structures 72C may include only planar vertical sidewalls and no memory openings extending therethrough.

As used herein, a "planar vertical" surface refers to a surface that is contained within a two-dimensional Euclidean vertical plane. As used herein, a "convex vertical" surface refers to a vertically extending surface that is concave at any height. As used herein, a "concave vertical" surface refers to a vertically extending surface that is convex at any height.

The memory openings 49 can be arranged in groups such that each group includes a plurality of rows of memory openings 49. Within each group, the memory openings 49 can be arranged in multiple rows that are spaced apart along the second horizontal direction hd2 that is perpendicular to the first horizontal direction hd1 with a uniform inter-row pitch p for an entirety of the group of memory openings 49. Each neighboring group (e.g., NAND memory string) of memory openings 49 can be laterally spaced part along the second horizontal direction hd2 by the string isolation structure 72C.

FIGS. 7A-7K are sequential schematic vertical cross-sectional views of memory openings 49 within the exemplary structure during formation of memory opening fill structures therein. Similar structural changes occur in each of the support openings 19 as in the memory openings 49 during the processing steps of FIGS. 7A-7K.

Figure 7A:
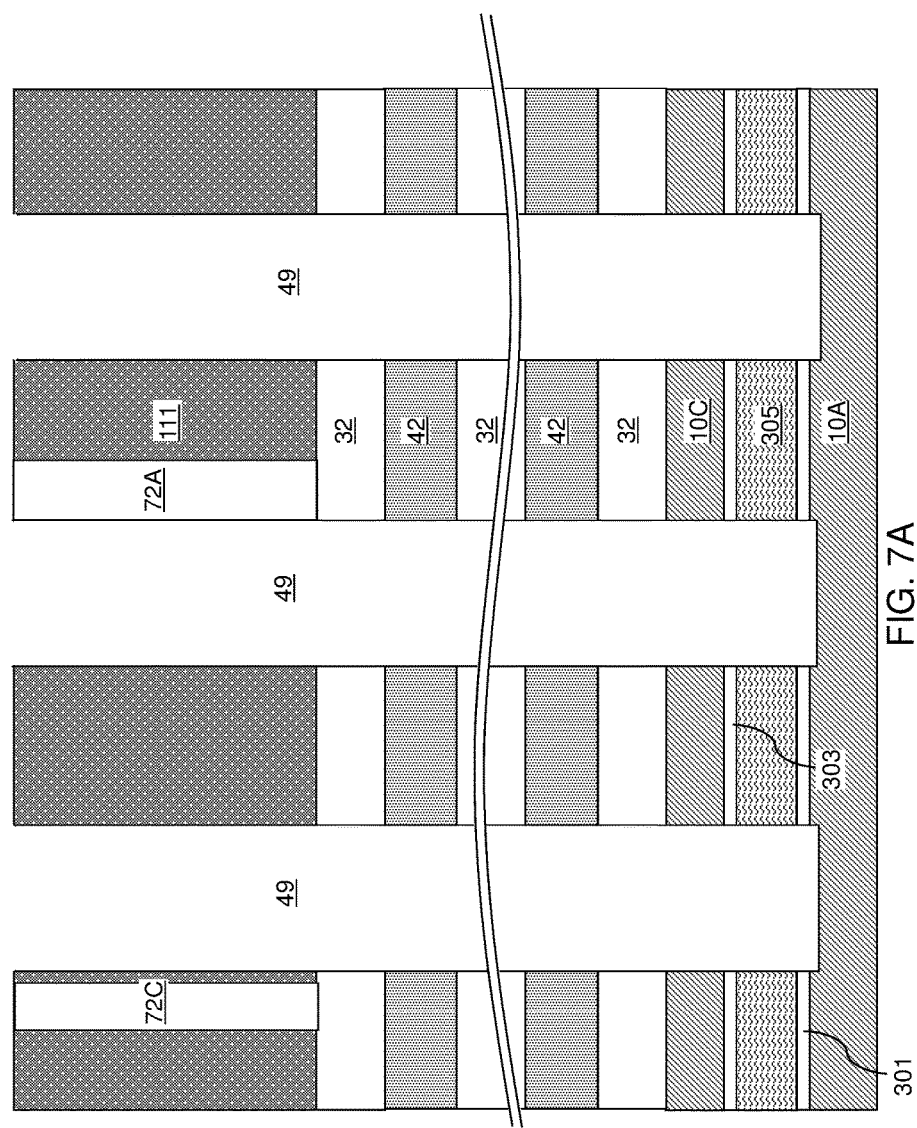

Referring to FIG. 7A, memory openings 49 are shown in a vertical cross-sectional view along a portion of the angled vertical plane A-A' in FIG. 6B. A subset of the memory openings 49 can have sidewalls that include vertical or substantially vertical surfaces of the alternating stack (32, 42) and vertical or substantially vertical surfaces of the drain select level isolation structures 72A. Another subset of the memory openings 49 can have sidewalls that do not include surfaces of the drain select level isolation structures 72A.

Figure 7B:
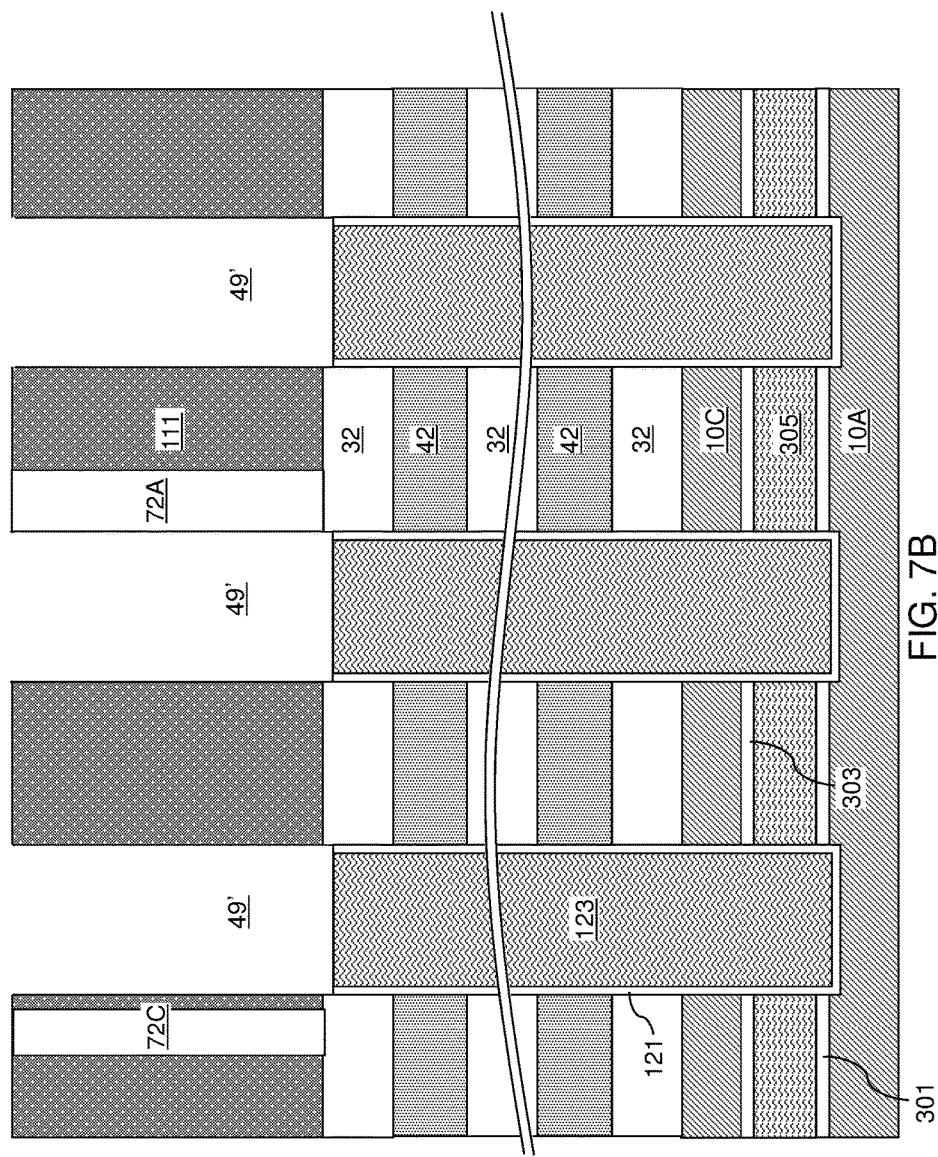

Referring to FIG. 7B, an optional sacrificial liner 121 may be optionally formed on the bottom surfaces and sidewalls of the memory openings 49 and the support openings 19. The sacrificial liner 121 can include a thin silicon oxide layer formed by a conformal deposition process. The thickness of the sacrificial liner 121 can be in a range from 1 nm to 5 nm, such as from 1.2 nm to 2 nm, although lesser and greater thicknesses can also be employed.

A first sacrificial fill material can be deposited in the memory openings 49 and the support openings 19. The first sacrificial fill material may be a sacrificial material that can be removed selective to the material of the sacrificial liner 121. For example, the first sacrificial fill material can include a semiconductor material (such as amorphous or polycrystalline silicon, a silicon-containing alloy, germanium, or a germanium-containing alloy), carbon, and/or an inorganic polymer such as a silicon-containing polymer).

The first sacrificial fill material can be removed from above the horizontal plane including the top surfaces of the insulating fill material layer (72A, 72B, 72C) and the sacrificial matrices 111 by a planarization process, which can employ a recess etch or chemical mechanical planarization (CMP). The first sacrificial fill material is subsequently vertically recessed such that remaining portions of the first sacrificial fill material has top surfaces near the horizontal plane including the interface between the alternating stack (32, 42) and the combination of the insulating fill material layer (72A, 72B, 72C) and the sacrificial matrices 111. Each remaining portion of the first sacrificial fill material constitutes a first sacrificial fill material portion 123. Physically exposed portions of the sacrificial liner 121 can be removed by an isotropic etch process such as a wet etch process employing hydrofluoric acid. A memory cavity 49' can be present above each first sacrificial fill material portion 123 in a respective memory opening 49. The top surfaces of the first sacrificial fill material portions 123 may be located at, below, or above the horizontal plane including the interface between the alternating stack (32, 42) and the combination of the insulating fill material layer (72A, 72B, 72C) and the sacrificial matrices 111. In one embodiment, top surfaces of the first sacrificial fill material portions 123 can be located above a horizontal plane including the top surface of a topmost spacer material layer such as a topmost sacrificial material layer 42.

Figure 7C:
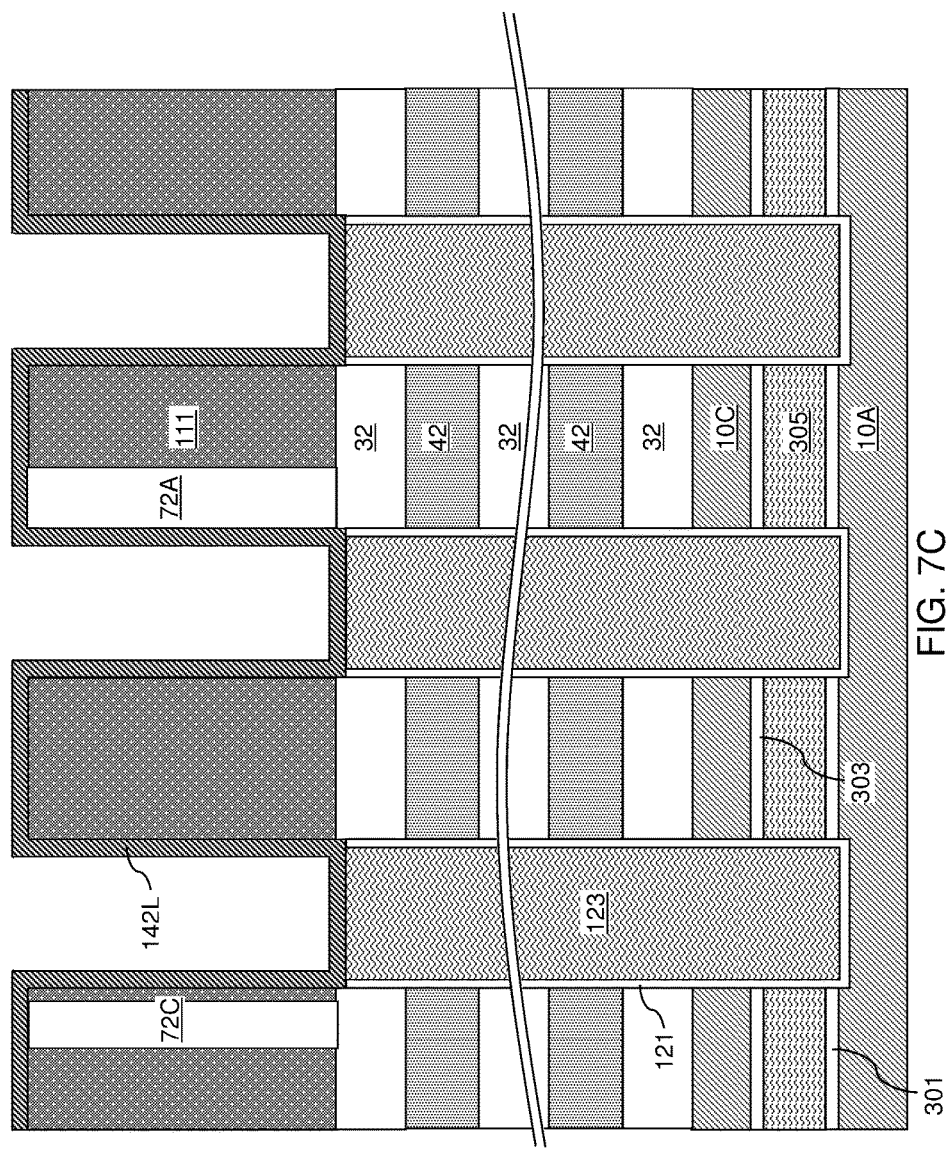

Referring to FIG. 7C, a conductive material layer 142L can be deposited by a conformal deposition method on physically exposed portions of sidewalls of the memory openings 49 and on top surfaces of the first sacrificial fill material portions 123. The conductive material layer 142L can include a metallic material, which can be an elemental metal, an intermetallic alloy, a metal silicide and/or, a conductive metallic nitride, or the conductive material layer 142L can included a heavily doped semiconductor material. Materials that can be employed for the conductive material layer 142L include, but are not limited to, titanium, tantalum, tungsten, cobalt, molybdenum, platinum, titanium nitride, tantalum nitride, tungsten nitride, heavily doped polysilicon, alloys and/or layer stacks thereof. In one embodiment, the material for the conductive material layer 142 can be selected to optimize the work function of drain select gate electrodes to be subsequently formed. The thickness of the conductive material layer 142L can be in a range from 1 nm to 20 nm, such as from 2 nm to 10 nm, although lesser and greater thicknesses can also be employed.

Figure 7D:
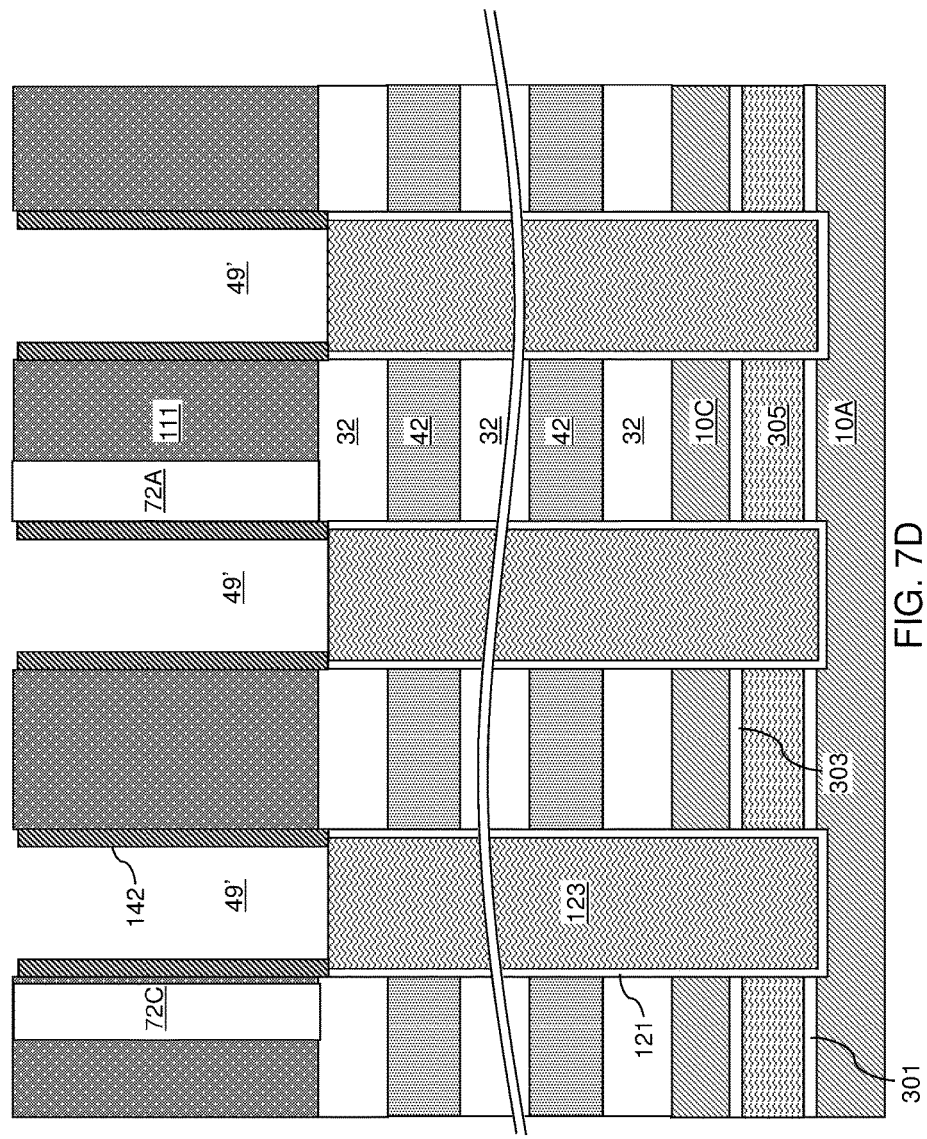

Referring to FIG. 7D, an anisotropic etch process is performed to remove horizontal portions of the conducive material layer 142L. Each remaining portion of the conductive material layer 142L in upper portions of the memory openings 49 constitutes a tubular conductive material portion that is subsequently employed as a portion of a respective drain select gate electrode. As such, each remaining portion of the conductive material layer 142L in upper portions of the memory openings 49 is herein referred to as a tubular electrode portion 142. A similar structure is formed within an upper portion of each support opening 19, and is referred to as a dummy tubular electrode portion 142.

Figure 7E:
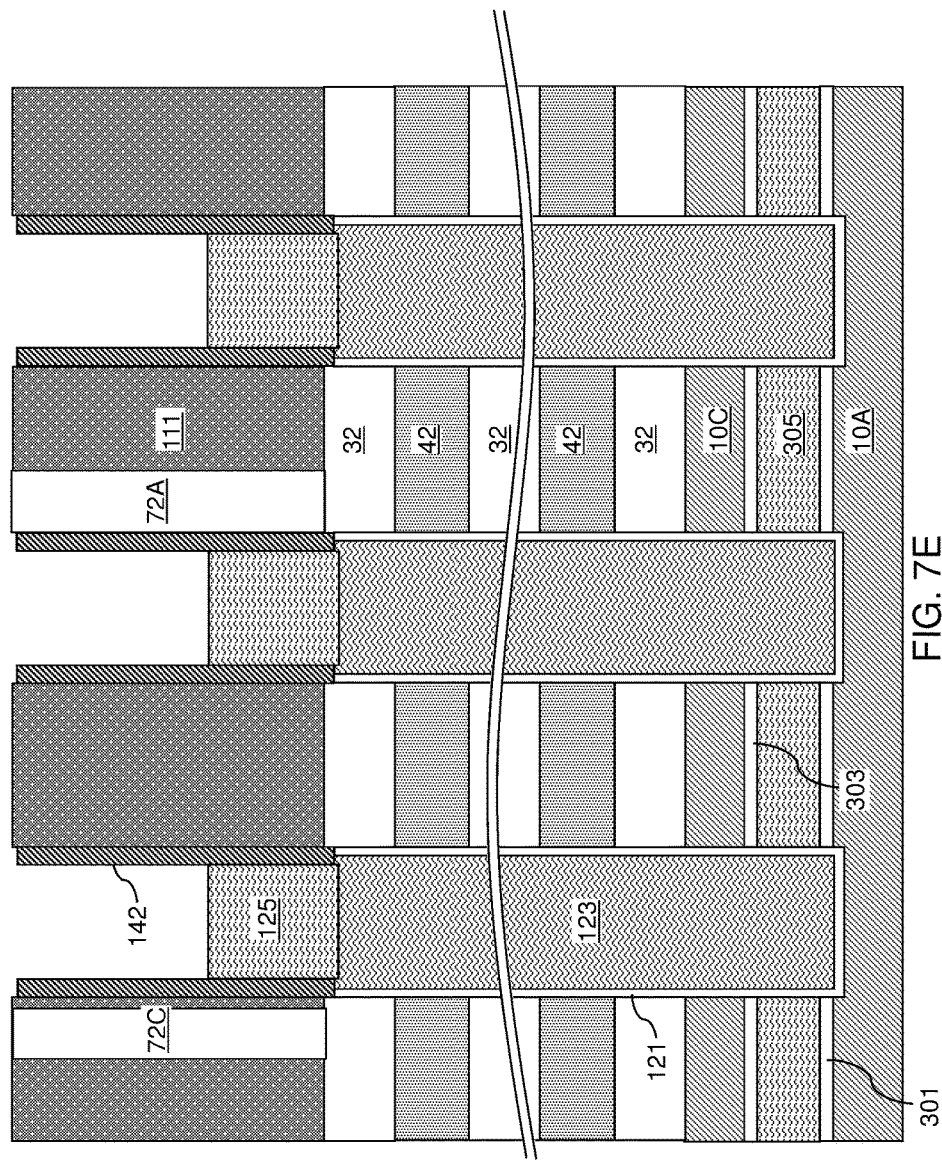

Referring to FIG. 7E, a second sacrificial fill material can be deposited in unfilled volumes of the memory openings 49 and the support openings 19. The second sacrificial fill material may be any material that can be employed for the first sacrificial fill material. For example, the second sacrificial fill material can include a semiconductor material (such as amorphous or polycrystalline silicon, a silicon-containing alloy, germanium, or a germanium-containing alloy, as long as it is different from the material of the tubular electrode portion 142), carbon, and/or an inorganic polymer such as a silicon-containing polymer).

The second sacrificial fill material can be removed from above the horizontal plane including the top surfaces of the insulating fill material layer (72A, 72B, 72C) and the sacrificial matrices 111 by a planarization process, which can employ a recess etch or chemical mechanical planarization (CMP). The second sacrificial fill material is subsequently vertically recessed such that the recessed portions of the second sacrificial fill material is located at, or near, a target height for an upper end of each drain select gate electrode to be subsequently formed. Each remaining portion of the second sacrificial fill material constitutes a second sacrificial fill material portion 125. The vertical distance between the horizontal plane including the top surfaces of the second sacrificial fill material portions 125 and the horizontal plane including the interface between the alternating stack (32, 42) and the combination of the insulating fill material layer (72A, 72B, 72C) and the sacrificial matrices 111 can be in a range from 20 nm to 200 nm, such as from 40 nm to 100 nm, although lesser and greater vertical distances can also be employed. The top surfaces of the second sacrificial fill material portions 125 are located below the horizontal plane including a top surface of the sacrificial matrices 111. A memory cavity can be present above each second sacrificial fill material portion 125 in a respective memory opening 49.

Referring to FIG. 7F, a top portion of each of the tubular electrode portions 142 can be removed by etching portions of the tubular electrode portions 142 that are not covered by the second sacrificial fill material portions 125. For example, the top portions of the tubular electrode portions 142 that protrude above the top surfaces of the second sacrificial fill material portions 125 can be removed by an isotropic etch process. The isotropic etch process can etch the material of the tubular electrode portions 142 selective to the materials of the insulating fill material layer (72A, 72B, 72C), the sacrificial matrices 111, and the second sacrificial fill material portions 125. For example, a wet etch process that etches the metallic material of the tubular electrode portions 142 selective to the dielectric material(s) and/or the semiconductor material(s) of the insulating fill material layer (72A, 72B, 72C), the sacrificial matrices 111, and the second sacrificial fill material portions 125 can be employed. The top surfaces of the tubular electrode portions 142 can be approximately at the level of the top surfaces of the second sacrificial fill material portion 125 after trimming the tubular electrode portions 142.

Figure 7G:
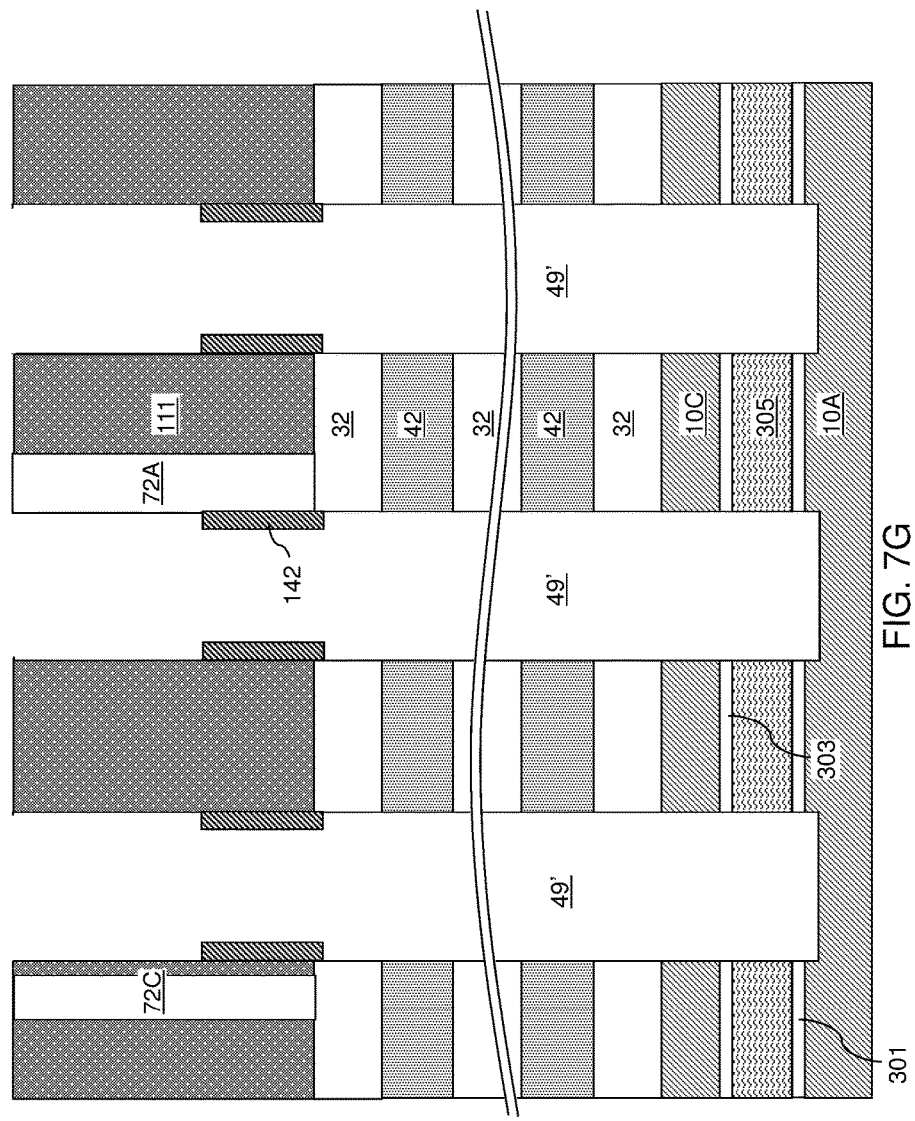

Referring to FIG. 7G, the second and first sacrificial fill material portions are removed selective to the alternating stack (32, 42) and the tubular electrode portions 142. For example, the second and first sacrificial fill material portions (125, 123) can be removed selective to the insulating fill material layer (72A, 72B, 72C), the sacrificial matrices 111, and the sacrificial spacers 121 (if present). An isotropic etch process such as a wet etch process can be employed to remove the second and first sacrificial fill material portions (125, 123). For example, if the second and first sacrificial fill material portions (125, 123) include amorphous silicon, polysilicon, or a silicon-germanium alloy, a wet etch employing a KOH solution or a trimethyl(2-hydroxyethyl) ammonium hydroxide (TMY) solution may be employed to remove the second and first sacrificial fill material portions (125, 123) selective to the materials of the insulating fill material layer (72A, 72B, 72C), the sacrificial matrices 111, the tubular electrode portions 142, and the sacrificial spacers 121. Subsequently, the sacrificial spacers 121 can be removed by an isotropic etch process such as a wet etch employing dilute hydrofluoric acid. A sidewall of the sacrificial source material layer 303 and a recessed top surface of the lower source semiconductor layer 10A can be physically exposed at the bottom of each memory opening 49.

Each of the tubular electrode portions 142 can be formed on a sidewall of a respective one of the memory openings 49. Bottom surfaces of the tubular electrode portions 142 can be formed above a horizontal plane including a top surface of a topmost spacer material layer (such as the topmost sacrificial material layer 42) within the alternating stack (32, 42). Top surfaces of the tubular electrode portions 142 can be formed below a horizontal plane including top surfaces of the sacrificial matrices 111. A subset of the tubular electrode portions 142 can be formed on the concave vertical sidewall portions of the drain select level isolation structures 72A. The tubular electrode portions 142 can be formed with a uniform lateral thickness.

Figure 7H:
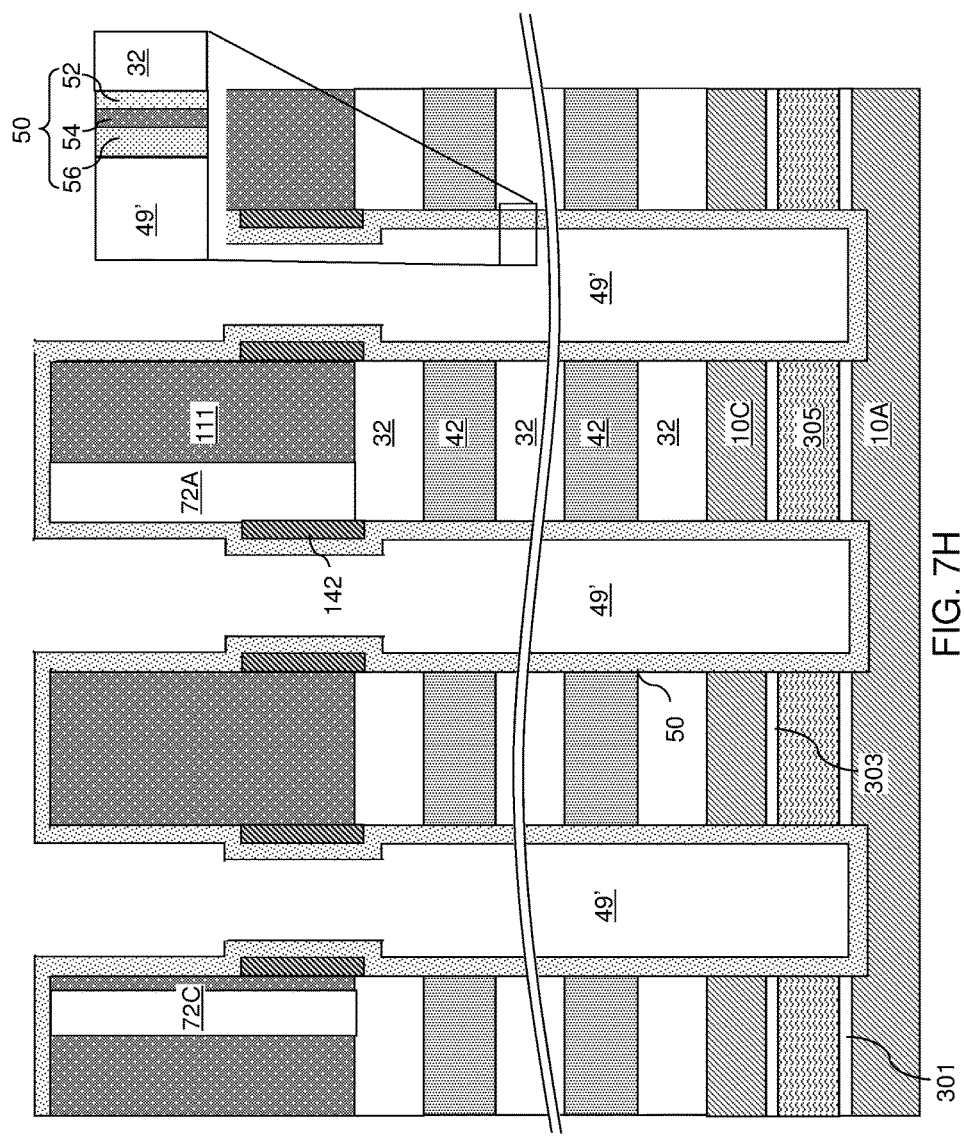

Referring to FIG. 7H, a memory film 50 can be sequentially deposited in the memory openings 49. Each memory film 50 can include a stack of layers including a blocking dielectric layer 52, a charge storage layer 54, and a tunneling dielectric layer 56. The blocking dielectric layer 52 can be formed on the inner sidewalls of the tubular electrode portions 142.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer. As used herein, a first surface and a second surface are "vertically coincident" if the second surface overlies or underlies the first surface and if there exists a vertical plane including the first surface and the second surface.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 7I:
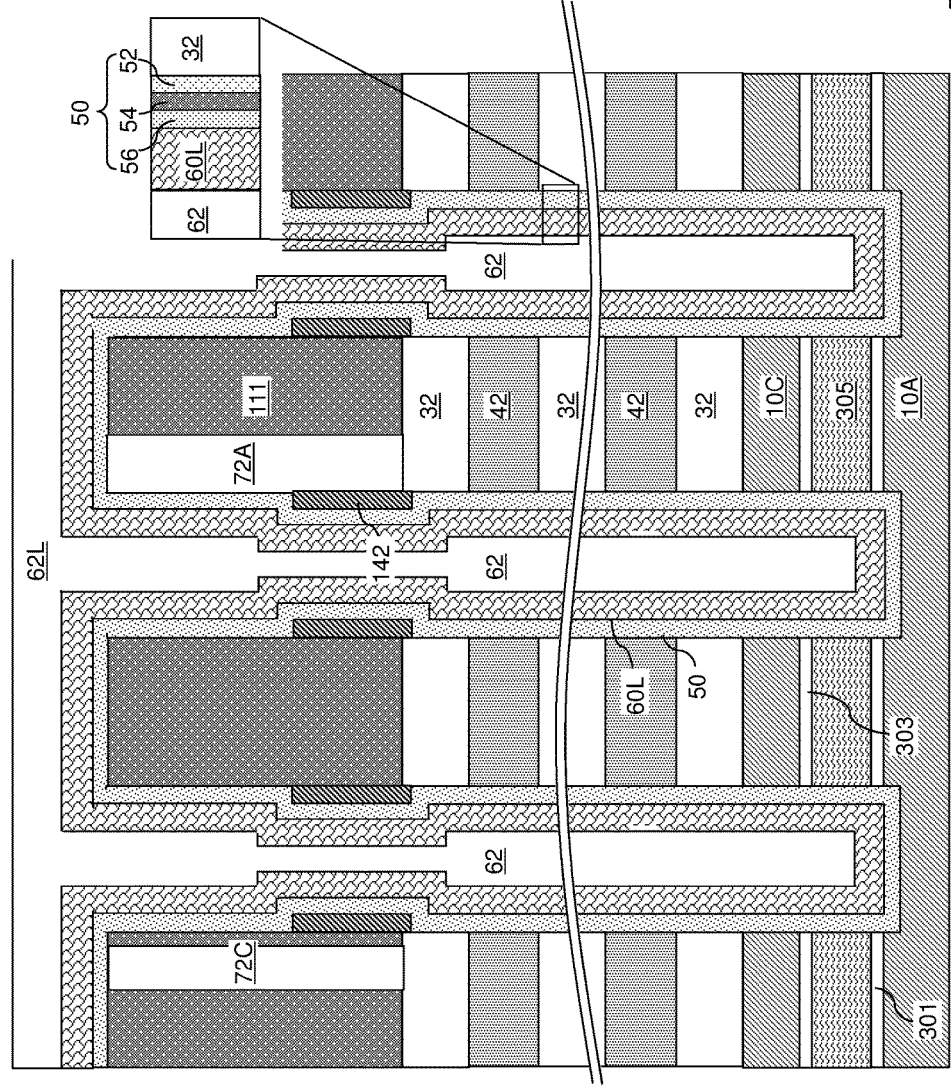

Referring to FIG. 7I, a semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed.

In one embodiment, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 7J:
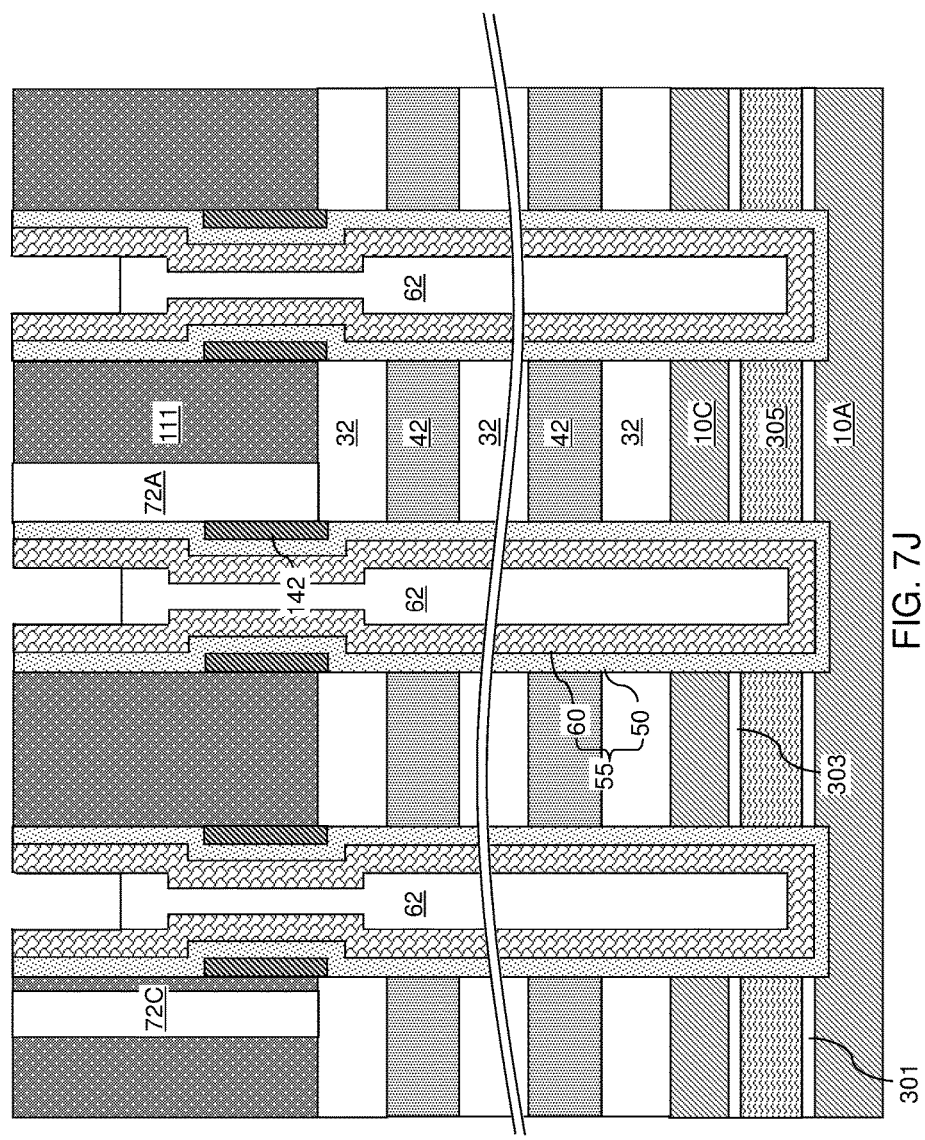

Referring to FIG. 7J, the horizontal portion of the dielectric core layer 62L, the semiconductor channel layer 60L, and the memory film 50 can be removed, for example, by a recess etch from above the top surface of the alternating stack (32, 42). The remaining portions of the dielectric core layer 62L can be recessed below the horizontal plane including the top surfaces of the insulating fill material layer (72A, 72B, 72C) and the sacrificial matrices 111 to form vertical recesses. Each remaining portion of the dielectric core layer 62L constitutes a dielectric core 62. The top surfaces of the dielectric core 62 can be between the horizontal plane including the top surfaces of the combination of the insulating fill material layer (72A, 72B, 72C) and the sacrificial matrices 111 and the horizontal plane including the top surfaces of the tubular electrode portions 142.

Each remaining portion of the semiconductor channel layer 60L can be located entirety within a memory opening 49 or entirely within a support opening 19, and constitutes a vertical semiconductor channel 60. Each remaining portion of the memory film 50 can be located entirety within a memory opening 49 or entirely within a support opening 19. Each vertical semiconductor channel 60 is a structure through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each combination of a vertical semiconductor channel 60 and a memory film 50 within a memory opening 49 constitutes a memory stack structure 55.

Figure 7K:
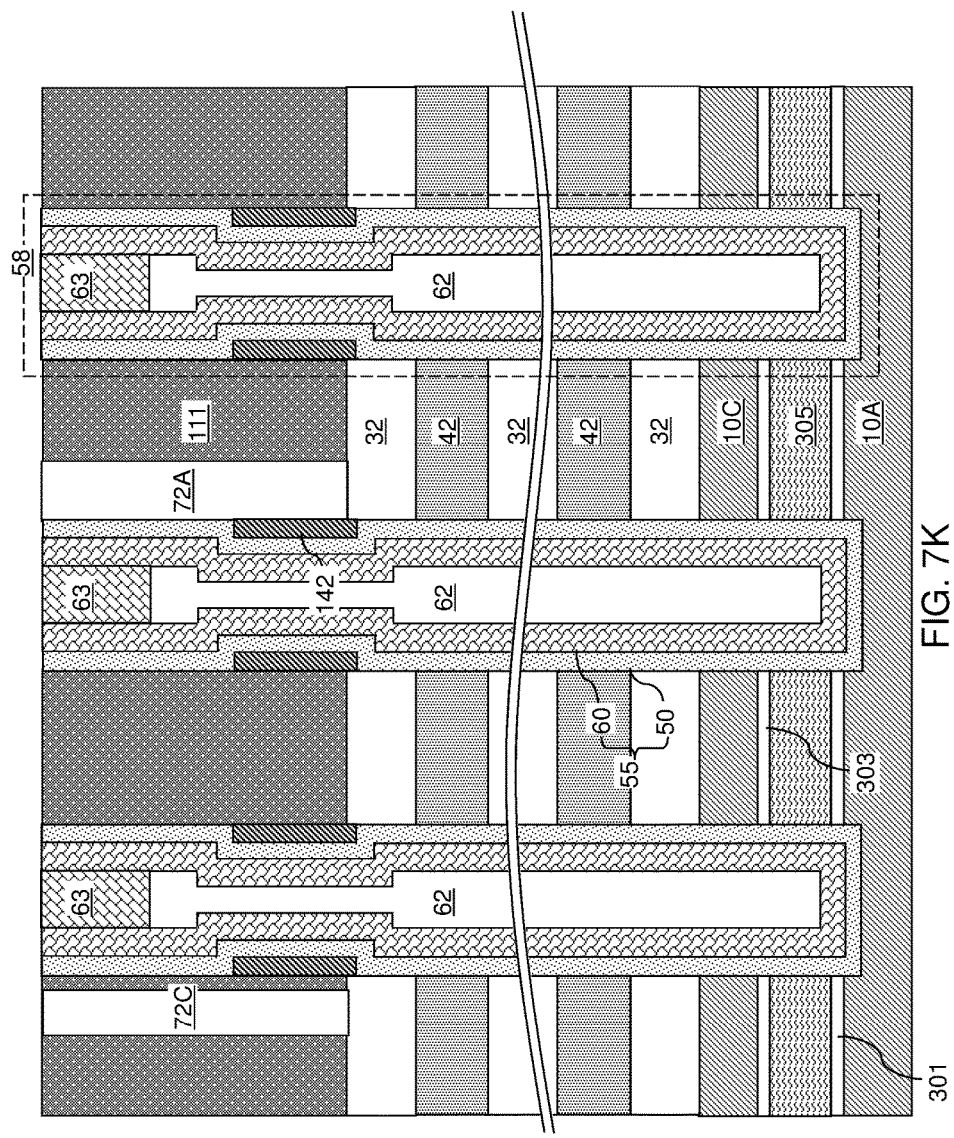

Referring to FIG. 7K, drain regions 63 can be formed in each vertical recess overlying a respective dielectric core 62. A doped semiconductor material can be deposited within each vertical recess above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the alternating stack (32, 42), for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structures 55 can be formed within each memory opening 49 and on a respective one of the tubular electrode portions 142. The memory stack structure 55 is a combination of a vertical semiconductor channel 60, a tunneling dielectric layer 56, a plurality of memory elements as embodied as portions of the charge storage layer 54, and an optional blocking dielectric layer 52. Each memory film 50 can be formed on a respective one of the tubular electrode portions 142. In one embodiment, the blocking dielectric layer 51 can be formed on a respective one of the tubular electrode portions 142 and a respective sidewall portion of the insulating fill material layer (72A, 72B, 72C). Each combination of a memory stack structure 55, a dielectric core 62, and a drain region 63 within a memory opening 49 is herein referred to as a memory opening fill structure 58. Each combination of a memory film 50, a vertical semiconductor channel 60, a dielectric core 62, and a drain region 63 within each support opening 19 fills the respective support openings 19, and constitutes a support pillar structure.

Figure 8B:
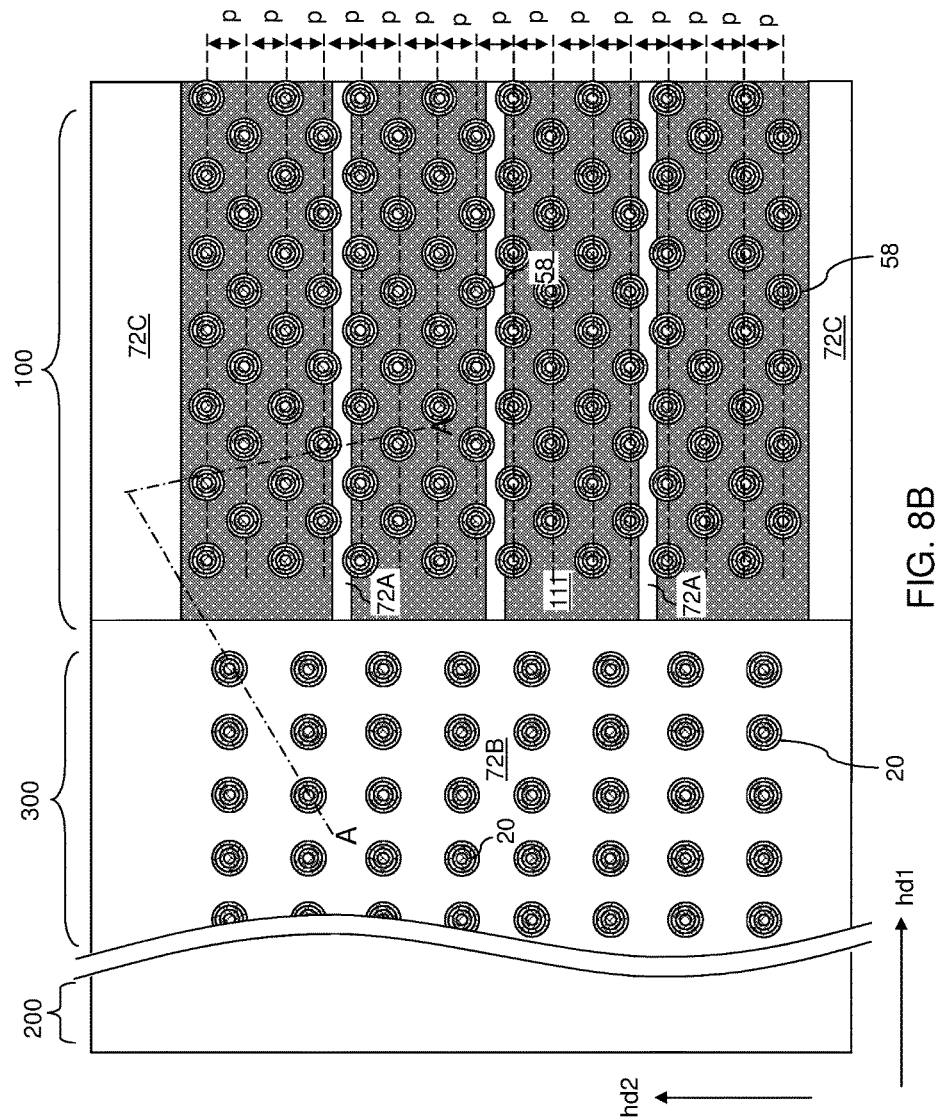
FIG. 8B is a top-down view of the exemplary structure of FIG. 8A. The vertical plane A-A' is the plane of the cross-section for FIG. 8A.
Figure 8C:
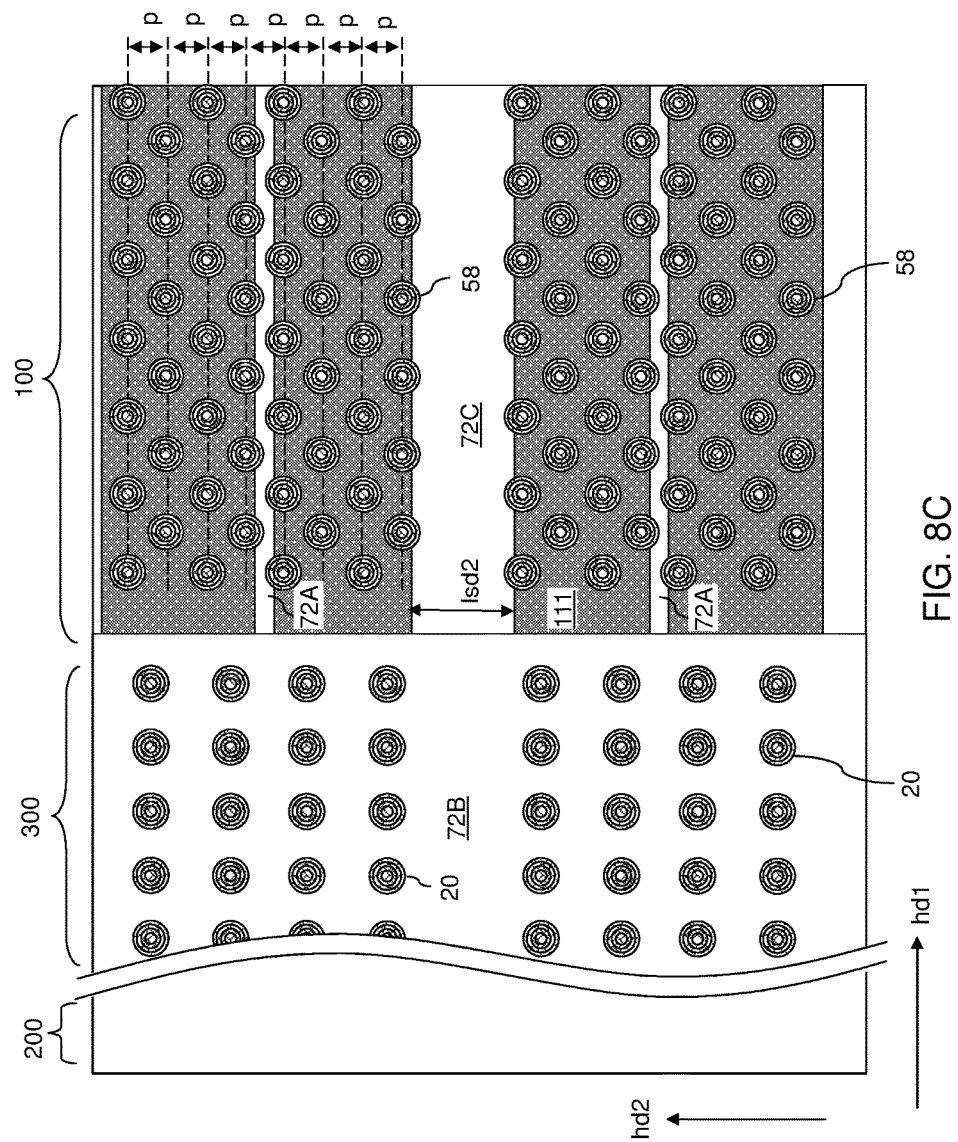
FIG. 8C is a top-down view of the alternative embodiment of the exemplary structure at the processing steps of FIGS. 8A and 8B.

Referring to FIGS. 8A-8C, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 6A and 6B. An instance of the support pillar structure 20 can be formed within each support opening 19 of the structure of FIGS. 6A and 6B.

Each memory stack structure 55 includes a vertical semiconductor channel 60 and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 9A:
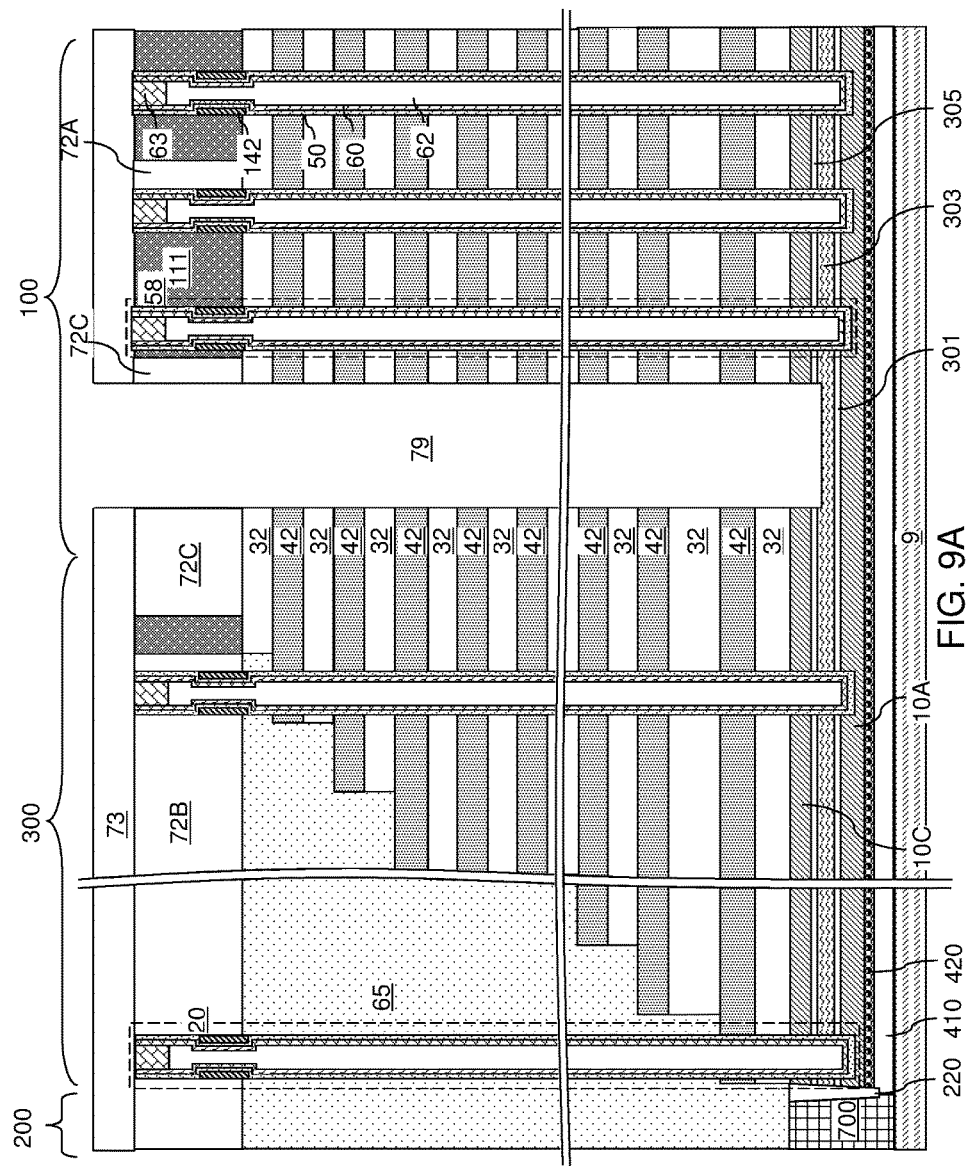
FIG. 9A is a schematic vertical cross-sectional view of the exemplary structure after formation of backside trenches according to an embodiment of the present disclosure.
Figure 9C:
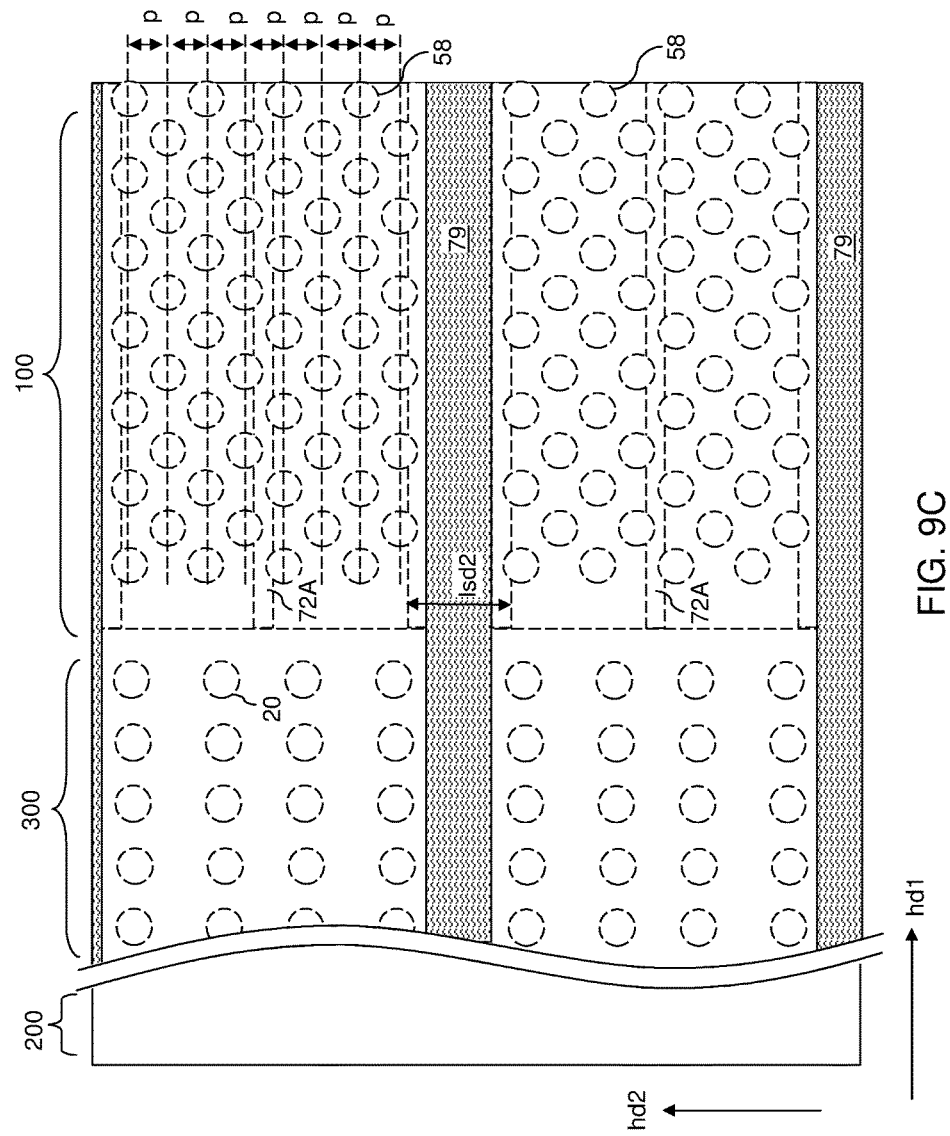
FIG. 9C is a top-down view of an alternative embodiment of the exemplary structure at the processing steps of FIGS. 9A and 9B.

Referring to FIGS. 9A-9C, a sacrificial cover material layer 73 can be formed over the insulating fill material layer (72A, 72B, 72C) and the sacrificial matrices 111. The sacrificial cover material layer 73 can include a dielectric material, a conductive material (such as a metallic material), or a semiconductor material (such as polysilicon or amorphous silicon) that is different from the materials of the sacrificial material layers 42 and the sacrificial matrices 111. For example, the sacrificial cover material layer 73 can include silicon oxide. The sacrificial cover material layer 73 can have a thickness in a range from 20 nm to 300 nm, such as from 60 nm to 150 nm, although lesser and greater thicknesses can also be employed.

A photoresist layer (not shown) can be applied over the sacrificial cover material layer 73, and is lithographically patterned to form openings in areas between groups of memory stack structures 55. In one embodiment, the openings can overlie the string isolation structures 72C that do not enclose any memory opening fill structure 58. The pattern in the photoresist layer can be transferred through the sacrificial cover material layer 73, insulating fill material layer (72A, 72B, 72C) and the sacrificial matrices 111, the alternating stack (32, 42) and/or the retro-stepped dielectric material portion 65 employing an anisotropic etch to form backside trenches 79, which vertically extend from the top surface of the sacrificial cover material layer 73 at least to the top surface of the lower source semiconductor layer 10A, and laterally extend through the memory array region 100 and the contact region 300. Each backside trench 79 can be formed through a respective one of the string isolation structures 72C having a width along the second horizontal direction hd2 of the second lateral separation distance lsd2. Each divided portion of the string isolation structure 72C has a width lesser than the second lateral separation distance lsd2, and includes a straight sidewall (facing the backside trench 79) that laterally extends along the first horizontal direction hd1 and may include a tapered sidewall (away from the backside trench 79) that laterally extends along the first horizontal direction hd1.

In one embodiment, the backside trenches 79 can laterally extend along the first horizontal direction hd1 and can be laterally spaced apart among one another along the second horizontal direction hd2. The memory stack structures 55 can be arranged in rows that extend along the first horizontal direction hd1. The drain select level isolation structures 72A can laterally extend along the first horizontal direction hd1. Each backside trench 79 can have a uniform width that is invariant along the lengthwise direction (i.e., along the first horizontal direction hd1). Multiple rows of memory stack structures 55 can be located between a neighboring pair of a backside trench 79 and a drain select level isolation structure 72A, or between a neighboring pair of drain select level isolation structures 72A. In one embodiment, the backside trenches 79 can include a source contact opening in which a source contact via structure can be subsequently formed. The photoresist layer can be removed, for example, by ashing. An optional sidewall spacer, such as a silicon nitride sidewall spacer, may be formed on the sidewalls of the backside trench 79 by conformal deposition of a spacer layer (e.g., a silicon nitride layer) and anisotropic etching of horizontal portions of the spacer layer.

Referring to FIG. 10A, the sacrificial source material layer 303 can be removed selective to the alternating stack (32, 42), the insulating fill material layer (72A, 72B, 72C), the sacrificial cover material layer (73), the lower source semiconductor layer 10A, the upper source semiconductor layer 10C, and the sacrificial source liners (301, 305). For example, if the lower source semiconductor layer 10A and the upper source semiconductor layer 10C include boron-doped amorphous silicon or boron-doped polysilicon, and if the sacrificial source material layer 303 includes undoped amorphous silicon or undoped polysilicon, a wet etch employing a trimethyl(2-hydroxyethyl)ammonium hydroxide (TMY) solution may be employed to remove the sacrificial source material layer 303 selective to the alternating stack (32, 42), the insulating fill material layer (72A, 72B, 72C), the sacrificial cover material layer (73), the lower source semiconductor layer 10A, the upper source semiconductor layer 10C, and the sacrificial source liners (301, 305). A source cavity 313 is formed in the volume from which the sacrificial source material layer 303 is removed. Sidewalls of the memory opening fill structures 58 and the support pillar structures 20 are physically exposed to the source cavity 313.

Referring to FIG. 10B, a sequence of isotropic etch processes can be performed to sequentially remove the various dielectric materials of the memory films 50 from outside to inside. Portions of the memory films 50 located at the level of the source cavity 313 can be removed to physically expose outer sidewalls of the vertical semiconductor channels 60 in the memory opening fill structures 58 and the support pillar structures 20. The optional lower sacrificial source liner 301 and the optional upper sacrificial source liner 305 can be collaterally removed during the sequence of isotropic etch processes to physically expose the bottom surface of the upper source semiconductor layer 10C and the top surface of the lower source semiconductor layer 10A.

Figure 10C:
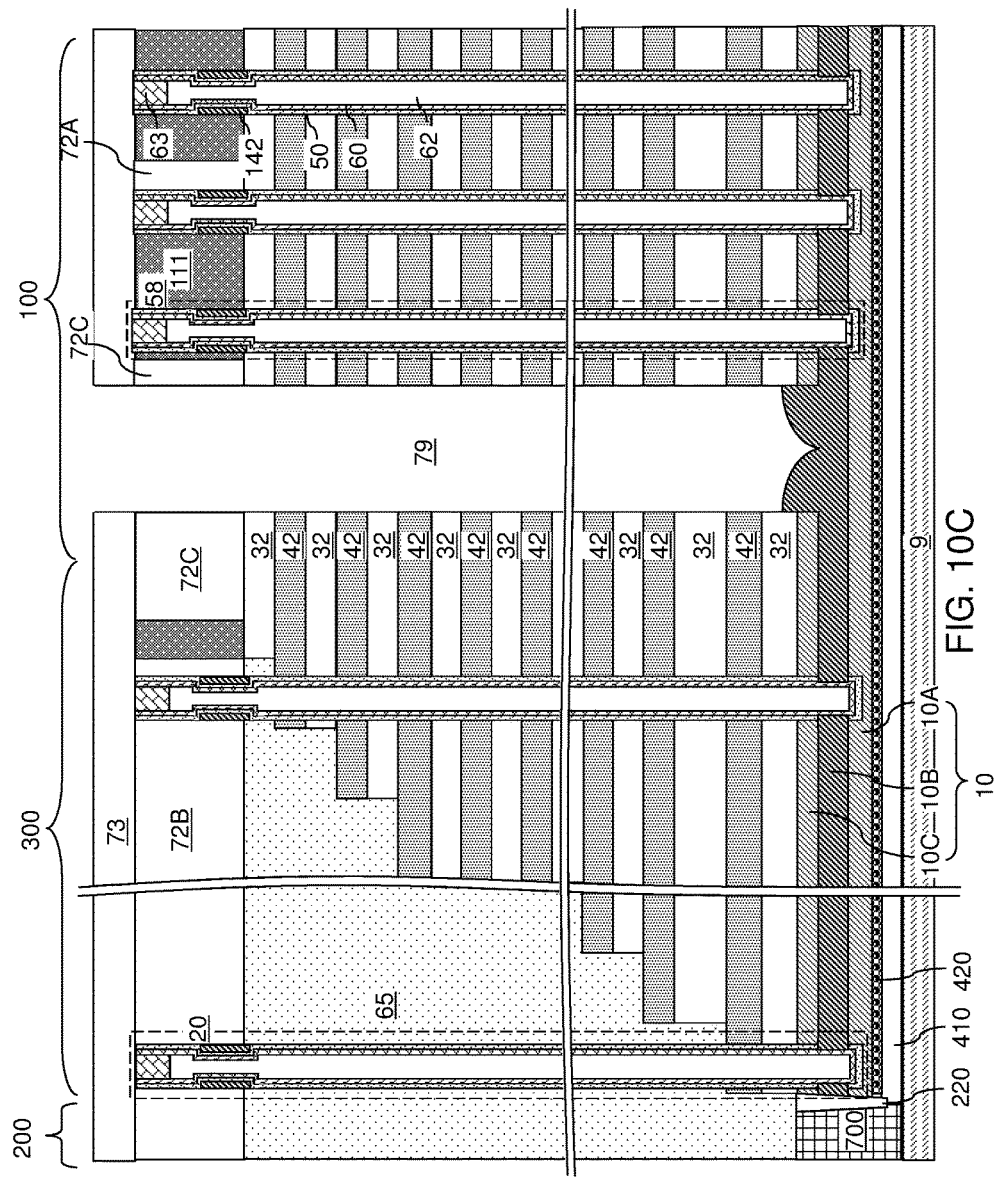

Referring to FIG. 10C, a selective semiconductor deposition process can be performed to grow a doped semiconductor material having a doping of the first conductivity type (e.g., same conductivity type as layers 10A and 10C, such as p-type) from the physically exposed bottom surface of the upper source semiconductor layer 10C, the physically exposed top surface of the lower source semiconductor layer 10A, and the physically exposed sidewalls of the vertical semiconductor channels 60 at the level of the source cavity 313. Generally, a semiconductor material grows with no incubation time or after a very short incubation time from semiconductor surfaces, but requires a significant incubation time (typically on the order of 10 seconds) from dielectric surfaces. By flowing a small amount of etchant concurrently with, or alternately with, flowing of a reactant gas, the doped semiconductor material can be grown only from physically exposed semiconductor surfaces. Doped semiconductor material portions that grow from the various physically exposed semiconductor surfaces merge to form a continuous doped semiconductor material portion, which is herein referred to as a middle source semiconductor layer 10B. The lower source semiconductor layer 10A, the middle source semiconductor layer 10B, and the upper source semiconductor layer 10C collectively constitute a source semiconductor layer 10. The stack of the optional source metal layer 420 and the source semiconductor layer 10 collectively constitute a buried source layer (420, 10). If the optional sidewall spacer (e.g., silicon nitride spacer) is formed on the sidewalls of the backside trench 79, then this spacer can be removed by selective etching at this time. Furthermore, the top part of the middle source semiconductor layer 10B exposed in the backside trench 79 may optionally be oxidized by a selective dry or wet oxidation to form a protective oxide (e.g., silicon oxide) on the top part of the middle source semiconductor layer 10B exposed in the backside trench 79.

Figure 10D:
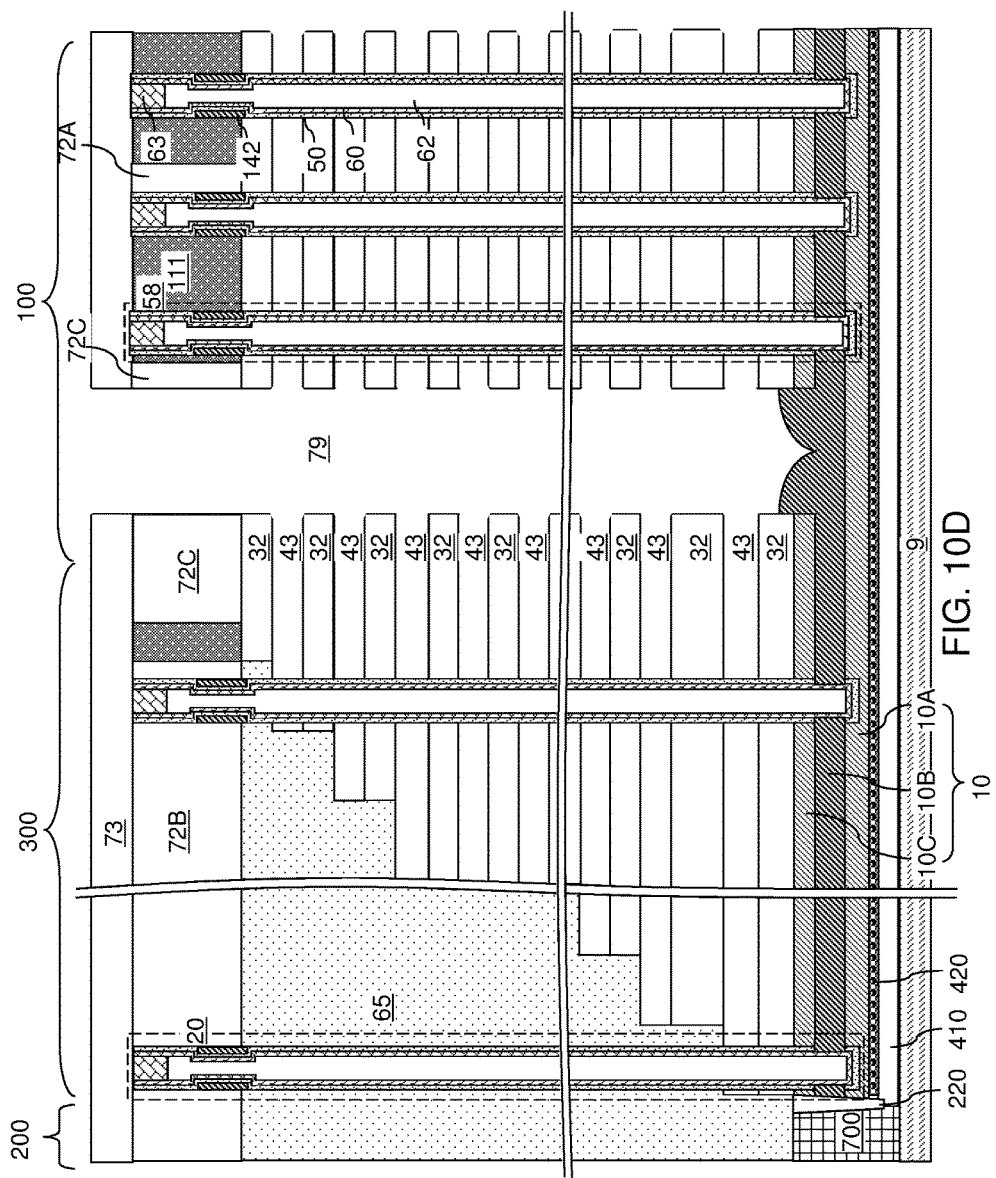

Referring to FIGS. 10D and 11A, an isotropic etchant that selectively etches the second material of the sacrificial material layers 42 with respect to the first material of the insulating layers 32 can be introduced into the backside trenches 79, for example, employing an etch process. FIG. 11A illustrates a region of the exemplary structure of FIG. 10. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the middle source semiconductor layer 10B (or the protective oxide on its top surface), and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

In one embodiment, the sacrificial matrices 111 can include a material that is etched by the isotropic etchant. For example, the sacrificial material layers 42 and the sacrificial matrices 111 can include silicon nitride. In this case, each backside trench 79 can extend through a respective one of the string isolation structures 72C having the width of the second lateral separation distance lsd2. Each remaining portion of the string isolation structures 72C protects the sacrificial matrices 111 from exposure to the isotropic etchant.

In one embodiment, the etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate semiconductor layer 9 of a substrate. In this case, each backside recess 43 can define a space for receiving a respective word line of the array of monolithic three-dimensional NAND strings.

Each of the plurality of backside recesses 43 can extend substantially parallel to the top surface of the substrate. A backside recess 43 can be vertically bounded by a top surface of an underlying insulating layer 32 and a bottom surface of an overlying insulating layer 32. In one embodiment, each backside recess 43 can have a uniform height throughout.

Referring to FIG. 11B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the middle source semiconductor layer 10B (or the protective oxide on its top surface). A backside cavity 79' is present within the portion of each backside trench 79 that is not filled with the backside blocking dielectric layer 44.

Referring to FIG. 11C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Referring to FIG. 11D, a metal fill material is deposited in the plurality of backside recesses 43, on the sidewalls of the at least one the backside trench 79, and over the top surface of the sacrificial cover material layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the sacrificial cover material layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the sacrificial cover material layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L.

Figure 12:
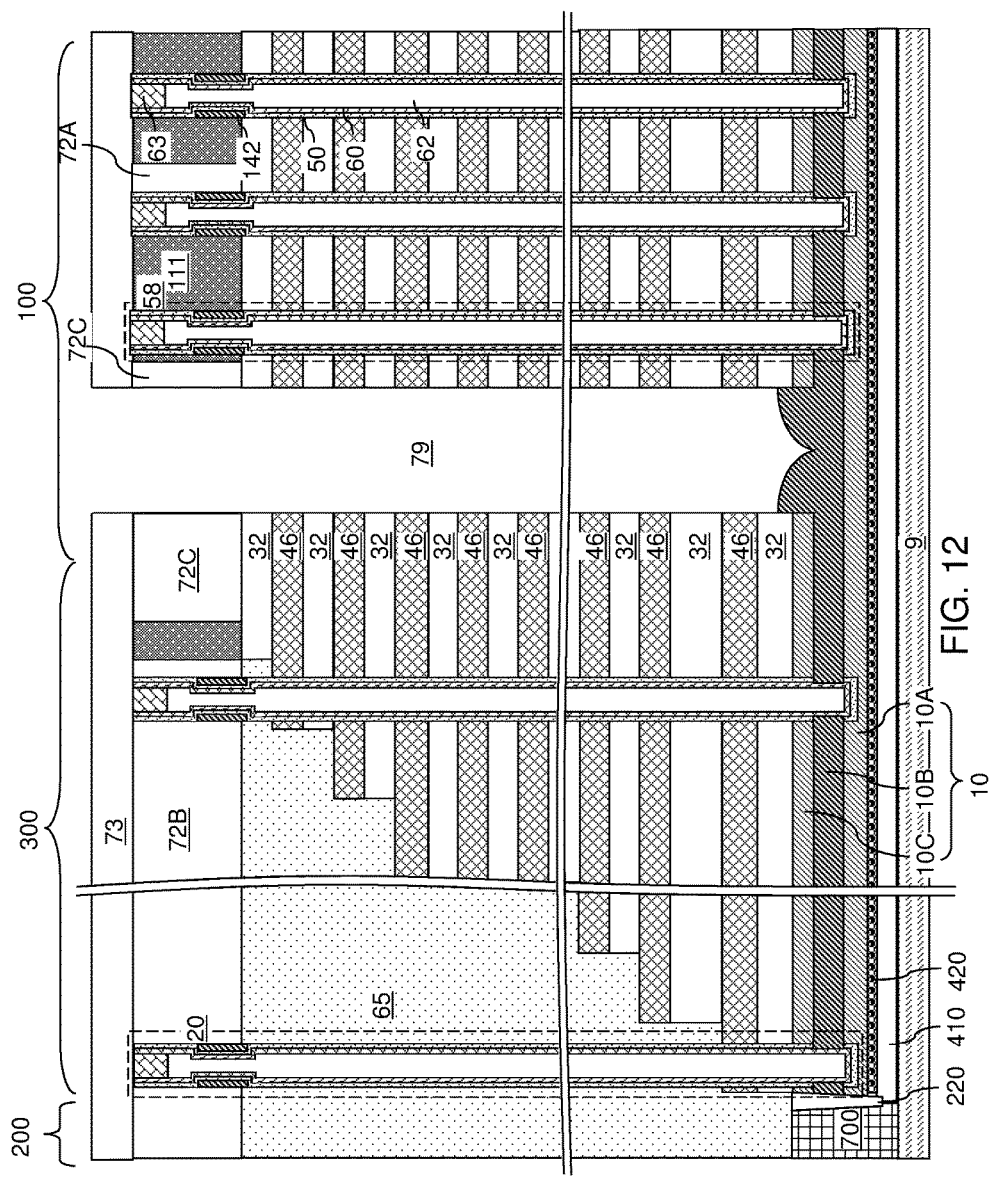
FIG. 12 is a schematic vertical cross-sectional view of the exemplary structure after removal of a deposited conductive material from within the backside trench according to an embodiment of the present disclosure.

Referring to FIG. 12, the deposited metallic material of the continuous electrically conductive material layer 46L is etched back from the sidewalls of each backside trench 79 and from above the sacrificial cover material layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. A backside cavity is present within each backside trench 79.

Figure 13:
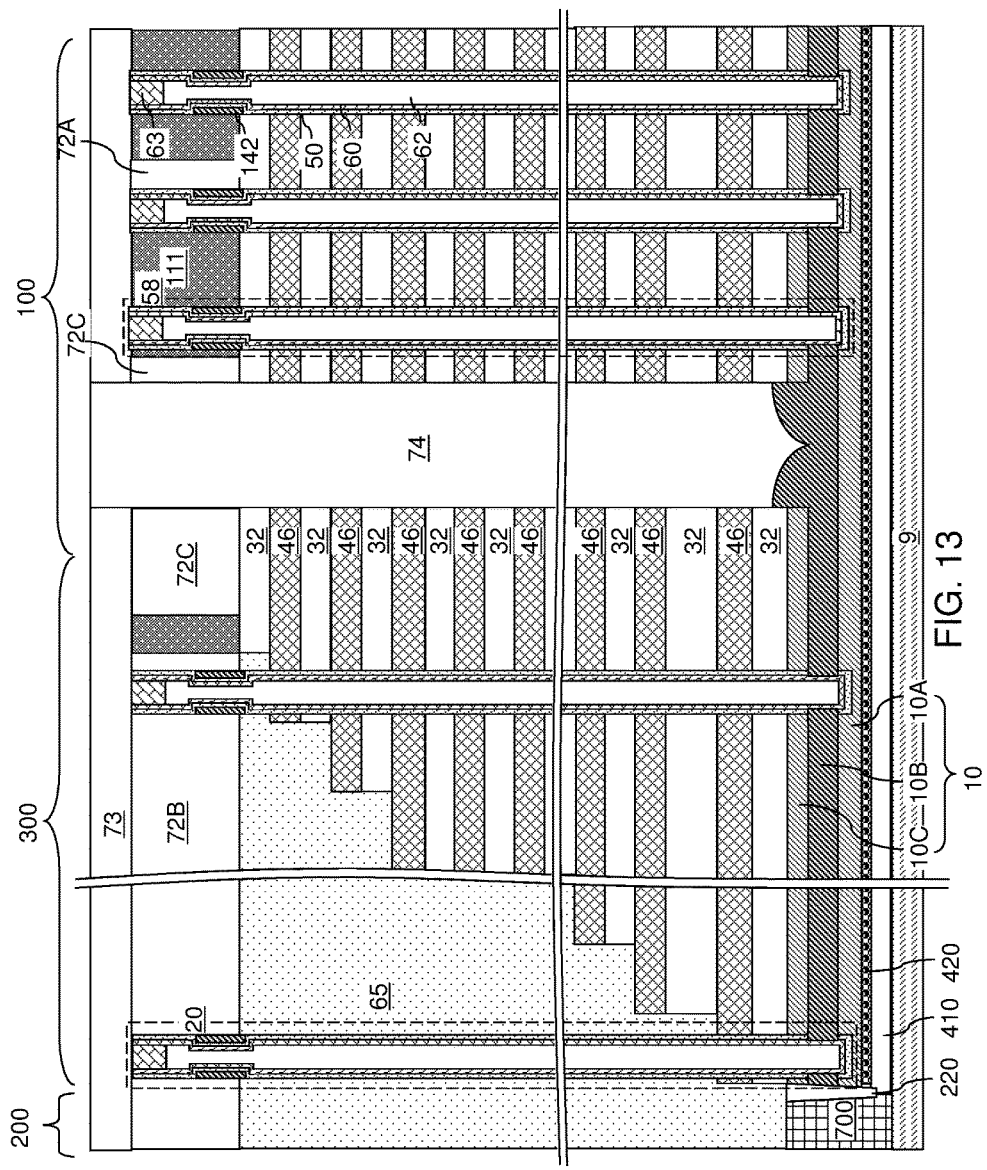
FIG. 13 is a schematic vertical cross-sectional view of the exemplary structure after formation of an insulating spacer in each backside trench and formation of source regions according to an embodiment of the present disclosure.

Referring to FIG. 13, an insulating material layer can be formed in the backside trenches 79 and over the sacrificial cover material layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

Excess portions of the insulating material layer can be removed from above the horizontal plane including the the top surface of the sacrificial cover material layer 73. Each remaining portion of the insulating material layer that fills a respective backside trench constitutes an insulating wall structure 74.

Figure 14A:
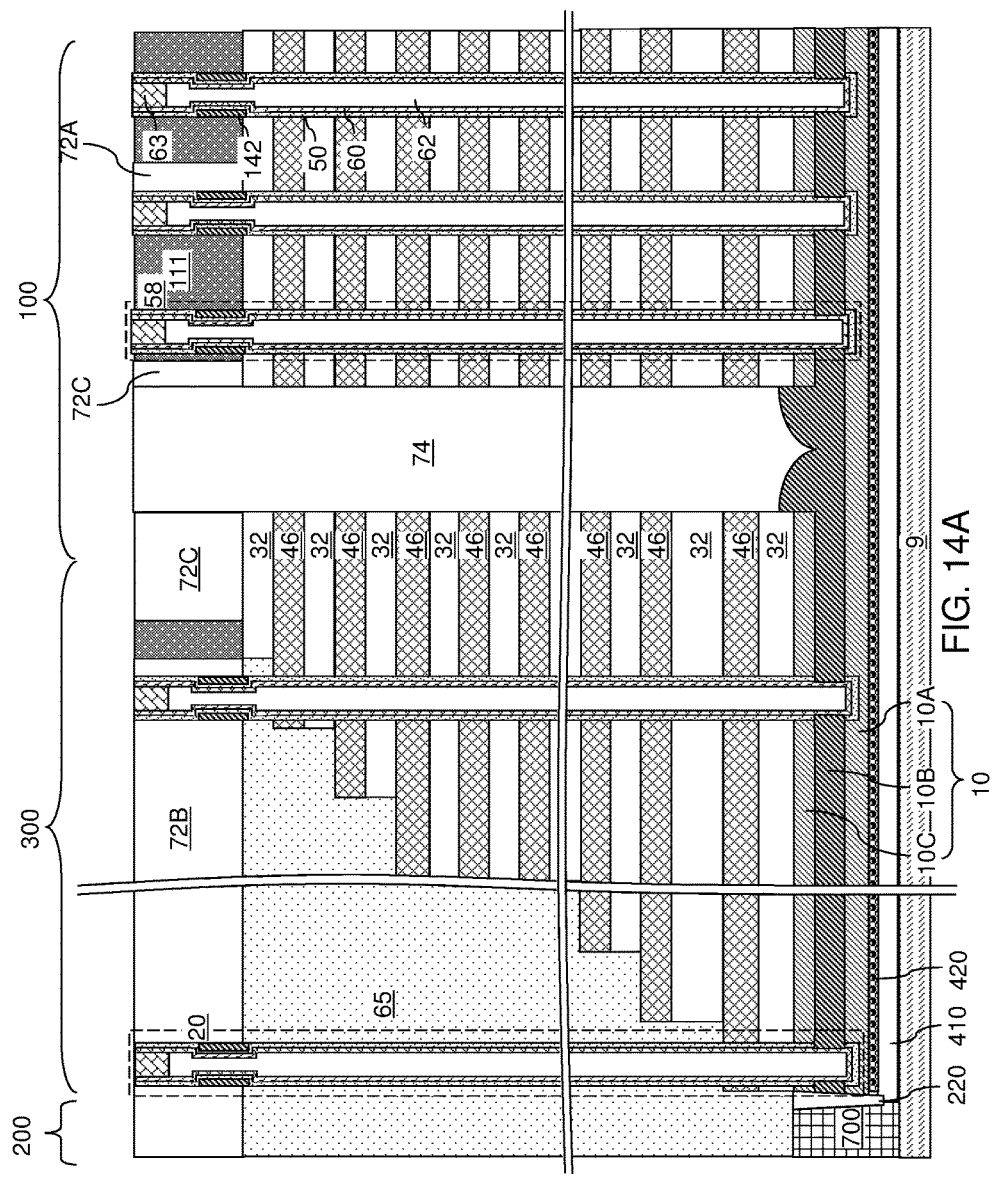
FIG. 14A is a schematic vertical cross-sectional view of the exemplary structure after formation of an insulating wall structure within each backside trench according to an embodiment of the present disclosure.
Figure 14B:
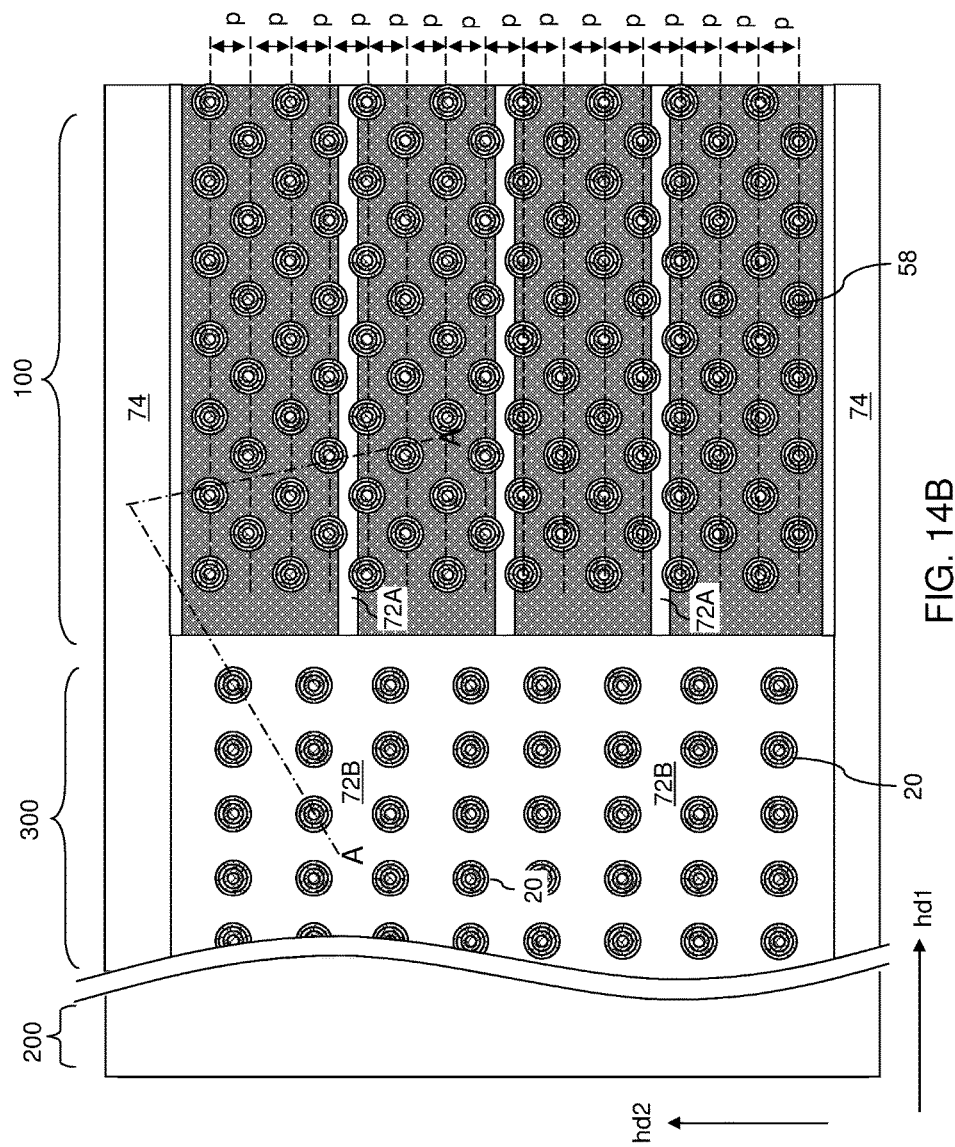
FIG. 14B is a magnified view of a region of the exemplary structure of FIG. 14A.
Figure 14C:
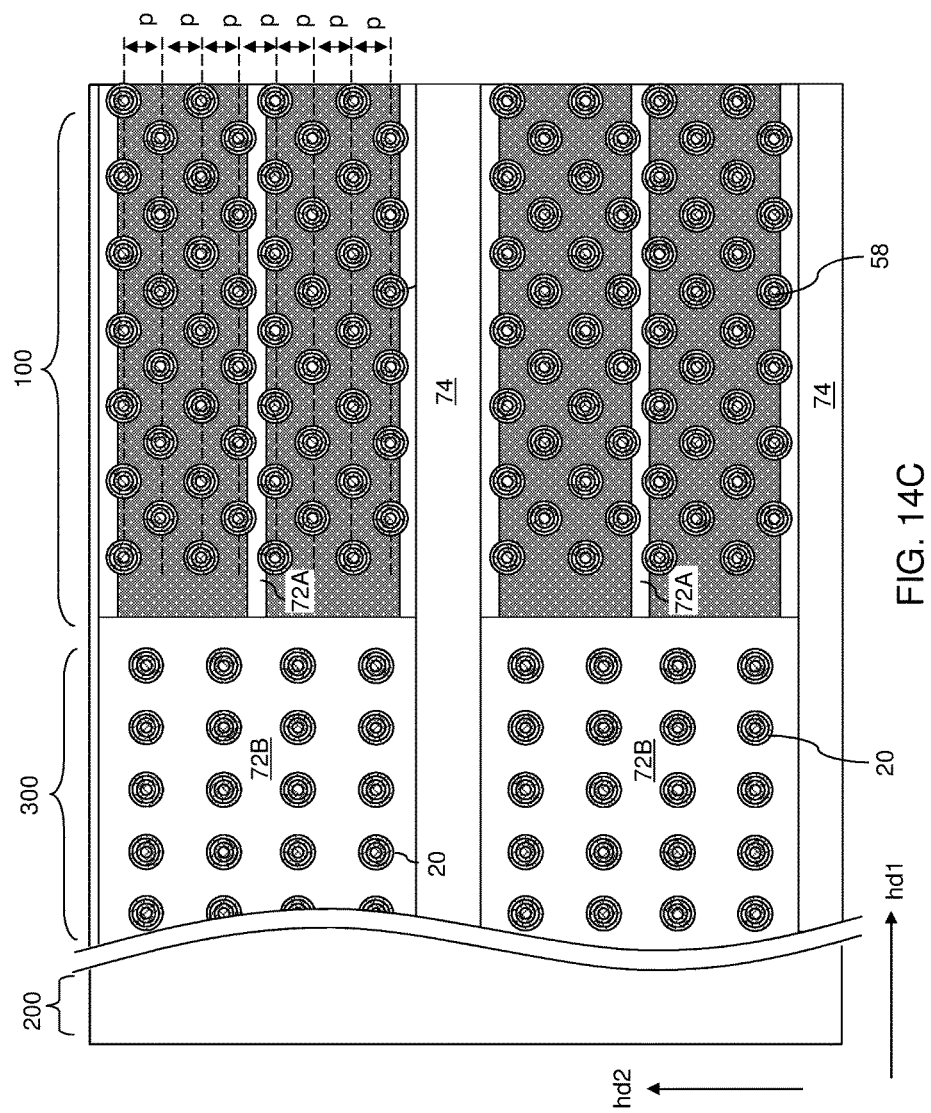
FIG. 14C is a top-down view of the alternative embodiment of the exemplary structure at the processing steps of FIGS. 14A and 14B.

Referring to FIGS. 14A-14C, the sacrificial cover material layer 73 can be removed from above the insulating fill material layer (72A, 72B, 72C) and the sacrificial matrices 111. The removal of the sacrificial cover material layer 73 may be performed by an isotropic etch process (such as a wet etch process) that removes the material of the sacrificial cover material layer 73. The sacrificial cover material layer 73 and the insulating wall structures 74 can include the same dielectric material such as silicon oxide. In this case, the insulating wall structures 74 can be collaterally recessed during removal of the sacrificial cover material layer 73.

FIGS. 15A-15D are sequential schematic vertical cross-sectional views of a region including memory opening fill structures 58 during formation of drain select gate electrodes and a contact level dielectric layer.

Figure 15A:
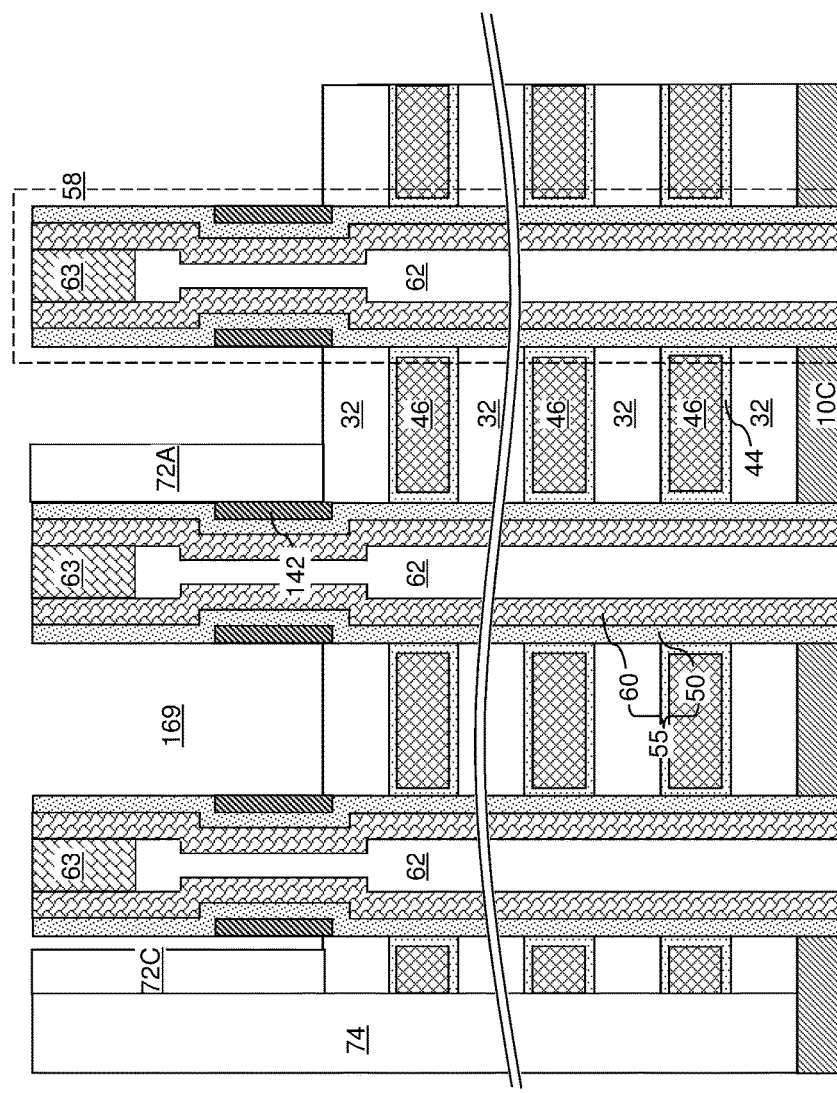
FIGS. 15A-15D are sequential schematic vertical cross-sectional views of a region including memory opening fill structures during formation of drain select gate electrodes and a contact level dielectric layer according to an embodiment of the present disclosure.

Referring to FIG. 15A, the sacrificial matrices 111 are removed selective to the insulating fill material layer (72A, 72B, 72C), the insulating wall structures 74, and the memory opening fill structures 58 that include the tubular electrode portions 142. For example, if the sacrificial matrices 111 include silicon nitride, a wet etch employing hot phosphoric acid can be employed to remove the sacrificial matrices selective to the materials of the insulating fill material layer (72A, 72B, 72C), the insulating wall structures 74, and physically exposed portions of the memory opening fill structures 58. A matrix cavity 169 having the same volume of a respective one of the sacrificial matrices 111 is formed in each volume from which the sacrificial matrices 111 are removed. An outer sidewall of each tubular electrode portion 142 is physically exposed to a respective one of the matrix cavities 169.

Figure 15B:
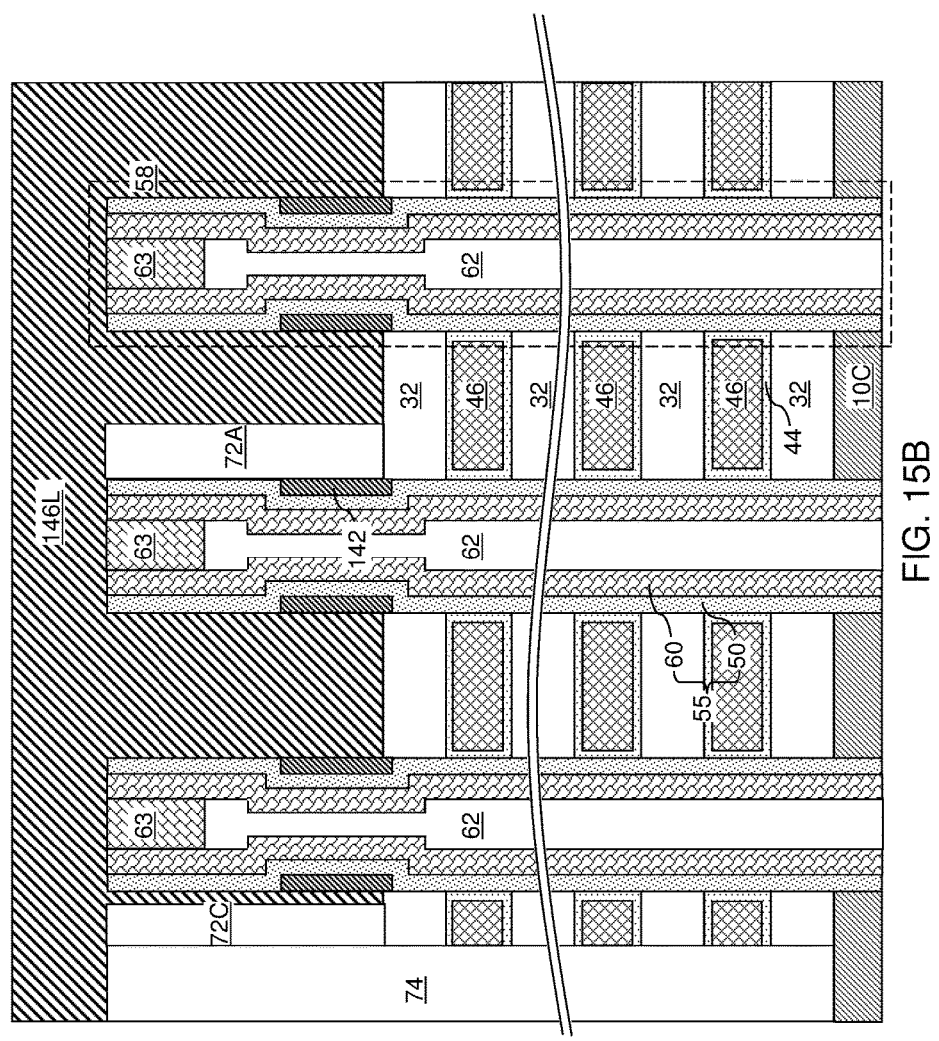

Referring to FIG. 15B, a conductive material layer, which is herein referred to as a conductive electrode material layer 146L, can be deposited into the matrix cavity 169 on physically exposed surfaces of the memory opening fill structures 58, the insulating fill material layer (72A, 72B, 72C), and the insulating wall structures 74. The conductive electrode material layer 146L includes, and can consist essentially of, at least one metallic material. Each of the at least one metallic material can be selected from a metal, an intermetallic alloy, a metal semiconductor alloy such as a metal silicide, a conductive metal nitride, and a heavily doped (i.e., conductive) semiconductor material. For example, the conductive electrode material layer 146L can include a tungsten fill material layer consisting essentially of tungsten. Optionally, a metallic nitride layer such as a titanium nitride layer may be deposited prior to deposition of the tungsten fill material layer. The conductive electrode material layer 146L can have a thickness sufficient to fill all gaps within the matrix cavities 169. The conductive electrode material layer 146L can be deposited by a non-conformal deposition process such as physical vapor deposition (PVD), or by a conformal deposition process such as chemical vapor deposition (CVD).

The physically exposed surfaces of the memory opening fill structures 58 include outer sidewalls of the tubular electrode portions 142. As such, the conductive electrode material layer 146L is deposited on the outer sidewall of each tubular electrode portion 142. In one embodiment, the entirety of the outer sidewalls of the tubular electrode portions 142 contact sidewalls of the metallic material layer 146L, sidewalls of the insulating fill material layer (72A, 72B, 72C), or sidewalls of the topmost insulating layer 32.

Figure 15C:
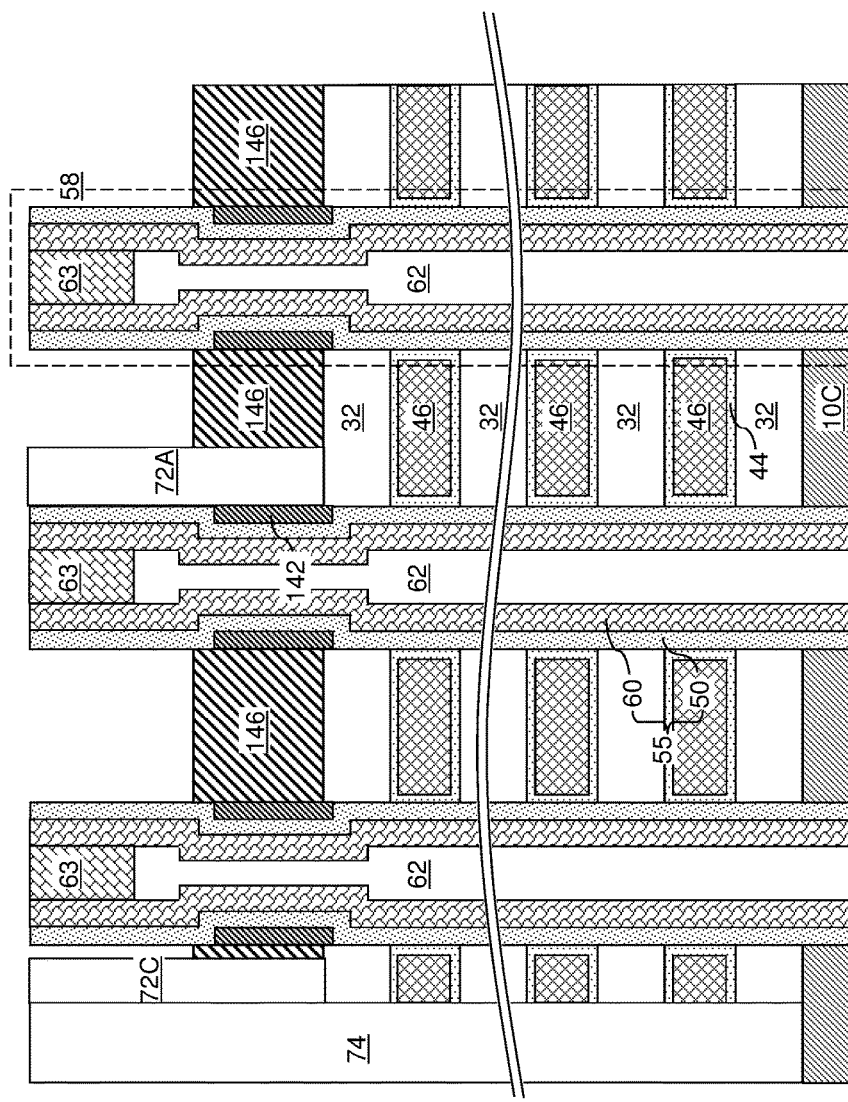
Figure 15D:
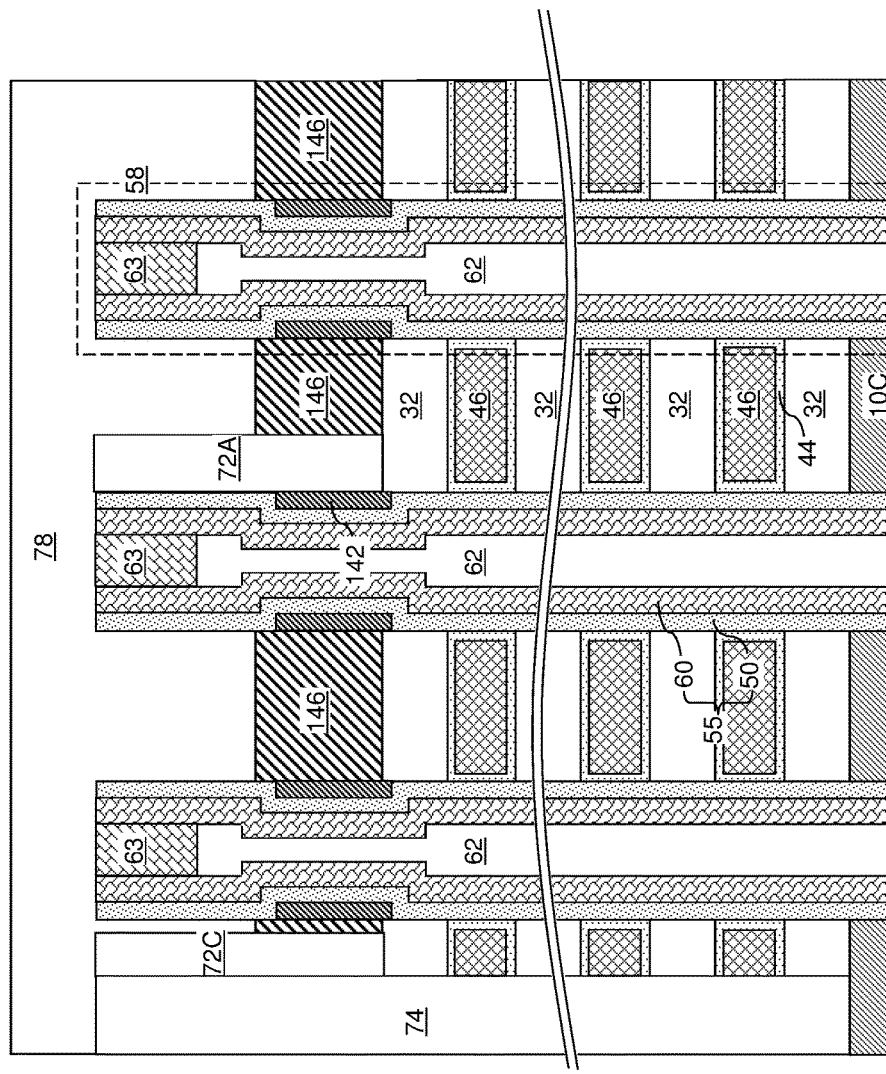
Figure 16A:
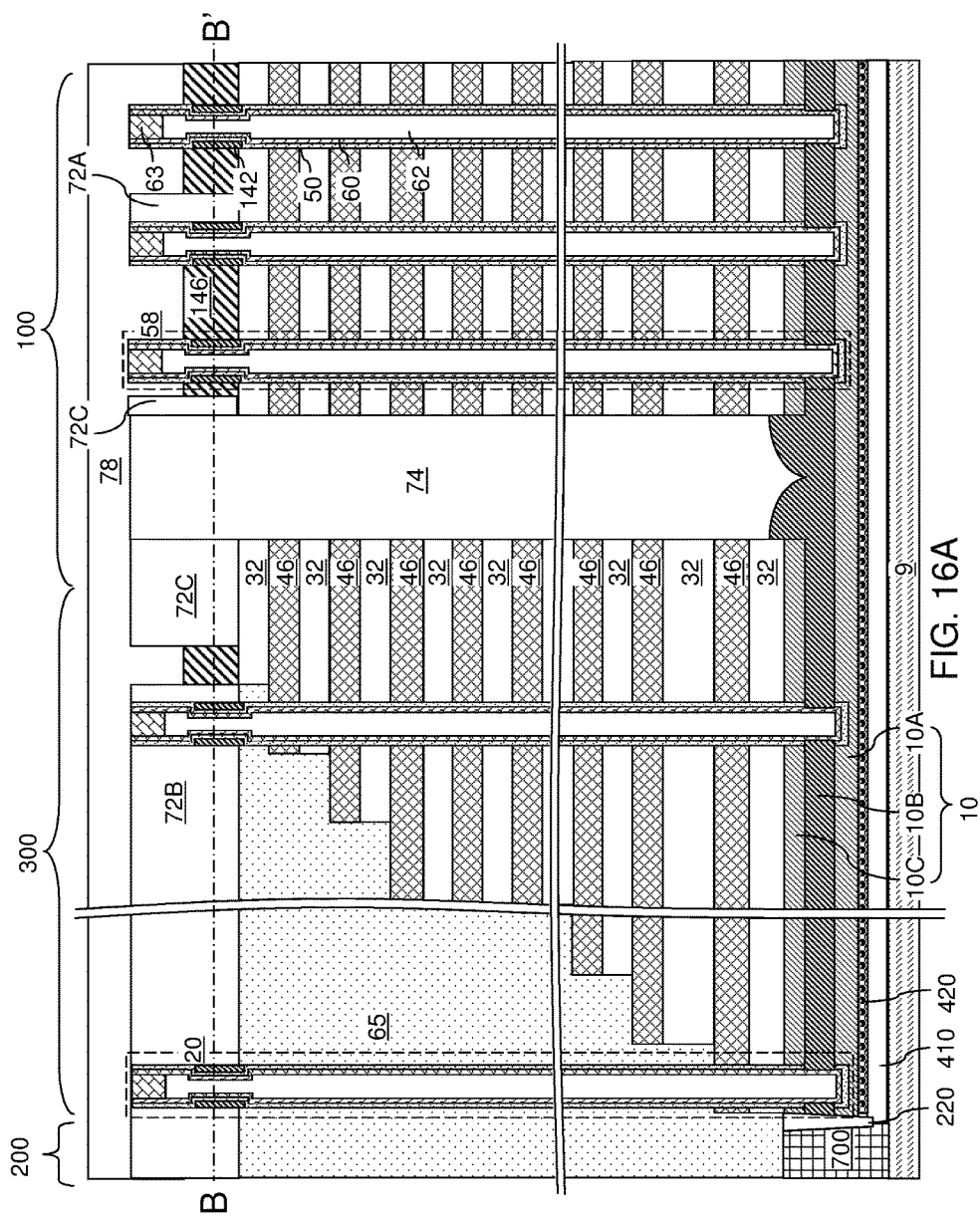
FIG. 16A is a schematic vertical cross-sectional view of the exemplary structure at the processing steps of FIG. 15D according to an embodiment of the present disclosure.
Figure 16B:
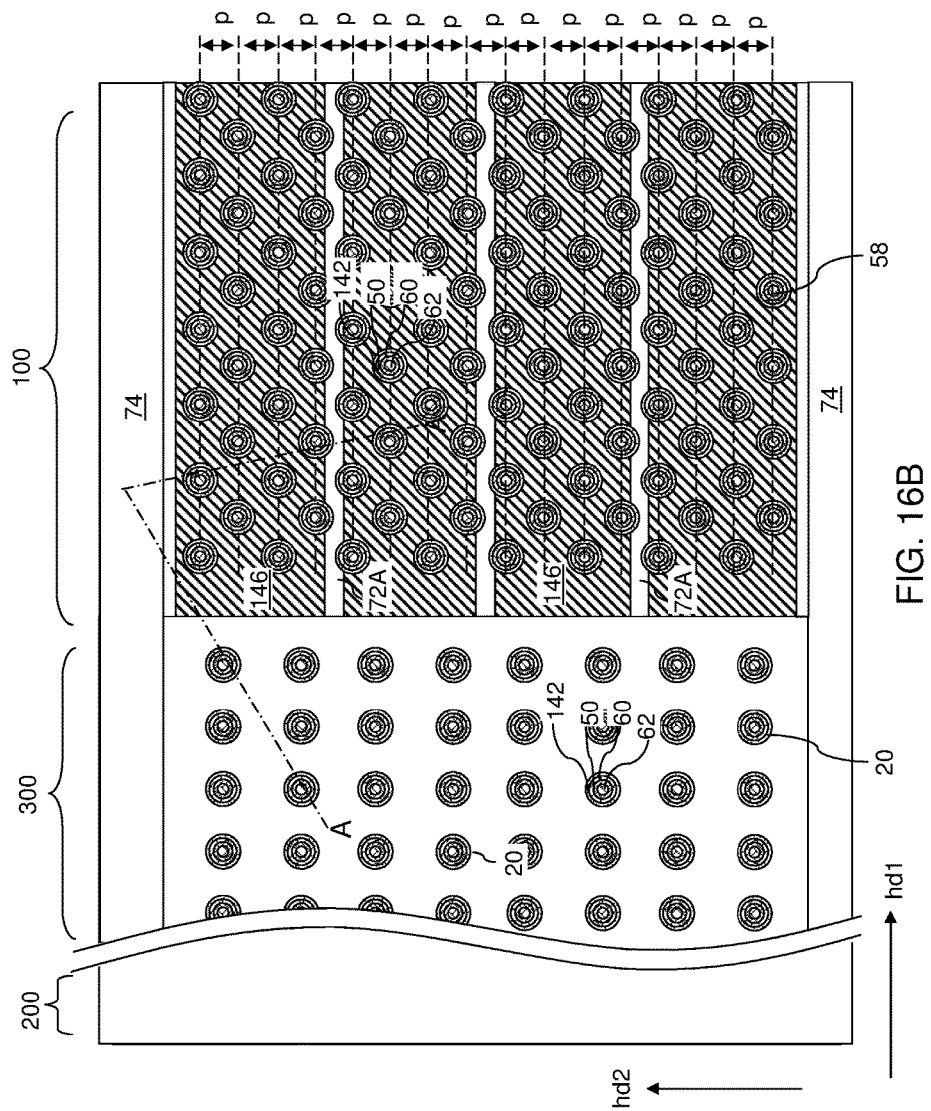
FIG. 16B is a horizontal cross-sectional view along the plane B-B' of the exemplary structure of FIG. 16A. The vertical plane A-A' is the plane of the schematic vertical cross-sectional view of FIG. 16A.
Figure 16C:
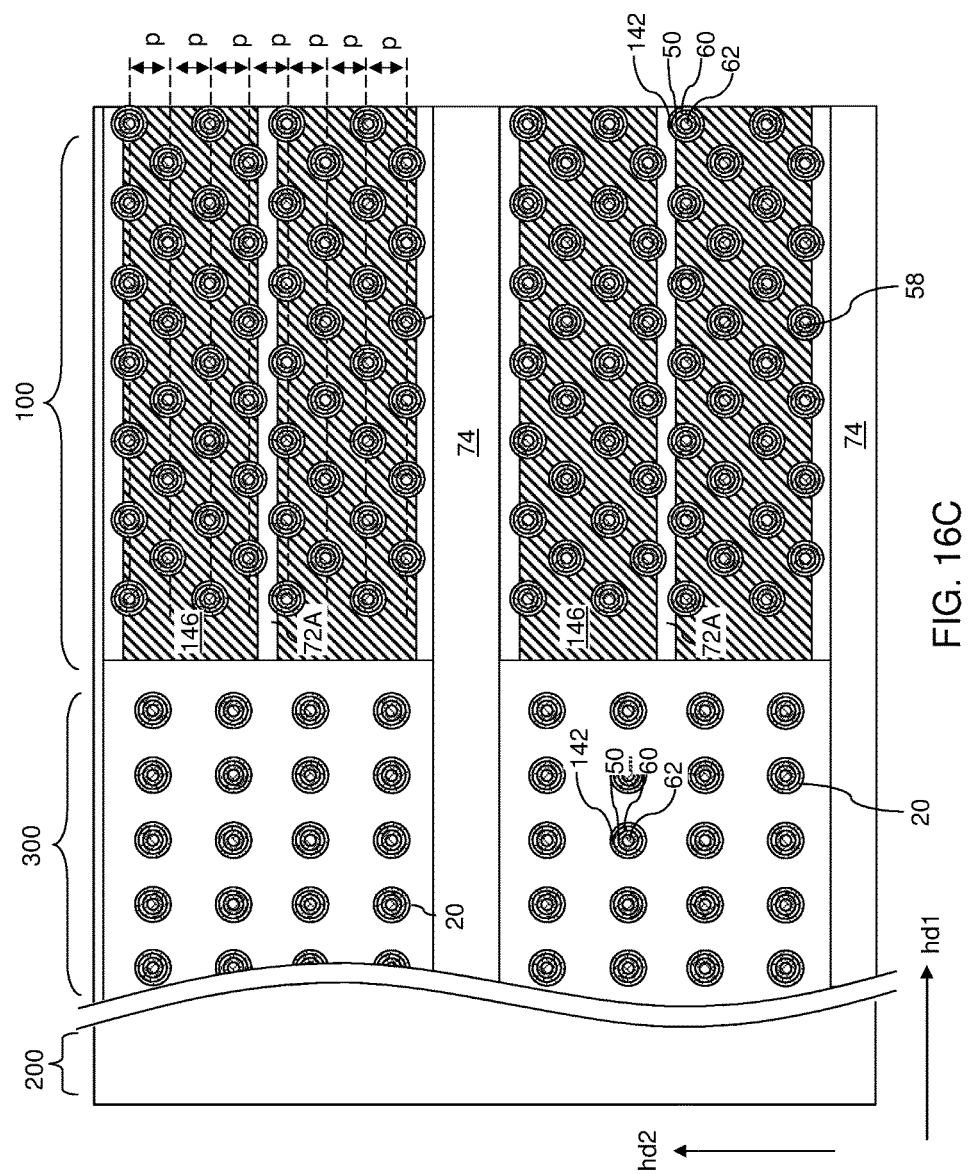
FIG. 16C is a horizontal cross-sectional view of the alternative embodiment of the exemplary structure at the processing steps of FIGS. 16A and 16B.

Referring to FIG. 15C, the conductive electrode material layer 146L can be etched back by a recess etch process. The recess etch process can employ a dry etch process (such as a reactive ion etch or chemical dry etch) or a wet etch process. The chemistry of the recess etch process can be selected such that the recess etch process etches the material of the conductive electrode material layer 146L selective to the materials of the insulating fill material layer (72A, 72B, 72C), the insulating wall structures 74, and the surface portions of the memory opening fill structures 58 located above a horizontal plane including top surfaces of the tubular electrode portions 142. In a non-limiting illustrative example, if the conductive electrode material layer 146L includes tungsten, a dry etch process employing $CF_4$ and $O_2$ or a wet etch process employing a combination of hydrofluoric acid, hydrochloric acid, and nitric acid may be employed.

Each remaining portion of the conductive electrode material layer 146L constitutes a plate electrode portion 146, which is a portion of a respective drain select gate electrode (142, 146) in a configuration of a plate including multiple holes therethrough. The thickness of the plate electrode portions 146 can be in a range from 20 nm to 200 nm, such as from 40 nm to 150 nm, although lesser and greater thicknesses can also be employed. Thus, the sacrificial matrices 111 are replaced with plate electrode portions 146 employing the processing steps of FIGS. 15A-15C. Each plate electrode portion 146 can have the same area as the sacrificial matrix 111 that is replaced by the plate electrode portion 146. Each contiguous combination of a plate electrode portion 146 and a set of tubular electrode portions 142 constitutes a drain select gate electrode (142, 146).

Referring to FIGS. 15D and 16A-16C, a contact level dielectric layer 78 can be formed over the insulating fill material layer (72A, 72B, 72C), the plate electrode portions 146, the memory opening fill structures 58, and the insulating wall structures 74. The contact level dielectric layer 78 can include a dielectric material that can be planarized (such as a TEOS silicon oxide material deposited by chemical vapor deposition), or a self-planarizing dielectric material (such as a spin-on glass (SOG) material). The contact level dielectric layer 78 can have a thickness in a range from 50 nm to 500 nm above the top surfaces of the insulating fill material layer (72A, 72B, 72C), although lesser and greater thicknesses can also be employed.

Figure 17A:
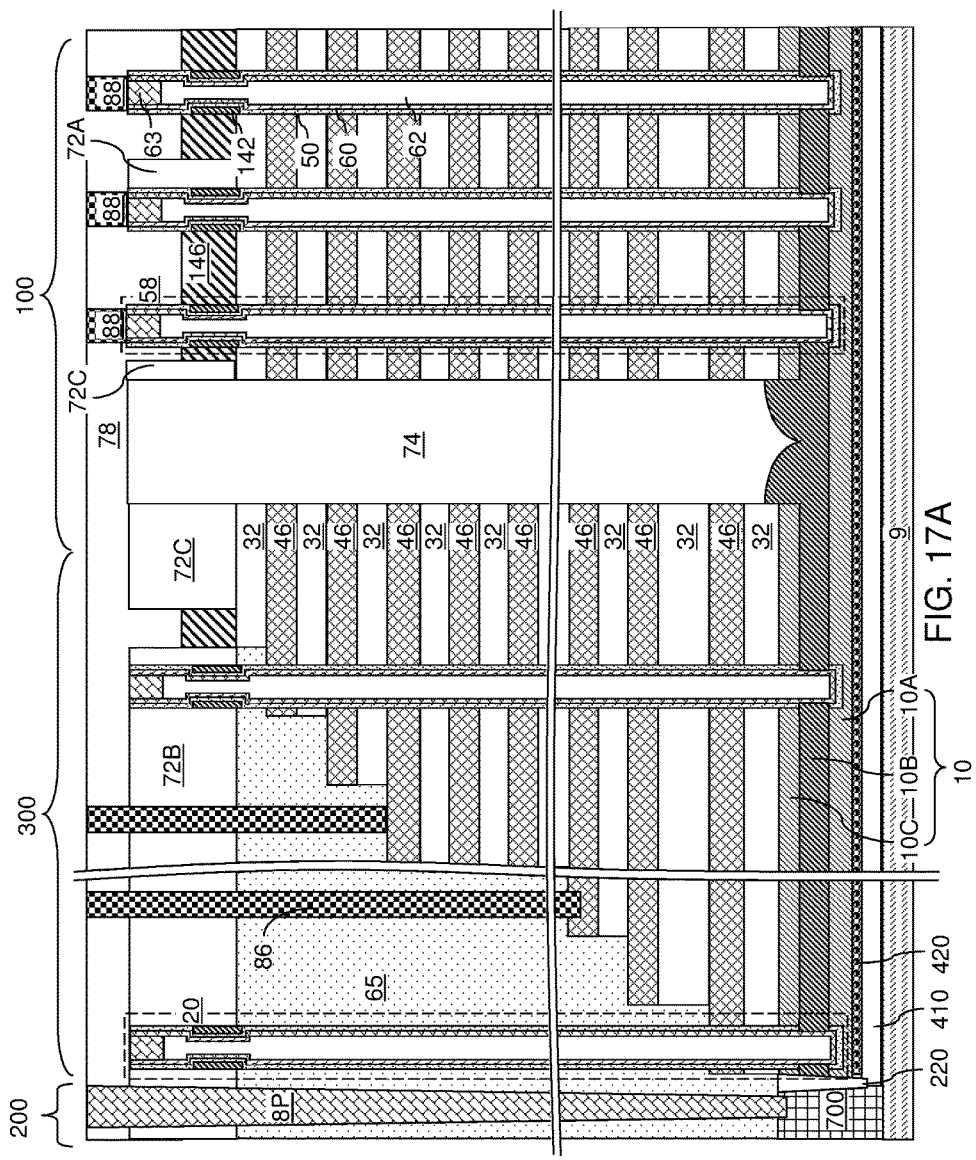
FIG. 17A is a schematic vertical cross-sectional view of the exemplary structure after formation of additional contact via structures according to an embodiment of the present disclosure.
Figure 17B:
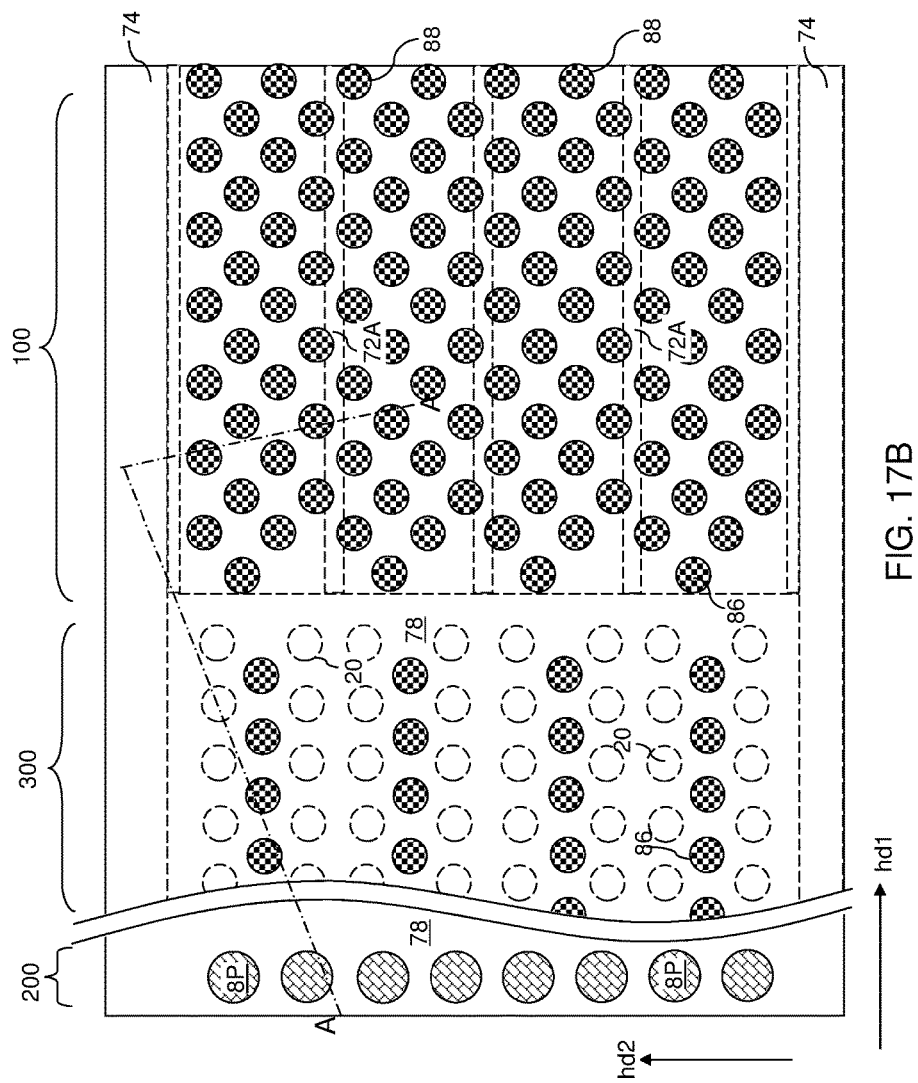
FIG. 17B is a top-down view of the exemplary structure of FIG. 17A. The vertical plane A-A' is the plane of the schematic vertical cross-sectional view of FIG. 17A.
Figure 17C:
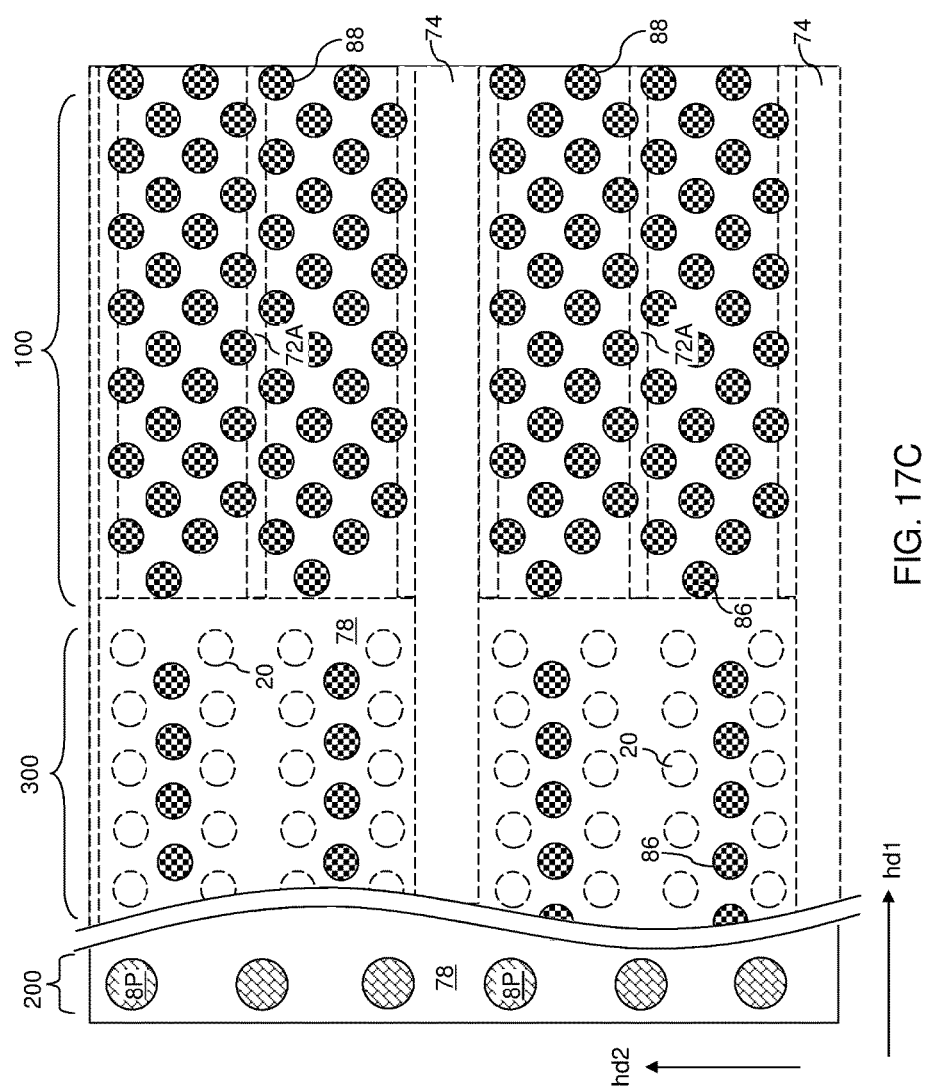
FIG. 17C is a top-down view of the alternative embodiment of the exemplary structure at the processing steps of FIGS. 17A and 17B.

Referring to FIGS. 17A-17C, additional contact via structures (88, 86, 8P) can be formed through the contact level dielectric layer 78, and optionally through the insulating fill material layer (72A, 72B, 72C) and the retro-stepped dielectric material portion 65. For example, drain contact via structures 88 can be formed through the contact level dielectric layer 78 on each drain region 63. Word line contact via structures 86 can be formed on the electrically conductive layers 46 through the contact level dielectric layer 78 and through the insulating fill material layer (72A, 72B, 72C) and the retro-stepped dielectric material portion 65. Peripheral device contact via structures 8P can be formed through the contact level dielectric layer 78 and through the insulating fill material layer (72A, 72B, 72C) and the retro-stepped dielectric material portion 65 directly on respective nodes of the peripheral devices.

Referring to all drawings and according to various embodiments of the present disclosure, a three-dimensional memory device is provided, which comprises: an alternating stack of insulating layers 32 and electrically conductive layers 46 located over a substrate (that includes the substrate semiconductor layer 9); an insulating fill material layer (72A, 72B, 72C) and plate electrode portions 146 located over the alternating stack (32, 46); memory openings 49 vertically extending through the insulating fill material layer (72A, 72B, 72C), the plate electrode portions 146, and the alternating stack (32, 46), wherein the insulating fill material layer (72A, 72B, 72C) includes a drain select level isolation structure 72A located between neighboring rows of memory openings 49 and wherein the drain select level isolation structure 72A generally extends along a first horizontal direction hd1; and memory opening fill structures 58 located in the memory openings 49, wherein each memory opening fill structure 58 comprises a memory film 50, a vertical semiconductor channel 60 laterally surrounded by the memory film 50, and a tubular electrode portion 142 overlying the alternating stack (32, 46) and contacting a respective one of the plate electrode portions 146, wherein the plate electrode portions 146 and the tubular electrode portions 142 collectively constitute drain select gate electrodes (142, 146).

In one embodiment, the plate electrode portions 146 and the tubular electrode portions 142 can have different heights. The top surfaces of the plate electrode portions 146 can be vertically offset from the top surfaces of the tubular electrode portions 142, and the bottom surfaces of the plate electrode portions 146 can be vertically offset from the bottom surfaces of the tubular electrode portions 142. The thickness (i.e., height) of the plate electrode portions 146 may be greater than, the same as, or lesser than, the vertical thickness (i.e., height) of the tubular electrode portions 142. Each of the memory openings 49 can have a straight sidewall that extend vertically along a vertical direction or along a substantially vertical direction (i.e., with a taper angle less than 5 degrees) from a respective bottommost periphery to a respective topmost periphery.

In one embodiment, the drain select level isolation structure 72A can include a pair of sidewalls containing a respective laterally alternating sequence of planar vertical sidewall portions and concave vertical sidewall portions and generally extending along the lengthwise direction of the drain select level isolation structure 72A, i.e., along the first horizontal direction hd1. In one embodiment, each tubular electrode portion 142 that is located within the neighboring rows of memory openings 49 contacts the concave vertical sidewall portions of the drain select level isolation structure 72A.

In one embodiment, each of the memory films 50 can be laterally indented inward at a level of the tubular electrode portions 142, and an outer sidewall of each tubular electrode portion 142 can be vertically coincident with an outer sidewall of a memory film 50 located within a same memory opening 49.

In one embodiment, the outer sidewall of each tubular electrode portion 142 can be vertically coincident with an overlying portion of the outer sidewall of the memory film 50 located within the same memory opening 49, and with an underlying portion of the outer sidewall of the memory film 50 located within the same memory opening 49.

In one embodiment, the concave vertical sidewall portions of the drain select level isolation structure 72A can contact convex vertical outer sidewalls of a subset of the tubular electrode portions 142 and convex vertical outer sidewalls of a subset of the memory films 50.

In one embodiment, portions of the plate electrode portions 146 that contact outer sidewalls of the tubular electrode portions 142 comprise a different conductive material than the tubular electrode portions 142. In one embodiment, the plate electrode portions 146 have a different height than the tubular electrode portions 142. Generally, the plate electrode portions 146 can have a different material composition and/or a different height than the tubular electrode portions 142.

In one embodiment, each of the vertical semiconductor channels 60 has a lesser distance between an inner sidewall and an outer sidewall at a level of the tubular electrode portions 142 than below the tubular electrode portions 142 and/or above the tubular electrode portions 142.

In one embodiment, the memory opening fill structures 58 are arranged in multiple rows that extend along the first horizontal direction hd1 such that the rows are spaced apart along a second horizontal direction hd2 that is perpendicular to the first horizontal direction hd1 with a uniform inter-row pitch p; a first subset of the memory opening fill structures 58 contacts the insulating fill material layer (72A, 72B, 72C); and a second subset of the memory opening fill structures (i.e., memory opening fill structures 58 laterally spaced from the insulating fill material layer (72A, 72B, 72C)) does not contact the insulating fill material layer (72A, 72B, 72C).

In one embodiment, a contact level dielectric layer 78 can contact top surfaces of the drain select gate electrodes 146, top surfaces of the memory opening fill structures 58, the planar vertical sidewall portions of the drain select level isolation structure 72A, and convex vertical sidewalls of the memory opening fill structures 58.

In one embodiment, bottom surfaces of the tubular electrode portions 142 are vertically offset from a horizontal plane including a bottom surface of the insulating fill material layer (72A, 72B, 72C), and the three-dimensional memory device further comprises drain regions 63 contacting an upper end of a respective one of the vertical semiconductor channels 60 and having a respective top surface within a same horizontal plane as a top surface of the insulating fill material layer (72A, 72B, 72C).

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate, e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels 60, wherein at least one end portion 60 of each of the plurality of semiconductor channels 60 extends substantially perpendicular to a top surface of the substrate and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels 60.

The embodiments of the present disclosure provide a reduced effective memory cell size using a less complex process than various prior art processes. Furthermore, the plate electrode portions 146 of the drain select gate electrodes contact the respective tubular electrode portions 142 and thus do not have to directly contact the memory film 50, which leads to a decrease in contact resistance. Finally, the process of the embodiments of the present disclosure provides an increased alignment tolerance between layers of the drain select transistor and the underlying layers.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers located over a substrate;
an insulating fill material layer and plate electrode portions located over the alternating stack;
memory openings vertically extending through the insulating fill material layer, the plate electrode portions, and the alternating stack, wherein the insulating fill material layer includes a drain select level isolation structure located between neighboring rows of memory openings, and wherein the drain select level isolation structure generally extends along a first horizontal direction; and memory opening fill structures located in the memory openings, wherein each memory opening fill structure comprises a memory film, a vertical semiconductor channel laterally surrounded by the memory film, and a tubular electrode portion overlying the alternating stack and contacting a respective one of the plate electrode portions, wherein the plate electrode portions and the tubular electrode portions collectively constitute drain select gate electrodes.

2. The three-dimensional memory device of claim 1, wherein:

the drain select level isolation structure includes a pair of sidewalls containing a respective laterally alternating sequence of planar vertical sidewall portions and concave vertical sidewall portions; and each tubular electrode portion that is located within the neighboring rows of memory openings contacts the concave vertical sidewall portions of the drain select level isolation structure.

3. The three-dimensional memory device of claim 2, wherein:

each of the memory films is laterally indented inward at a level of the tubular electrode portions; and an outer sidewall of each tubular electrode portion is vertically coincident with an outer sidewall of a memory film located within a same memory opening.

4. The three-dimensional memory device of claim 3, wherein the outer sidewall of each tubular electrode portion is vertically coincident with an overlying portion of the outer sidewall of the memory film located within the same memory opening, and with an underlying portion of the outer sidewall of the memory film located within the same memory opening.

5. The three-dimensional memory device of claim 2, wherein the concave vertical sidewall portions of the drain select level isolation structure contact convex vertical outer sidewalls of a subset of the tubular electrode portions and convex vertical outer sidewalls of a subset of the memory films.

6. The three-dimensional memory device of claim 1, wherein portions of the plate electrode portions that contact outer sidewalls of the tubular electrode portions comprise a different conductive material than the tubular electrode portions.

7. The three-dimensional memory device of claim 1, wherein the plate electrode portions have a different height than the tubular electrode portions.

8. The three-dimensional memory device of claim 1, wherein one of the vertical semiconductor channels has a lesser distance between an inner sidewall of the one of the vertical semiconductor channels and an outer sidewall of the one of the vertical semiconductor channels at a level of the tubular electrode portions than below the tubular electrode portions.

9. The three-dimensional memory device of claim 1, wherein:

the memory opening fill structures are arranged in multiple rows that extend along the first horizontal direction such that the rows are spaced apart along a second horizontal direction that is perpendicular to the first horizontal direction with a uniform inter-row pitch;

a first subset of the memory opening fill structures contacts the insulating fill material layer; and a second subset of the memory opening fill structures does not contact the insulating fill material layer.

10. The three-dimensional memory device of claim 9, further comprising a contact level dielectric layer contacting top surfaces of the drain select gate electrodes, top surfaces of the memory opening fill structures, the planar vertical sidewall portions of the drain select level isolation structure, and convex vertical sidewalls of the memory opening fill structures.

11. The three-dimensional memory device of claim 1, wherein:

bottom surfaces of the tubular electrode portions are vertically offset from a horizontal plane including a bottom surface of the insulating fill material layer; and the three-dimensional memory device further comprises drain regions contacting an upper end of a respective one of the vertical semiconductor channels and having a respective top surface within a same horizontal plane as a top surface of the insulating fill material layer.

12. The three-dimensional memory device of claim 1, wherein:

the three-dimensional memory device comprises a monolithic three-dimensional NAND memory device;

the electrically conductive layers comprise, or are electrically connected to, a respective word line of the monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:

a plurality of semiconductor channels, wherein at least one end portion of each of the plurality of semiconductor channels extends substantially perpendicular to a top surface of the substrate, and a plurality of charge storage elements, each charge storage element located adjacent to a respective one of the plurality of semiconductor channels.

13. A method of forming a three-dimensional memory device, comprising:

forming an alternating stack of insulating layers and spacer material layers over a substrate, wherein the spacer material layers are formed as, or are subsequently replaced with, electrically conductive layers;

forming sacrificial matrices and an insulating fill material layer over the alternating stack;

forming memory openings through the sacrificial matrices, the insulating fill material layer, and the alternating stack;

forming tubular electrode portions in the memory openings;

forming memory stack structures within each memory opening and on a respective one of the tubular electrode portions, wherein each memory stack structure comprises a memory film and a vertical semiconductor channel; and replacing the sacrificial matrices with plate electrode portions, wherein each contiguous combination of a plate electrode portion and a set of tubular electrode portions constitutes a drain select gate electrode.

14. The method of claim 13, wherein each of the tubular electrode portions is formed on a sidewall of a respective one of the memory openings, bottom surfaces of the tubular electrode portions are formed above a horizontal plane including a top surface of a topmost spacer material layer within the alternating stack, and top surfaces of the tubular electrode portions are formed below a horizontal plane including top surfaces of the sacrificial matrices.

15. The method of claim 13, wherein the memory openings are arranged as rows that extend along a first horizontal direction and a strip of the insulating fill material layer laterally extends between a neighboring pair of rows of the memory openings.

16. The method of claim 15, wherein:
the strip of the insulating fill material layer comprises a drain select level isolation structure which includes a first lengthwise sidewall and a second lengthwise sidewall that laterally extending along the first horizontal direction prior to formation of the memory openings;
a first row of memory openings within the neighboring pair of rows of memory openings is formed through the first lengthwise sidewall and does not intersect the second lengthwise sidewall;
a second row of memory openings with the neighboring pair of rows of memory openings is formed through the second lengthwise sidewall and does not intersect the first lengthwise sidewall;
the drain select level isolation structure includes a pair of sidewalls containing a respective laterally alternating sequence of planar vertical sidewall portions and concave vertical sidewall portions after formation of the memory openings; and
a subset of the tubular electrode portions is formed on the concave vertical sidewall portions of the drain select level isolation structure.

17. The method of claim 15, wherein:
the memory openings are arranged in multiple rows that are spaced apart along a second horizontal direction that is perpendicular to the first horizontal direction with a uniform inter-row pitch for an entirety of the group of memory stack structures; and
the tubular electrode portions are formed with a uniform lateral thickness.

18. The method of claim 13, further comprising:
forming first sacrificial fill material portions in the memory openings, wherein top surfaces of the first sacrificial fill material portions are located above a horizontal plane including a top surface of a topmost spacer material layer;
conformally depositing a conductive material layer on physically exposed portions of sidewalls of the memory openings and on top surfaces of the first sacrificial fill material portions;
forming the tubular electrode portions by anisotropically etching the conductive material layer;
forming second sacrificial fill material portions inside the tubular electrode portions, wherein top surfaces of the second sacrificial fill material portions are located below a horizontal plane including a top surface of the sacrificial matrices;
removing a top portion of each of the tubular electrode portions by etching portions of the tubular electrode portions that are not covered by the second sacrificial fill material portions; and
removing the second and first sacrificial fill material portions selective to the alternating stack and the tubular electrode portions.

19. The method of claim 13, wherein:
each memory film is formed on a respective one of the tubular electrode portions;
each vertical semiconductor channel is formed by depositing a semiconductor channel layer on the memory film and removing portions of the semiconductor channel layer from above the memory openings.

20. The method of claim 19, wherein:
each of the memory films comprises a lateral stack of a blocking dielectric layer, a charge storage layer, and a tunneling dielectric layer; and
the blocking dielectric layer is formed on a respective one of the tubular electrode portions and a respective sidewall portion of the insulating fill material layer.

\* \* \* \* \*